United States Patent
Yu et al.

(10) Patent No.: US 11,139,223 B2
(45) Date of Patent: Oct. 5, 2021

(54) SEMICONDUCTOR DEVICE AND MANUFACTURING METHOD THEREOF

(71) Applicant: Taiwan Semiconductor Manufacturing Co., Ltd., Hsinchu (TW)

(72) Inventors: Chen-Hua Yu, Hsinchu (TW); Chun-Hui Yu, Hsinchu County (TW); Jeng-Nan Hung, Taichung (TW); Kuo-Chung Yee, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/655,257

(22) Filed: Oct. 17, 2019

(65) Prior Publication Data
US 2020/0176357 A1  Jun. 4, 2020

Related U.S. Application Data

(60) Provisional application No. 62/773,136, filed on Nov. 29, 2018.

(51) Int. Cl.
| | |
|---|---|
| *H01L 23/34* | (2006.01) |
| *H01L 23/473* | (2006.01) |
| *H01L 25/065* | (2006.01) |
| *H01L 25/18* | (2006.01) |
| *H01L 23/31* | (2006.01) |
| *H01L 21/50* | (2006.01) |
| *H01L 21/308* | (2006.01) |

(52) U.S. Cl.
CPC ............ *H01L 23/473* (2013.01); *H01L 21/50* (2013.01); *H01L 23/3135* (2013.01); *H01L 23/3185* (2013.01); *H01L 25/0652* (2013.01); *H01L 25/18* (2013.01); *H01L 21/308* (2013.01)

(58) Field of Classification Search
CPC .............. H01L 23/473; H01L 23/3185; H01L 25/0652
USPC ............................... 257/704, 706, 713–714
See application file for complete search history.

(56) References Cited

U.S. PATENT DOCUMENTS 4,964,458 A * 10/1990 Flint ................... H01L 23/3672
165/46
5,023,695 A * 6/1991 Umezawa ........... H01L 23/4735
257/714

(Continued)

*Primary Examiner* — Nitin Parekh
(74) *Attorney, Agent, or Firm* — JCIPRNET

(57) ABSTRACT

A semiconductor package includes a semiconductor package, a cap, a seal, and microstructures. The semiconductor package includes at least one semiconductor die. The cap is disposed over an upper surface of the semiconductor package. The seal is located on the semiconductor package and between the cap and the semiconductor package. The cap includes an inflow channel and an outflow channel. The active surface of the at least one semiconductor die faces away from the cap. The cap and an upper surface of the semiconductor package define a circulation recess providing fluidic communication between the inflow channel and the outflow channel. The seal is disposed around the circulation recess. The microstructures are located within the circulation recess, and the microstructures are connected to at least one of the cap and the at least one semiconductor die.

20 Claims, 40 Drawing Sheets

(56) References Cited

U.S. PATENT DOCUMENTS

| | | | | |
|---|---|---|---|---|
| 5,239,200 A * | 8/1993 | Messina | ............... | H01L 23/473 165/104.33 |
| 5,345,107 A * | 9/1994 | Daikoku | ................ | F28F 13/00 165/185 |
| 5,751,062 A * | 5/1998 | Daikoku | ............ | H01L 23/4338 257/713 |
| 5,880,524 A * | 3/1999 | Xie | ....................... | H01L 23/433 257/704 |
| 7,180,179 B2 * | 2/2007 | Mok | .................... | H01L 23/427 257/675 |
| 8,772,927 B2 * | 7/2014 | Bezama | ............... | H01L 23/3675 257/719 |
| 8,993,380 B2 | 3/2015 | Hou et al. | | |
| 9,000,584 B2 | 4/2015 | Lin et al. | | |
| 9,048,222 B2 | 6/2015 | Hung et al. | | |
| 9,048,233 B2 | 6/2015 | Wu et al. | | |
| 9,064,879 B2 | 6/2015 | Hung et al. | | |
| 9,111,949 B2 | 8/2015 | Yu et al. | | |
| 9,263,511 B2 | 2/2016 | Yu et al. | | |
| 9,281,254 B2 | 3/2016 | Yu et al. | | |
| 9,299,649 B2 | 3/2016 | Chiu et al. | | |
| 9,368,460 B2 | 6/2016 | Yu et al. | | |
| 9,372,206 B2 | 6/2016 | Wu et al. | | |
| 9,425,126 B2 | 8/2016 | Kuo et al. | | |
| 9,443,783 B2 | 9/2016 | Lin et al. | | |
| 9,461,018 B1 | 10/2016 | Tsai et al. | | |
| 9,496,189 B2 | 11/2016 | Yu et al. | | |
| 9,666,502 B2 | 5/2017 | Chen et al. | | |
| 9,735,131 B2 | 8/2017 | Su et al. | | |
| 2006/0131735 A1 * | 6/2006 | Ong | ....................... | H01L 23/36 257/706 |
| 2019/0148138 A1 * | 5/2019 | Molla | ..................... | H01L 23/36 257/706 |

\* cited by examiner

SEMICONDUCTOR DEVICE AND MANUFACTURING METHOD THEREOF

CROSS-REFERENCE TO RELATED APPLICATION

This application claims the priority benefit of U.S. provisional application Ser. No. 62/773,136, filed on Nov. 29, 2018. The entirety of the above-mentioned patent application is hereby incorporated by reference herein and made a part of this specification.

BACKGROUND

As electronic products are continuously miniaturized, heat dissipation of the packaged semiconductor die(s) has become an important issue for packaging technology. In addition, for multi-die packages, the arrangement of the dies and the corresponding connecting elements has impact on data transmission speed among semiconductor dies and reliability of the packaged products.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
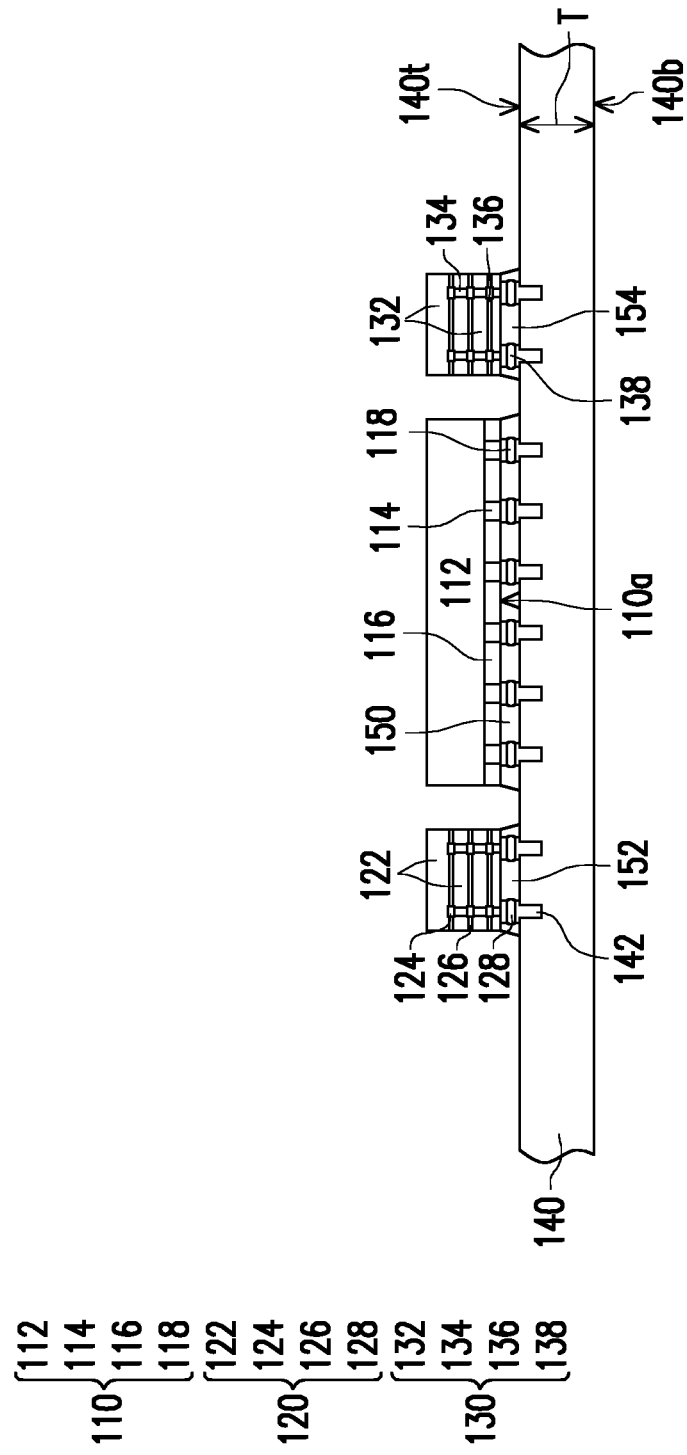
FIG. 1A through FIG. 1H are schematic cross-sectional views illustrating intermediate structures formed at various stages of a manufacturing method of a semiconductor device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
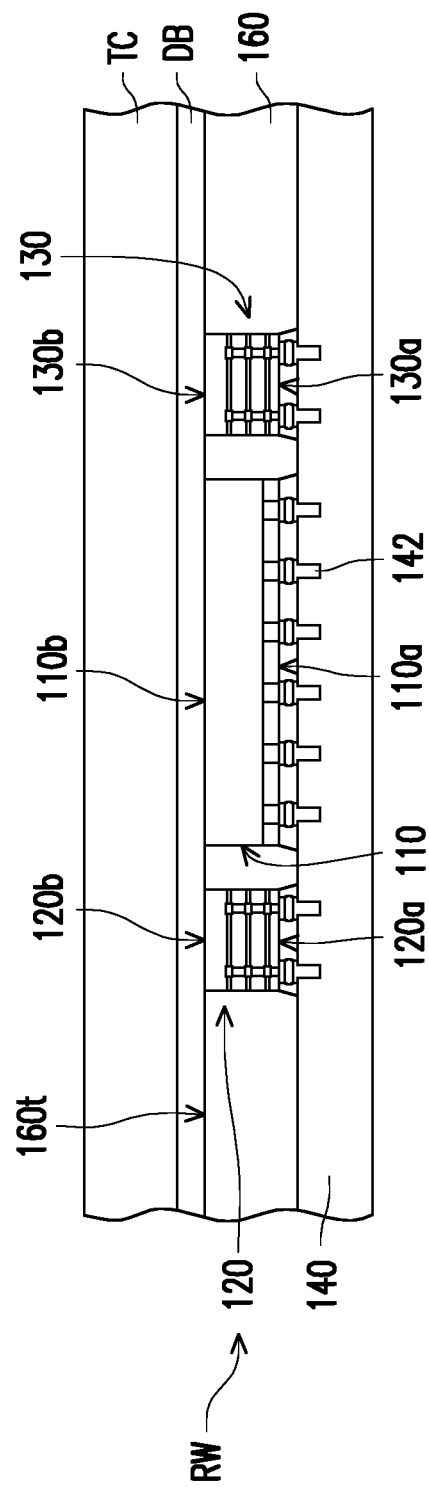
Figure 1C:
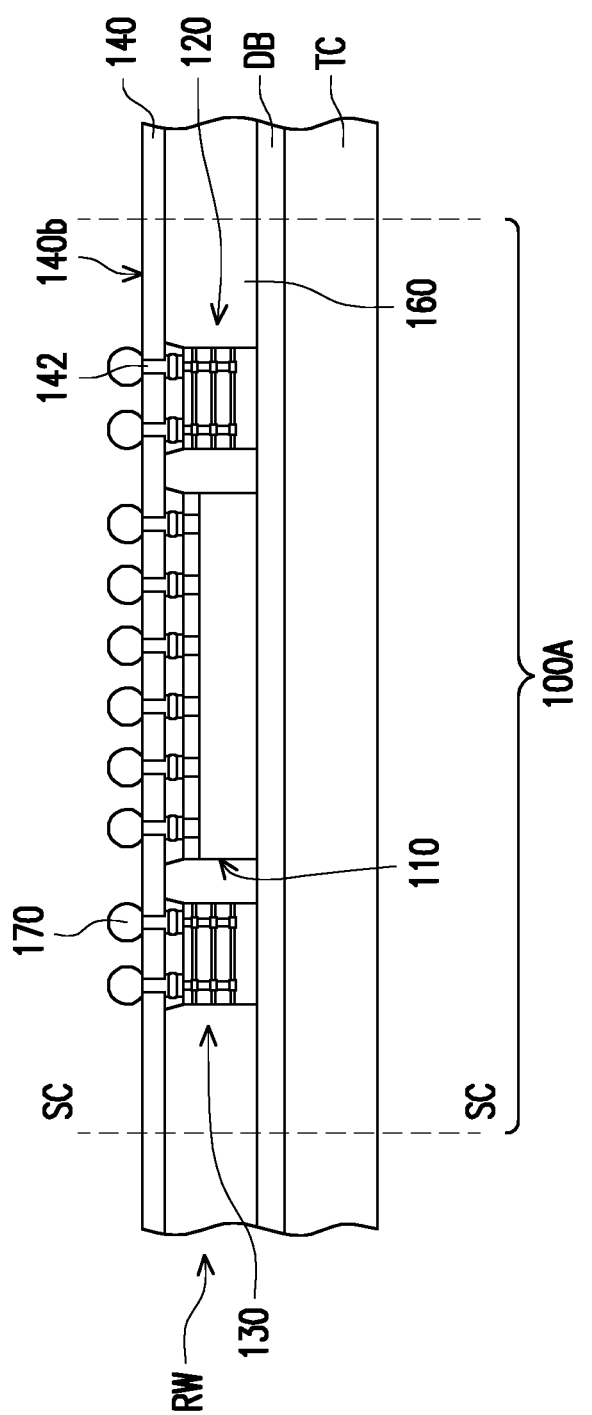
Figure 1D:
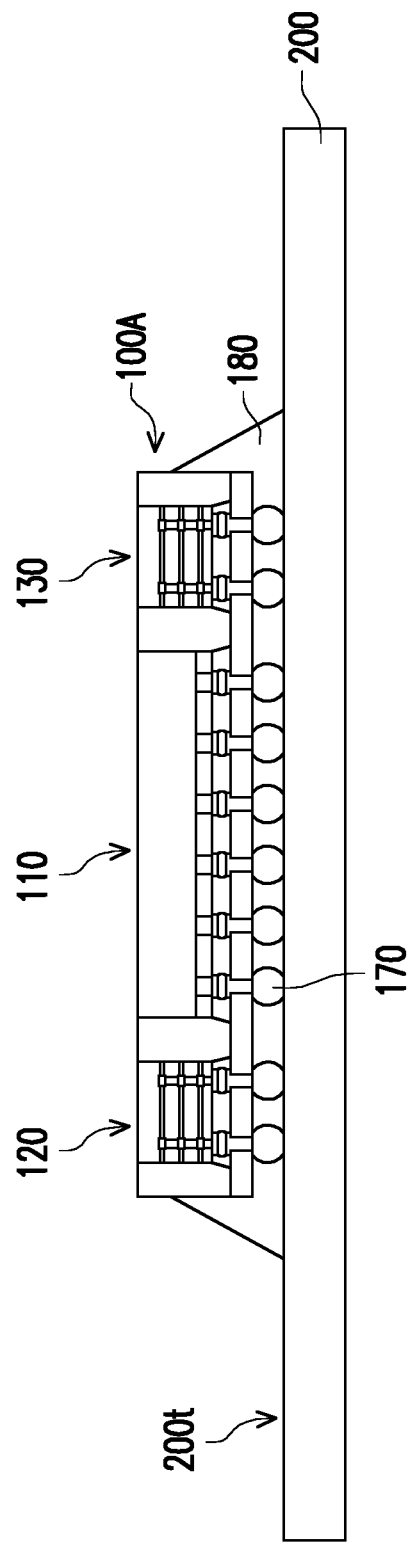
Figure 1E:
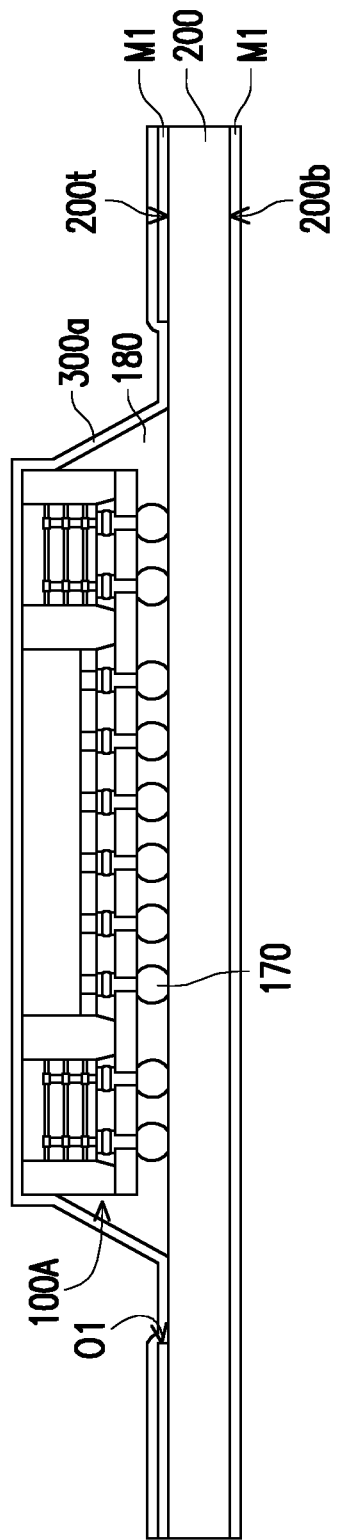
Figure 1F:
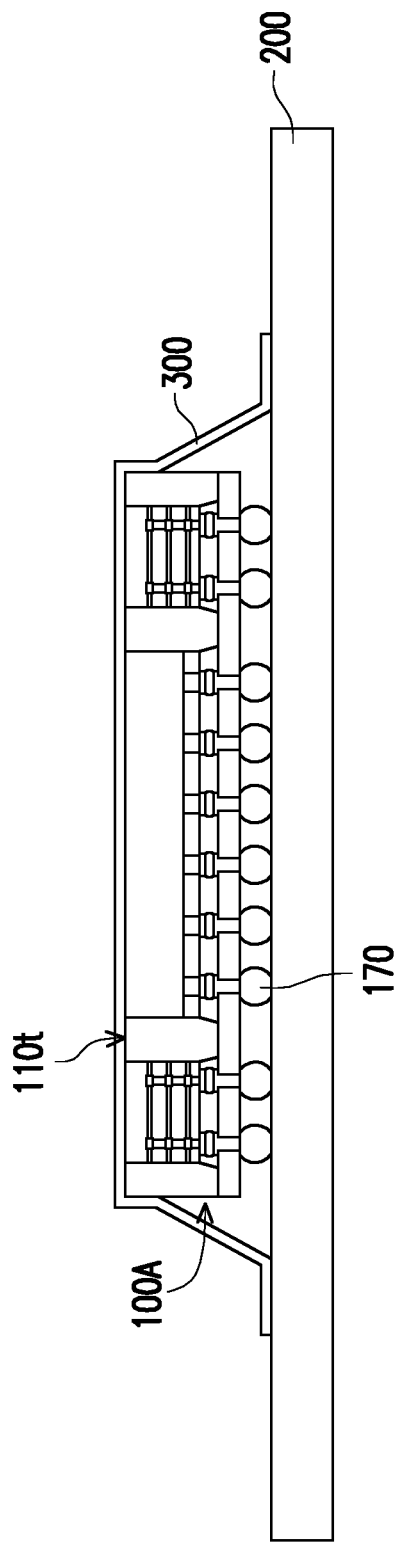
Figure 1G:
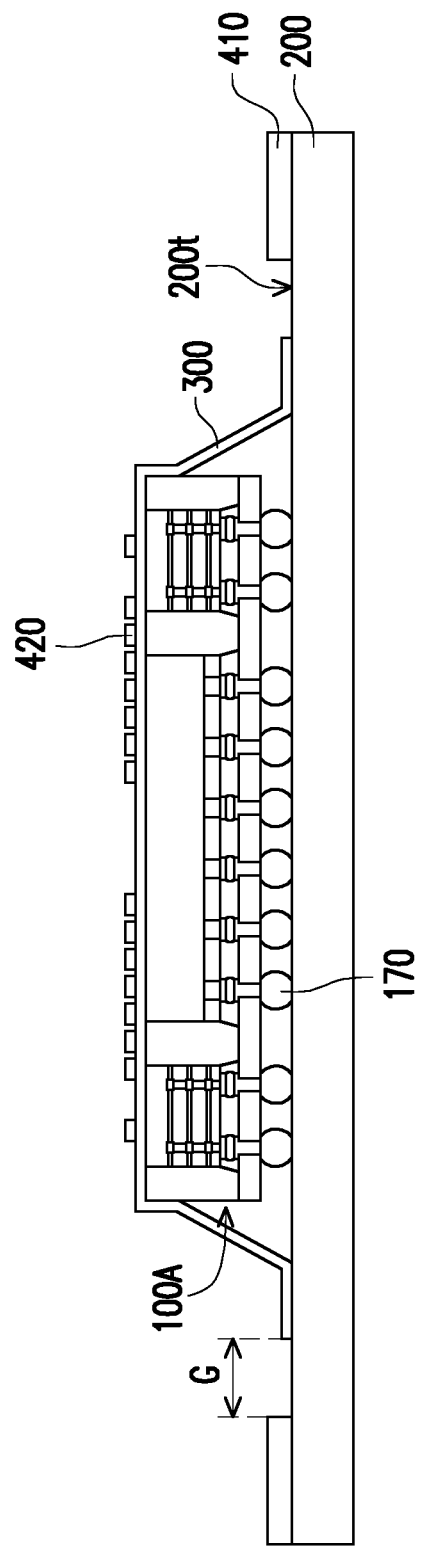
Figure 1H:
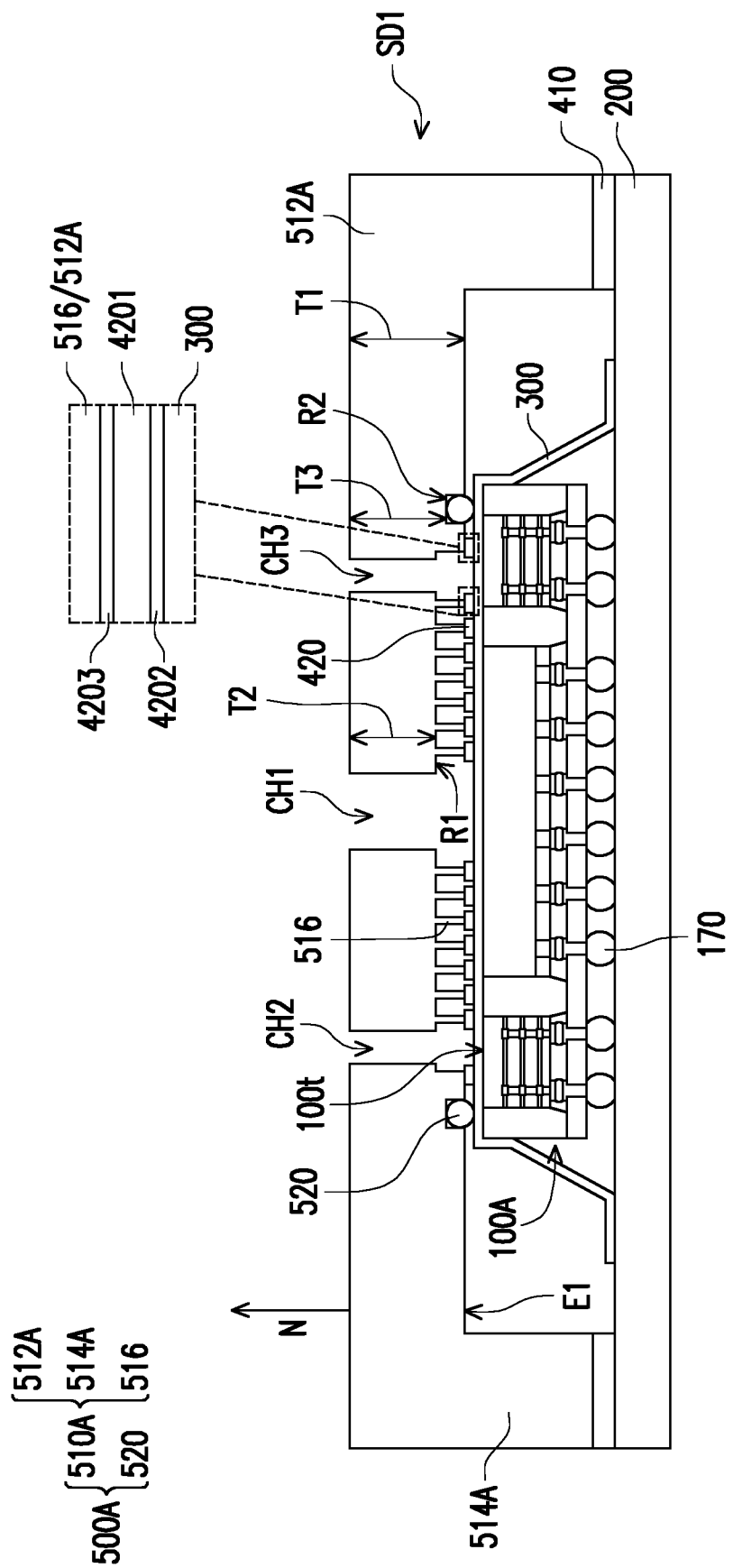

FIG. 1A through FIG. 1H are schematic cross-sectional views illustrating intermediate structures produced during a manufacturing method of a semiconductor device SD1 (shown in FIG. 1H). According to some embodiments of the present disclosure, a semiconductor package 100A (shown in FIG. 1D) is provided via the steps illustrated in FIG. 1A through FIG. 1C.

Referring to FIG. 1A, in some embodiments, semiconductor dies 110, 120, 130 are bonded to an interposer 140. In some embodiments, the semiconductor die 110 includes a semiconductor substrate 112, a plurality of contact pads 114 and a passivation layer 116. The contact pads 114 may be formed on a surface of the semiconductor substrate 112 covered by the passivation layer 116 and be exposed through a plurality of openings of the passivation layer 116. In some embodiments, die connectors 118 may be connected to the contact pads 114 through openings of the passivation layer 116, and may be used to connect the semiconductor die 110 to other devices or components. In some embodiments, the surface of the semiconductor die 110 in which the contact pads 114 or the die connectors 118 are exposed is referred to as an active surface 110a. In some embodiments, the semiconductor substrate 112 may be made of semiconductor materials, such as semiconductor materials of the groups III-V of the periodic table. In some embodiments, the semiconductor substrate 112 includes elementary semiconductor materials such as silicon or germanium, compound semiconductor materials such as silicon carbide, gallium arsenide, indium arsenide, or indium phosphide or alloy semiconductor materials such as silicon germanium, silicon germanium carbide, gallium arsenide phosphide, or gallium indium phosphide. In some embodiments, the semiconductor substrate 112 may include silicon on insulator (SOI) or silicon-germanium on insulator (SGOI). In some embodiments, the semiconductor substrate 112 includes active components (e.g., transistors or the like) and optionally passive components (e.g., resistors, capacitors, inductors, or the like) formed therein. In certain embodiments, the contact pads 114 include aluminum pads, copper pads, or other suitable metal pads. In some embodiments, the passivation layer 116 may be a single layer or a multi-layered structure, including a silicon oxide layer, a silicon nitride layer, a silicon oxy-nitride layer, a dielectric layer formed by other suitable dielectric materials or combinations thereof. In some embodiments, the die connectors 118 includes copper, copper alloys, or other conductive materials, and may be formed by deposition, plating, or other suitable techniques. In some embodiments, the die connectors 118 are prefabricated structures attached over the contact pads 114. In some embodiments, the die connectors 118 are solder balls, metal pillars, controlled collapse chip connection (C4) bumps, micro bumps, bumps formed via electroless nickel-electroless palladium-immersion gold technique (ENEPIG), combination thereof (e. g, a metal pillar with a solder ball attached), or the like. In some embodiments, similar structural features as the ones just discussed for the semiconductor die 110 may be found in the other semiconductor dies of the semiconductor package 100A being formed (for example, in the semiconductor dies 120, 130 shown in FIG. 1A).

Each of the semiconductor dies 110, 120, 130 may independently be or include a logic die, such as a central processing unit (CPU) die, a graphic processing unit (GPU) die, a micro control unit (MCU) die, an input-output (I/O) die, a baseband (BB) die, or an application processor (AP) die. In some embodiments, one or more of the semiconductor dies 110, 120, 130 include a memory die such as a high bandwidth memory die. In some embodiments, the semiconductor dies 110, 120, 130 may be the same type of dies or perform the same functions. In some embodiments, the semiconductor dies 110, 120, 130 may be different types of dies or perform different functions. In some embodiments, the semiconductor die 110 includes a logic die, and the semiconductor dies 120 and 130 include memory dies. In some embodiments, the semiconductor dies 120 and 130 are memory stacks, including multiple chips 122, 132 stacked on top of each other and electrically connected by the connectors 124, 134. When the memory dies 120, 130 includes multiple chips 122, 132, each one of the chips 122, 132 may have a structure similar to the one previously described for the semiconductor die 110. An insulating layer 126, 136 may be disposed in between adjacent chips 122, 132 to protect the chips 122, 132 and the connectors 124, 134. In some embodiments, a material of the insulating layer 126, 136 may include a molding compound, a molding underfill, an epoxy, or a resin. In some embodiments, the semiconductor dies 120, 130 include connectors 128, 138 to electrically connect with other components or devices. In some embodiments, the interposer 140 is made of a semiconductor material, similarly to what was previously discussed with reference to the semiconductor substrate 112. In one embodiment, the interposer 140 includes a silicon wafer.

In some embodiments, the semiconductor dies 110, 120, 130 are bonded via the connectors 118, 128, 138 to through vias 142 formed within the interposer 140. According to some embodiments, the semiconductor dies 110, 120, 130 are disposed with the active surfaces 110a, 120a, 130a facing the interposer 140. In some embodiments, as illustrated in FIG. 1A, the through vias 142 may be formed in the interposer 140, and extend formed on a top surface 140t into the interposer 140 in a thickness direction T of the interposer 140 without emerging on the bottom surface 140b. Alternatively stated, according to some embodiments, at the manufacturing stage illustrated in FIG. 1A the conductive vias 142 may be exposed on the top surface 140t of the interposer 140, and inserted in the interposer 140 for only a fraction of its thickness T. In some embodiments, a material of the through vias 142 includes one or more metals. In some embodiments, the metal material of the through vias 142 may be copper, titanium, tungsten, aluminum, the alloys, the combinations or the like. In some embodiments, passivation layers (not shown) may be formed on one or both of the top surface 140t and the bottom surface 140b of the interposer 140. When present, the passivation layers (not shown) include a plurality of openings exposing the through vias 142.

In some embodiments, after bonding the semiconductor dies 110, 120, 130 to the through vias 142, an underfill 150, 152, 154 may be disposed between the semiconductor dies 110, 120, 130 and the interposer 140 to protect the connectors 118, 128, 138 against thermal or physical stresses and secure the electrical connection of the semiconductor dies 110, 120, 130 with the through vias 142. In some embodiments, the underfill 150, 152, 154 is formed by capillary underfill filling (CUF). A dispenser (not shown) may apply a filling material (not shown) along the perimeter of the semiconductor dies 110, 120, 130. In some embodiments, heating may be applied to let the filling material penetrate in the interstices defined by the connectors 118, 128, 138 between the semiconductor dies 110, 120, 130 and the interposer 140 by capillarity. In some embodiments, a curing process is performed to consolidate the underfill 150, 152, 154. In some embodiments, as shown in FIG. 1A, multiple underfill portions 150, 152, 154 are formed, each portion 150, 152, 154 securing the connectors 118, 128, 138 of a semiconductor die 110, 120, 130. In some alternative embodiments, a single underfill (not shown) may extend below the semiconductor dies 110, 120, 130 depending on the spacing and relative positions of the semiconductor dies 110, 120, 130 over the interposer 140.

In FIG. 1A only three semiconductor dies 110, 120, 130 are shown on the interposer 140 for simplicity, but the disclosure is not limited thereto. In some embodiments, the semiconductor package being formed may include more or fewer semiconductor dies than what illustrated in FIG. 1A, as well as other components (e.g., dummy dies, stress release layers, interconnect structures, support pillars, etc.). Furthermore, whilst the process is currently being illustrated for a Chip-on-Wafer-on-Substrate (CoWoS) package, the disclosure is not limited to the package structure shown in the drawings, and other types of package such as integrated fan-out (InFO) packages, package-on-packages (PoP), etc., are also meant to be covered by the present disclosure and to fall within the scope of the appended claims.

Referring to FIG. 1B, an encapsulant 160 is formed over the interposer 140 wrapping the semiconductor dies 110, 120, 130. In some embodiments, the encapsulant 160 is formed by completely covering the semiconductor dies 110, 120, 130 with an encapsulation material (not shown), and then performing a planarization process (e.g., a mechanical grinding process and/or a chemical mechanical polishing step) until the backside surfaces 110b, 120b, 130b of the semiconductor dies 110, 120, 130 are exposed. In some embodiments, the encapsulation material may be a molding compound, a molding underfill, a resin (such as an epoxy resin), or the like. In some embodiments, the encapsulation material is formed by an over-molding process. In some embodiments, the encapsulation material is formed by a compression molding process. In some embodiments, the encapsulation material may require a curing step.

In some embodiments, a temporary carrier TC having a de-bonding layer DB formed thereon is disposed on the top surface 160t of the encapsulant 160 and on the backside surfaces 110b, 120b, 130b of the semiconductor dies 110, 120, 130. In some embodiments, the backside surfaces 110b, 120b, 130b are opposite to the active surfaces 110a, 120a, 130a. In some embodiments, the temporary carrier TC is a glass substrate, a metal plate, a plastic supporting board or the like, but other suitable substrate materials may be used as long as the materials are able to withstand the subsequent steps of the process. In some embodiments, the de-bonding layer DB includes a light-to-heat conversion (LTHC) release layer, which facilitates peeling the temporary carrier TC away from the semiconductor package when required by the manufacturing process. In some embodiments, a die attach film (not shown) may be formed over the de-bonding layer DB and be interposed between the de-bonding layer DB and the semiconductor dies 110, 120, 130, and between the de-bonding layer DB and the encapsulant 160.

In FIG. 1B & FIG. 1C, only a single package unit is shown for simplicity, however, the disclosure is not limited thereto. In some embodiments, multiple package units are formed simultaneously on the interposer 140. In other words, the exemplary processes may be performed at a reconstructed wafer level, so that multiple package units are processed in the form of a reconstructed wafer RW. In some embodiments, the package structure is in a form of a reconstructed wafer RW, and the reconstructed wafer RW includes a plurality of package units. In some alternative embodiments, the package structure is in a form of a reconstructed panel, including a plurality of package units arranged in an array.

Referring to FIG. 1C, the reconstructed wafer RW may be overturned on the temporary carriage TC to work on the interposer 140 from its bottom surface 140b. In some embodiments, a grinding process is performed on the interposer 140 by removing the semiconductor material from the bottom surface 140b to thin the interposer 140 until the through vias 142 are exposed from the bottom surface 140b. Optionally, a silicon etching process may be performed to further expose the through vias 142. A passivation layer (not shown) including openings exposing the through vias 142 may optionally be formed on the bottom surface 140b after the thinning process. Connectors 170 are formed on the exposed through vias 142 to provide electrical connection with other components. The connectors 170 may be any one of the structures disclosed previously for the connectors 118, or any combination thereof. In some embodiments, under-bump metallurgies (not shown) are formed on the exposed through vias 142 before providing the connectors 170.

In some embodiments, as shown in FIG. 1C, a singulation step is performed to separate the individual package units 100A, for example, by cutting through the reconstructed wafer RW along the scribing lanes SC arranged between individual package units 100A. In some embodiments, adjacent packages 100A may be separated by cutting through the scribing lanes SC of the reconstructed wafer RW. In some embodiments, the singulation process typically involves performing a wafer dicing process with a rotating blade and/or a laser beam. In some embodiments, the de-bonding layer DB (e.g., the LTHC release layer) is irradiated with a UV laser so that the carrier TC and the de-bonding layer DB are easily peeled off from the semiconductor packages 100A. Nevertheless, the de-bonding process is not limited thereto, and other suitable de-bonding methods may be used in some alternative embodiments.

In some embodiments, as illustrated in FIG. 1D, the semiconductor package 100A is bonded to a top surface 200t of a substrate 200 via the connectors 170. In some embodiments, a material of the substrate 200 is chosen from the same semiconductor materials listed above for the interposer 140. In some embodiments, the substrate 200 may be a package substrate or BGA substrate including one or more active components, passive components, or a combination thereof. The active and passive components may be formed using any suitable method. The substrate 200 may also include interconnection structures and/or redistribution layers (not shown) to connect various components therein to form functional circuitry. In some embodiments, the substrate 200 may be provided for dual-side electrical connection.

In some embodiments, an underfill 180 may fill the interstices formed by the connectors 170 between the semiconductor package 100A and the substrate 200. In some embodiments, a material and a manufacturing method of the underfill 180 are similar to the materials and manufacturing methods described for the underfills 150, 152, 154 with reference to FIG. 1A, and a detailed description thereof is omitted herein.

In some embodiments, referring to FIG. 1E, an auxiliary mask M1 is disposed on the substrate 200 covering a portion of the top surface 200t surrounding the semiconductor package 100A and, optionally, a bottom surface 200b. In some embodiments, the auxiliary mask M1 is a pre-fabricated mask including an opening O1 surrounding the area of the substrate 200 in which the package 100A is disposed. In some alternative embodiments, the auxiliary mask M1 is a protective tape that is disposed over the substrate 200. In some alternative embodiments, the auxiliary mask M1 is a patterned photoresist. In some embodiments, a protection jig is used as the auxiliary mask M1.

In some embodiments, a metallization precursor layer 300a is conformally formed over the top surface 200t of the substrate 200. The metallization precursor layer 300a may cover the semiconductor package 100A, the underfill 180, and at least the portion of the mask M1 formed over the top surface 200t. The metallization precursor layer 300a may be formed through, for example, a sputtering process, a physical vapor deposition (PVD) process, a plating process, or the like. In some embodiments, the metallization precursor layer 300a includes, for example, copper, tantalum, titanium-copper alloys, or other suitable metallic materials. In some embodiments, the metallization precursor layer 300a includes, for example, polymers, hybrid materials or other suitable materials. In some embodiments, the formation of the metallization precursor layer 300a is optional and may be skipped. Referring to FIG. 1E and FIG. 1F simultaneously, with the removal of the auxiliary mask M1, the portion of metallization precursor layer 300a deposited over the auxiliary mask M1 is also removed, leaving a metallization layer 300 that extends on the semiconductor package 100A, the underfill 180 and, optionally, on a region of the substrate 200 immediately adjacent and surrounding the semiconductor package 100A. As shown in FIG. 1F, the metallization layer 300 at least covers the top surface 100t of the semiconductor package 100A.

In some embodiments, referring to FIG. 1G, a first bonding material 410 and a second bonding material 420 may be disposed over the substrate 200 and the semiconductor package 100A, respectively. In some embodiments, the first bonding material 410 may extend over the portion of the top surface 200t of the substrate where the auxiliary mask M1 (shown in FIG. 1E) was located during the formation of the metallization precursor layer 300a (shown in FIG. 1E). That is, the first bonding material 410 may reach the portion of the metallization layer 300 extending over the substrate 200 around the semiconductor package 100A. In some alternative embodiments, as shown in FIG. 1G, a gap G may exist between the metallization layer 300 and the first bonding material 410. A portion of the top surface 200t of the substrate 200 may be exposed through the gap G. A material of the first bonding material 410 is not particularly limited, and may be chosen as a function of the materials used for the substrate 200 and the cover 510A (shown in FIG. 1H) of the heat dissipation system 500A (shown in FIG. 1H) which the first bonding material 410 has to secure together. In some embodiments, a material of the first bonding material 410 includes thermocurable adhesives, photocurable adhesives, thermally conductive adhesive, thermosetting resin, waterproof adhesive, lamination adhesive or a combination thereof. In some embodiments, the material of the first bonding material 410 includes a thermally conductive adhesive. In some embodiments, the first bonding material 410 includes a metallic layer (not shown) with solder paste (not shown) deposited thereon. According to the type of material used, the first bonding material 410 may be formed by deposition, lamination, printing, plating, or any other suitable technique. In some embodiments, portions of the second bonding material 420 are disposed over the semiconductor package 100A, on the metallization layer 300 (if present). Similar to what was discussed above for the first bonding material 410, a material of the second bonding material 420 may be chosen as a function of the nature of the surfaces to be adhered, and the same materials listed for the first bonding material 410 may also be used for the second bonding material 420. In some embodiments, the material of the second bonding material 420 is different from the material of the first bonding material 410. In some alternative embodiments, the material of the first bonding material 410 is the same as the material of the second bonding material 420. In some embodiments, the material of the second bonding material 420 includes solder paste or bonding adhesive layer. In some embodiments, the second bonding material 420 is provided through a printing step, for example via stencil printing.

Referring to FIG. 1H, a heat dissipation system 500A is provided over the substrate 200 and the semiconductor package 100A and the semiconductor device SD1 is produced. In some embodiments, the heat dissipation system 500A includes a cover 510A and a seal 520. In some embodiments, the cover 510A includes a cap 512A, and flanges 514A at the periphery of the cap 512A. In some embodiments, the cap 512A is disposed over the semiconductor package 100A and extends substantially parallel to the substrate 200. The flanges 514A may be located at the edge of the cap 512A, and project towards the substrate 200. In some embodiments, the flanges 514A extend in a direction perpendicular to the plane defined by the cap 512A. In some embodiments, the flanges 514A and the cap 512A describe a right angle at their joint, but the disclosure is not limited thereto. In some embodiments, the flanges 514A are joined to the cap 512A at different angles than 90 degrees. In some embodiments, the flanges 514A extend towards the substrate 200 and surround the semiconductor package 100A. In some embodiments, the flanges 514A, the cap 512A and the substrate 200 define an enclosure E1 surrounding the semiconductor package 100A on all sides. In some alternative embodiments, the flanges 514A do not entirely enclose the semiconductor package 100A. In some embodiments, as shown in the schematic top view of FIG. 2C, the span of the cap 512A extends beyond the span of the semiconductor package 100A at two opposite sides, while the span of the cap 512A at the other two opposite sides is located within the span of the semiconductor package 100A. That is, the flanges 514A may face only two opposite sides of the semiconductor package 100A, leaving the other sides exposed. In some embodiments, the flanges 514A reach the substrate 200 where the first bonding material 410 is disposed, and the first bonding material 410 secures the cover 510A within the semiconductor device SD1. In some embodiments, the first bonding material 410 is disposed on the substrate 200 only where the flanges 514A are expected to contact the substrate 200.

In some embodiments, a span of the cap 512A may exceed a span of the semiconductor package 100A. In some embodiments, the span of the semiconductor package 100A may entirely fall within the span of the cap 512A. In some embodiments, the cap may present regions of different thickness defining one or more recesses. For example, as shown in FIG. 1H, the cap 512A may present a first thickness T1 when extending over the substrate 200 without the semiconductor package 100A interposed in between, and one or more regions of different thickness (e.g., T2 and T3) when extending over the semiconductor package 100A. In some embodiments, a first region of thickness T2 smaller than the thickness T1 defines a circulation recess R1 over a central portion of the semiconductor package 100A, and a second region of thickness T3 smaller than the thickness T1 defines an annular recess R2 towards the edge of the top surface 100t of the semiconductor package 100A. In some embodiments, the cover 510A may constitute the ceiling and the walls of the circulation recess R1, and the upper surface 100t of the semiconductor package 100A (or the metallization layer 300 when included) may constitute the floor of the circulation recess R1.

In some embodiments, the circulation recess R1 extends over the semiconductor dies 110, 120, 130. In some embodiments, the circulation recess R1 extends over some but not all of the semiconductor dies 110, 120, 130 included in the semiconductor package 110A. In some embodiments, the circulation recess R1 extends at least over a portion of the semiconductor die 110, 120, or 130 that produces the greatest amount of heat during operation of the semiconductor device SD1. In some embodiments, the cap 512A includes one or more inflow/outflow channels (e.g., CH1, CH2 and CH3 in FIG. 1H) in fluid communication with the circulation recess R1. In some embodiments, the inflow/outflow channels CH1, CH2, CH3 open in areas overlying the semiconductor dies 110, 120, 130. In some embodiments, the other end of the one or more inflow/outflow channels CH1, CH2, and CH3 may open on the top surface 512t of the cap 512A. In some embodiments, the inflow/outflow channels CH1, CH2, CH3 may be open holes having a substantially vertical profile in the thickness direction of the cap 512A, but the disclosure is not limited thereto. In some embodiments, at least a portion of one of the channels inflow/outflow CH1, CH2 or CH3 runs within the cap 512A along a direction titled rather than vertical. In some embodiments, portions of the inflow/outflow channels CH1, CH2, CH3 run parallel to the substrate 200. As explained in further detail below, the inflow/outflow channels CH1, CH2, CH3 may be filled by a coolant CL (shown in FIG. 1I) flowing through the circulation recess R1.

In some embodiments, the seal 520 is accommodated within the annular recess R2 and physically contacts (or is slightly compressed by) the cap 512A and the semiconductor package 100A (or the metallization layer 300 if included). In some embodiments, the seal 520 is a seal ring made of a polymeric material, such as an organic resin or rubber, and provides closure and segregation for avoiding fluid leakage from the circulation recess R1. In some embodiments, the seal 520 may include a silicone filling.

In some embodiments, microstructures 516 are formed to protrude from the cap 512A within the circulation recess R1 towards the semiconductor package 100A. In some embodiments, the microstructures 516 define a network of interstices in fluidic communication. In some embodiments, the microstructures 516 are micro-pillars extending from the cap 512A to the semiconductor package 100A (or the metallization layer 300 if included). In some embodiments, the microstructures 516 are parallel fins defining a serpentine path. In some embodiments, adjacent fins define micro-trenches in between. In some embodiments, the microstructures 516 land on the semiconductor package 100A over the portions of second bonding material 420. That is, the second bonding material 420 may be disposed or patterned so as to match the position of the microstructures 516 on the cover 510A. In some embodiments, the microstructures 516 are interspersed within the circulation recess R1 without interrupting the fluidic communication among the inflow and outflow channels CH1, CH2, CH3.

In some embodiments, a material of the cap 512A includes a thermally conductive material. In some embodiments, the material of the cap 512A includes metals or metal alloys, such as copper, aluminum, their alloys, the combinations thereof or the like. In some embodiments, the material of the cap 512A includes a semiconductor material such as silicon. In some embodiments, the material of the cap 512A includes polyimide, epoxy resin, acrylic resin (e.g., polymethylmethacrylate, PMMA), phenol resin, benzocyclobutene (BCB), polybenzooxazole (PBO), or any other suitable polymer-based material. In some embodiments, a material of the flanges 514A may be selected from the same materials listed above for the cap 512A. In some embodiments, the cap 512A and the flanges 514A are produced as a single piece (integrally formed). That is, the flanges 514A and the cap 512A may be fabricated from the same material, and no interface or clear boundary may be visible between the flanges 514A and the cap 512A. In some embodiments, a material of the microstructures 516 may be selected from the same materials listed above for the cap 512A. In some embodiments, the cap 512A and the microstructures 516 are produced as a single piece of material (integrally formed). That is, the cap 512A and the microstructures 516 may be fabricated together from the same material, and no interface or clear boundary may be visible between the cap 512A and the microstructures 516.

In some embodiments, the microstructures 516 and the cap 512A are made of a metallic material and the second bonding material 420 includes a solder paste. As such, the microstructures 516 and the cap 512A may be soldered over the semiconductor package 100A or the metallization layer 300 (if included). In such cases, a joint (shown in the inset of FIG. 1H) is formed and includes a solder core 4201 (e.g., SnAg solder) sandwiched between two layers 4202 and 4203 including an intermetallic compound (e.g., Ni3Sn4) and two outer metallic layers (e.g., the metallization layer 300 and the microstructure 516 or the metallization layer 300 and the cap 512A). That is, the first layer including the intermetallic compound 4202 may be disposed between the metallization layer 300 (or the semiconductor package 100A) and the solder core 4201, and the second layer including the intermetallic compound 4203 may be disposed between the microstructures 516 or the cap 512A and the solder core 4201. Similar solder joints (not shown) may be formed when the flanges 514A are formed of a metallic material and the first bonding material 410 includes solder paste. However, the disclosure is not limited thereto, and different combinations of materials for the cap 512A, the flanges 514A and the first bonding material 410 or the microstructures 516 and the second bonding material 420 may be envisioned. All these combinations are meant to fall within the scope of the present disclosure and the attached claims.

A method of forming the cover 510A may be selected according to the material(s) chosen for the cap 512A, the flanges 514A and the microstructures 516. In some embodiments, the cover 510A is molded, forged, 3D-printed, grown, or fabricated according to any other suitable technique. In some embodiments, the cap 512A, the flanges 514A and the microstructures 516 are fabricated separately and then assembled to produce the cover 510A.

It should be noted that in FIG. 1D through FIG. 1H, the manufacturing of a single semiconductor device SD1 was shown for simplicity, but the disclosure is not limited thereto. In some embodiments, multiple semiconductor packages 100A are disposed simultaneously on the substrate 200, which may be in a wafer or panel form. In other words, the exemplary processes may be performed at a reconstructed wafer/panel level, so that multiple semiconductor devices SD1 are processed simultaneously in the form of a reconstructed wafer/panel. In some embodiments, a singulation step (analogous to what was described above with reference to FIG. 1D) may be performed.

Figure 1I:
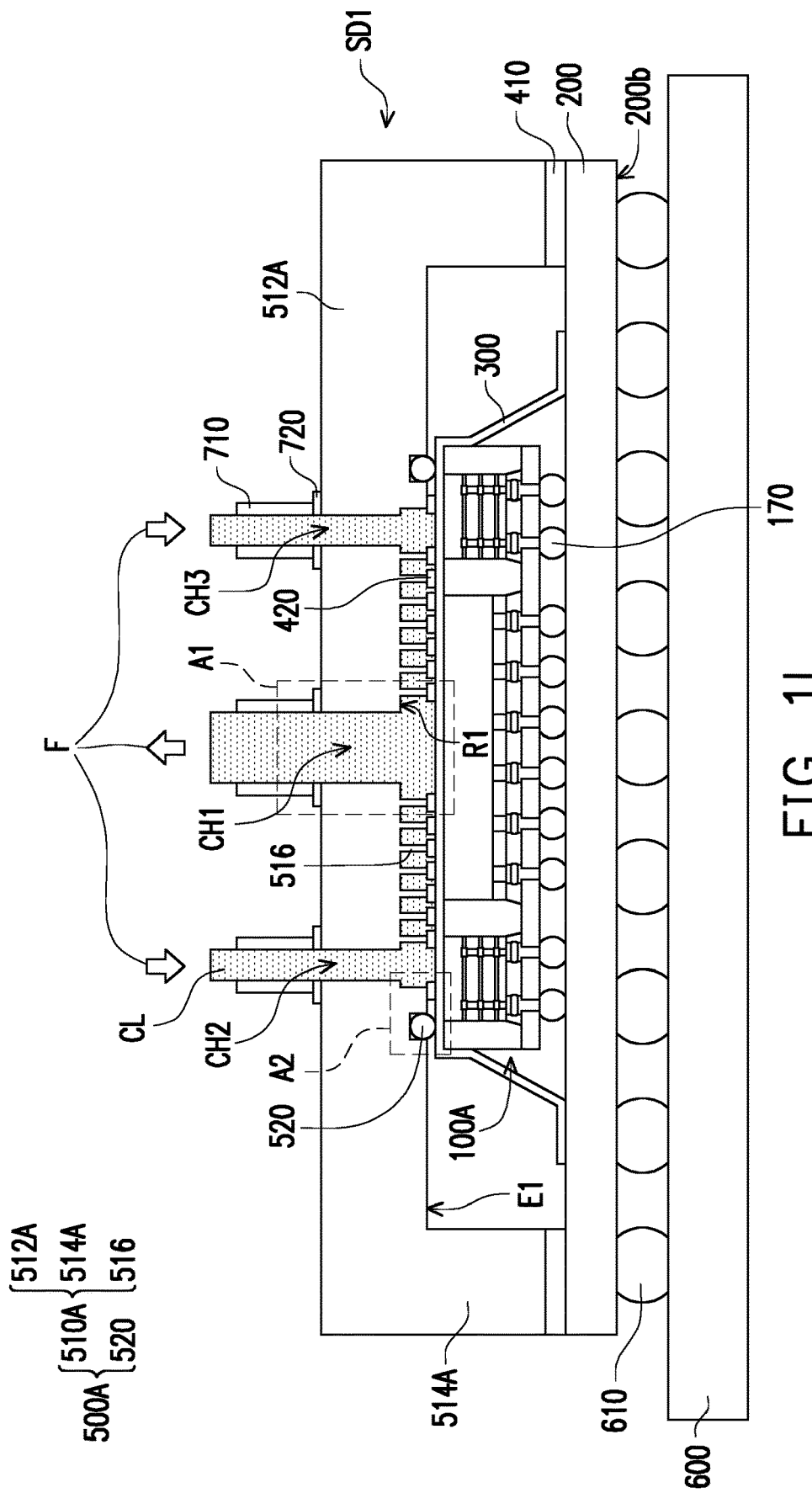
FIG. 1I is a schematic cross-sectional view illustrating an electronic device according to some embodiments of the present disclosure.

FIG. 1I is a schematic cross-sectional view illustrating an electronic device according to some embodiments of the disclosure. In the electronic device of FIG. 1I, the semiconductor device SD1 of FIG. 1H is further connected to a circuit substrate 600 and a fluid circulation system according to some embodiments of the disclosure. The circuit substrate 600 may be a motherboard, a printed circuit board, or the like. The semiconductor device SD1 may be connected to the circuit substrate 600 via connectors 610 disposed on the bottom surface 200*b* of the substrate 200.

In some embodiments, as shown in FIG. 1I, the fluid circulation system includes pipes 710 connected to the cover 510A of the heat dissipation system 500A and, optionally, washers 720, that secure the attachment of the pipes 710 to the cover 510A. In other embodiments, the cover 510A may be fabricated with washer(s) fitted into the inflow/outflow channels CH1, CH2, CH3 for subsequent connection with pipes or tubes. In some embodiments, the pipes 710 and the inflow/outflow channels CH1, CH2, CH3 present matching treads (not shown), so that the pipes 710 can be securely fastened into the inflow/outflow channels CH1, CH2, CH3, either directly or through intervening pipe connectors (not shown). In some embodiments, the pipe connectors may include one-way valves that direct the flow of the coolant CL through the circulation recess R1. The pipes 710 may be connected with the inflow/outflow channels CH1, CH2, CH3 formed in the cover 510A to allow the coolant CL to flow into the circulating recess R1 of the semiconductor device SD1 and remove heat generated by the semiconductor package 100A during usage. As the flow direction is indicated by the arrows F of FIG. 1I, some of inflow/outflow channels CH1, CH2, CH3 may be used as outflow channels (CH1), and the remaining channels may be used as inflow channels (CH2, CH3). In some embodiments, the outflow channel(s) may be at least as large as the inflow channel(s). In some embodiments, the outflow channel(s) may be larger (has a wider opening) than the inflow channel(s). In some embodiments, the coolant CL flows into the circulating recession R1 from the inflow channels CH2, CH3, flows through the microstructures 516 and flows out from the outflow channel CH1. In some embodiments, a stopper (not shown) may be used to seal any of the inflow/outflow channels CH1, CH2, CH3 if so required by the design of the fluid circulation system. In some embodiments, the channels formed over the components of the semiconductor package 100A which produce more heat during usage are used as outflow channels. For example, if the semiconductor package 100A includes a logic chip and a memory chip, and the power consumption of the logic chip is generally higher than the power consumption of the memory chip, as outflow channel may be used the channel(s) formed overlying the logic chip. However, the disclosure is not limited thereto. In some alternative embodiments, the channels formed over the memory chip are used as outflow channels. In some embodiments, the coolant CL is a liquid. In some embodiments, the coolant CL is water. In some embodiments, additives are added to the water to produce a cooling fluid. Examples of additives include surfactants, corrosion inhibitors, biocides, antifreeze, and the like.

Figure 2A:
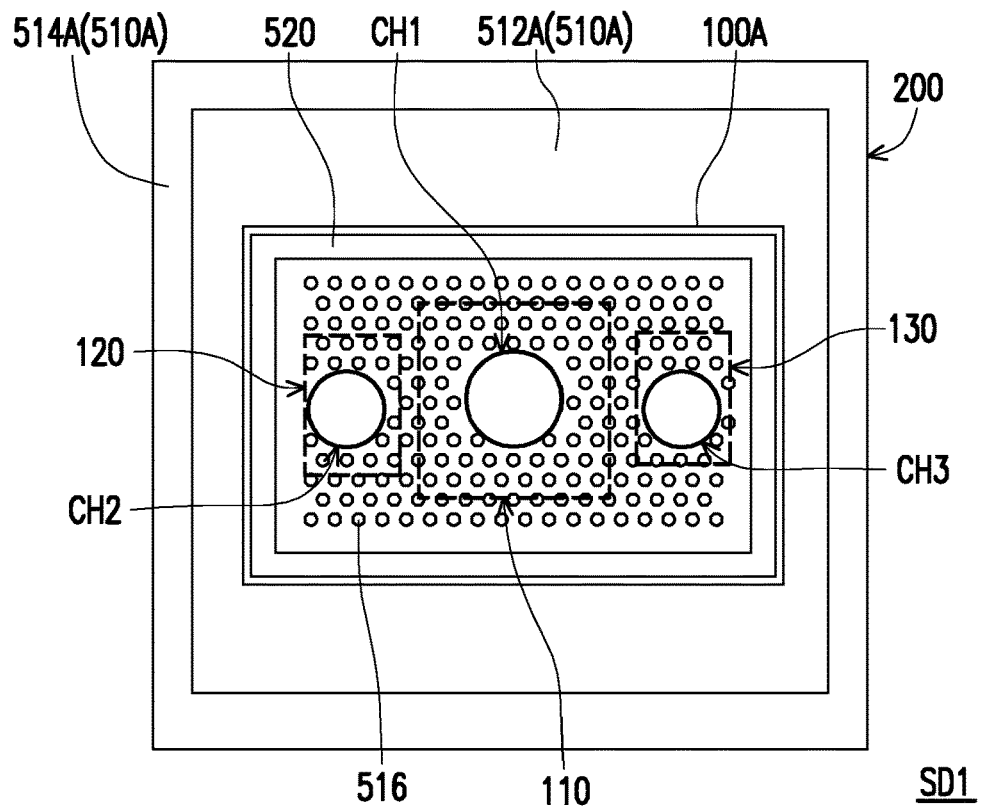
FIG. 2A through FIG. 2B are schematic top views of some semiconductor devices according to some embodiments of the present disclosure.

In FIG. 2A is shown a schematic top view of the semiconductor device SD1 of FIG. 1H according to some embodiments of the disclosure. For the sake of clarity, only some of the components (or portions of said components) are schematically represented. Referring to FIG. 1H and FIG. 2A, in some embodiments, a span of the cover 510A matches a span of the substrate 200, so that the flanges 514A substantially fall on the edge of the substrate 200. In some alternative embodiments, the span of the substrate 200 may be larger than the span of the cover 510A, so that the substrate 200 may protrude from below the cover 510A when viewed from the top. In some embodiments, the seal 520 has an annular shape, and is disposed close to the edge of the semiconductor package 100A. In some embodiments, protrusions of the cap 512A extend between the seal 520 and the edge of the semiconductor package 100A, keeping the seal 520 in place. The positions of the semiconductor dies 110, 120, 130 are schematically illustrated by dashed lines in FIG. 2A. In some embodiments, each inflow/outflow channel CH1, CH2, CH3 opens on a different semiconductor die 110, 120, 130, but the disclosure is not limited thereto. The cover 510A includes the microstructures 516 formed within the area surrounded by the seal 520. In some embodiments, no microstructures 516 are formed in correspondence of the inflow/outflow channels CH1, CH2, CH3. In one embodiment, the microstructures 516 includes round pillars arranged in arrays, surrounding the inflow/outflow channels CH1, CH2, CH3 and are located within the span of the seal 520.

Figure 2B:
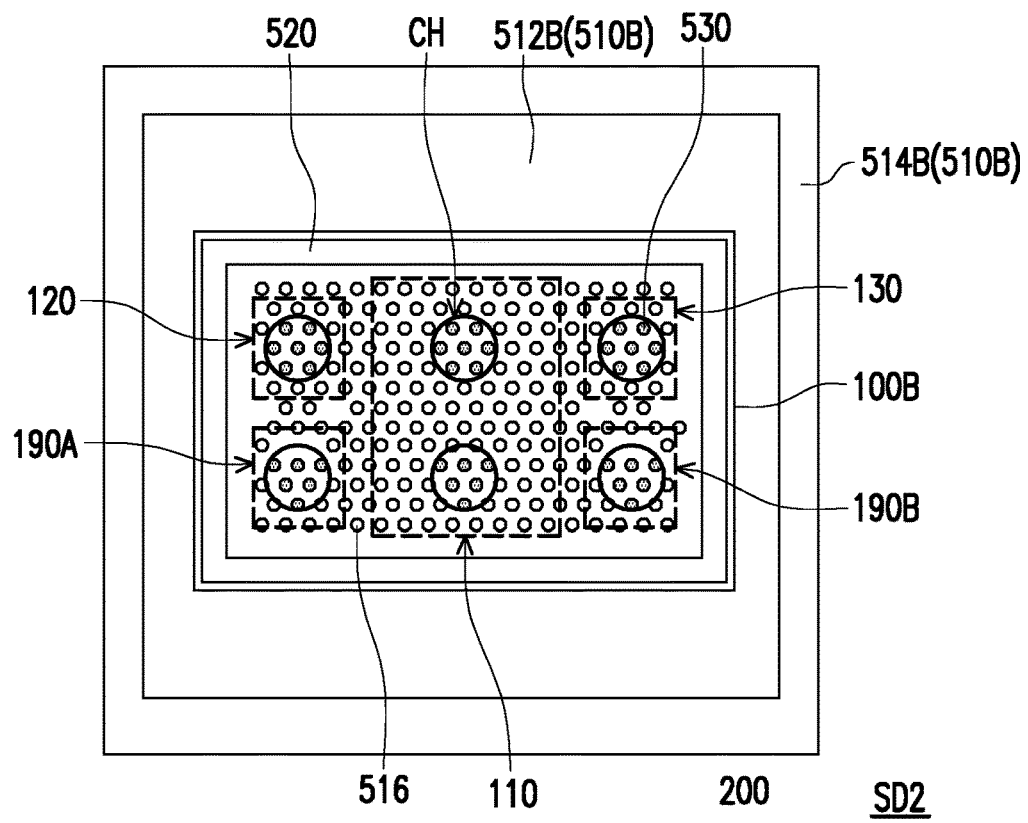
Figure 2C:
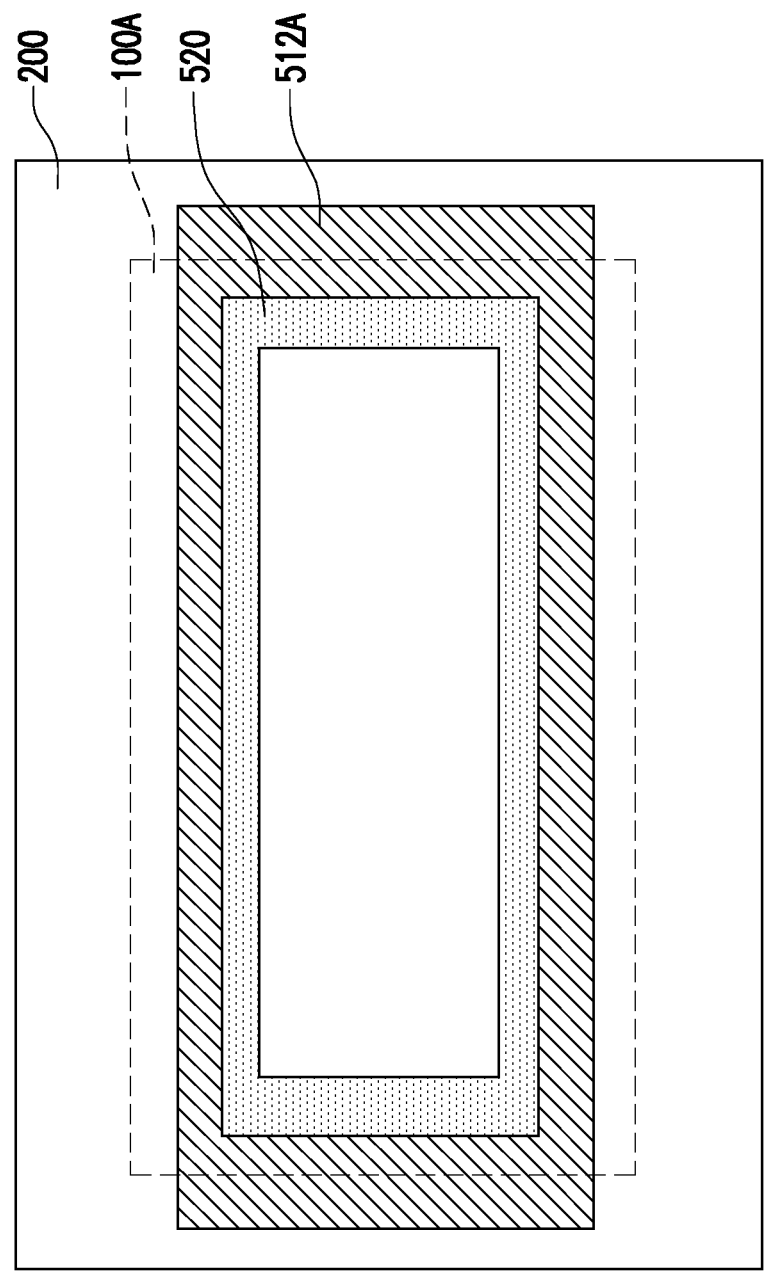
FIG. 2C is a schematic top view showing the semiconductor device according to some embodiments of the present disclosure.

In FIG. 2B is shown a schematic top view of a semiconductor device SD2 according to some embodiments of the disclosure. In some embodiments, the semiconductor device SD2 may be similar to the semiconductor device SD1 of FIG. 1I, and the description of the same or similar parts will be omitted for the sake of brevity. A difference between the semiconductor device SD2 of FIG. 2B and the semiconductor device SD1 of FIGS. 2A and 1H is that the semiconductor package 100B of the semiconductor device SD2 includes two dummy dies 190A and 190B disposed beside the two semiconductor dies 120 and 130. In some embodiments, the dummy dies 190A and 190B act as stress dissipating structures, by avoiding the presence within the semiconductor package 100B of extended areas filled by the sole encapsulant 160 (shown in FIG. 1B). In some embodiments, the dummy dies 190A, 190B are blocks of a material different from the encapsulant 160. In some embodiments, a material of the dummy dies 190A, 190B includes a semiconductor material, similar to what was discussed above for the semiconductor substrate 112 with reference to FIG. 1A. In some embodiments, neither active nor passive devices are formed within the dummy dies 190A, 190B. In some embodiments, the material of the dummy dies 190A, 190B includes a conductive material, such as metals. In some embodiments, the dummy dies 190A, 190B may further include one or more dielectric layers.

In some embodiments, as shown in FIG. 2B, the cover 510B includes more channels CH than the cover 510A of FIG. 2A. In some embodiments, an inflow/outflow channel CH is formed over each one of the semiconductor dies 120 and 130, and the dummy dies 190A, 190B, and other two inflow/outflow channels CH are formed over the semiconductor die 110. In some embodiments, the inflow/outflow channels CH formed over the semiconductor die 110 are used as outflow for the coolant CL (shown in FIG. 1I), whilst the remaining inflow/outflow channels CH are used as inflow channels. In some alternative embodiments, different channels are used for the inflow and outflow of the coolant CL. In some embodiments, one or more of the inflow/outflow channels CH illustrated in FIG. 2B may be omitted. For example, no inflow/outflow channels CH may be formed on top of the dummy dies 190A, 190B or of some of the semiconductor dies 110, 120, and 130. In some alternative embodiments, more than one inflow/outflow channel CH may be formed for each semiconductor die 110 included in the semiconductor device SD2.

In some embodiments, as illustrated in FIG. 2B, secondary microstructures 530 may be formed on the semiconductor package 100B in correspondence of the inflow/outflow channels CH. In some embodiments, the secondary microstructures 530 are formed in the locations in correspondence of all the inflow/outflow channels CH formed in the cover 510B. In some alternative embodiments, the secondary microstructures 530 are formed in the locations in correspondence of only some of the inflow/outflow channels CH of the cover 510B. For example, the secondary microstructures 530 may be formed only in correspondence of the inflow/outflow channels CH opening on the semiconductor device 110. Non-limiting examples of the secondary microstructures 530 will be illustrated with reference to FIG. 3A through FIG. 3C. It should be noted that whilst the secondary microstructures 530 are discussed with reference to the semiconductor device SD2 or the cover 510B, the secondary microstructures 530 may be formed within all of the other disclosed semiconductor devices. For example, the secondary microstructures 530 may be formed on the upper surface 100t of the top package 100A (shown in FIG. 1H) when the semiconductor device SD1 includes the cover 510A.

Figure 3A:
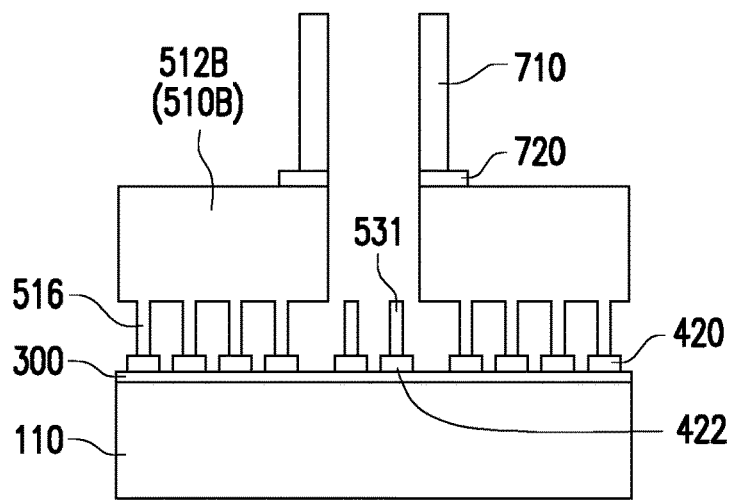
FIG. 3A through FIG. 3F are schematic cross-sectional views illustrating portions of some semiconductor devices according to some embodiments of the present disclosure.
Figure 3B:
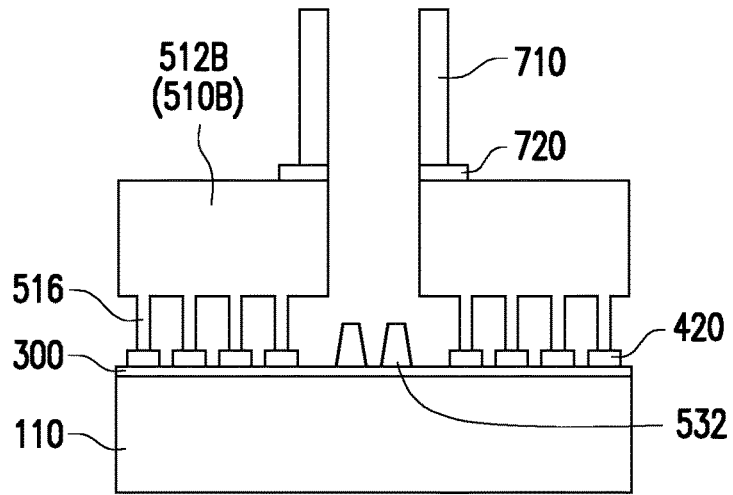
Figure 3C:
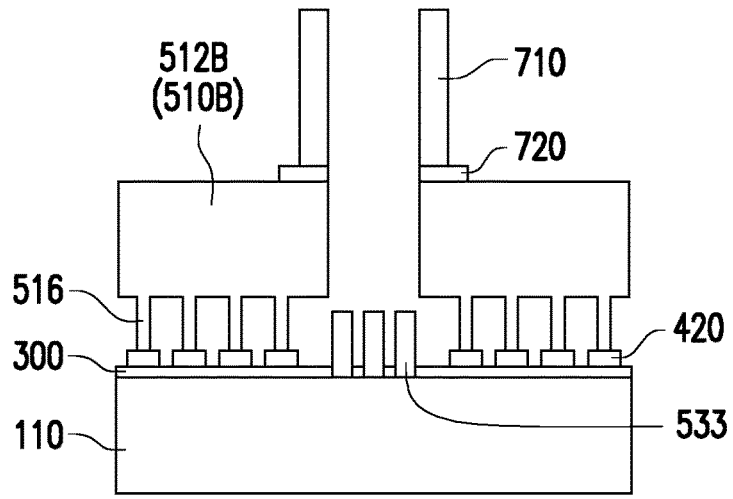

FIG. 3A through FIG. 3C are schematic cross-sectional views illustrating portions of some semiconductor devices according to some embodiments of the present disclosure. The views of FIG. 3A through FIG. 3C correspond to the area A1 shown in FIG. 1I. In some embodiments, the secondary microstructures 530 includes pillars 531 attached to the semiconductor die 110 (or the metallization layer 300, if included) through additional bonding material 422. A material of the secondary microstructures 530 (pillars 531) may be selected from the same materials listed above for the cover 510A, and the same considerations with respect to the choice of the additional bonding material 422 apply as well. In some embodiments, a material of the secondary microstructures 530 includes metals or metal alloys, and the additional bonding material 422 includes solder paste to form a solder joint. In some embodiments, as shown in FIG. 3B, the secondary microstructures 530 include metal pads 532, which may be directly disposed on the semiconductor die 110 (or 120 or 130) or the metallization layer 300 (if included) without intervening bonding material. In some embodiments, the secondary microstructures 530 include pillars (or fins) 533 protruding directly from the semiconductor die 110. In some embodiments, the secondary microstructures 530 are pre-fabricated structures that are disposed on the underlying semiconductor die 110 or metallization layer 300 via a bonding material 422 before placing the cover 510B. In some alternative embodiments, the secondary microstructures 530 are directly grown on the semiconductor die 110 or the metallization layer 130, for example via a deposition or a plating step. In some embodiments, auxiliary masks (not shown) are used while growing the secondary microstructures 530 to define a pattern for the secondary microstructures 530.

Figure 3D:
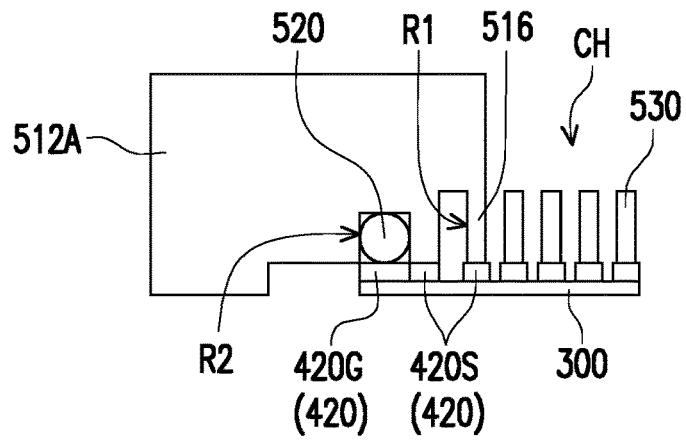
Figure 3E:
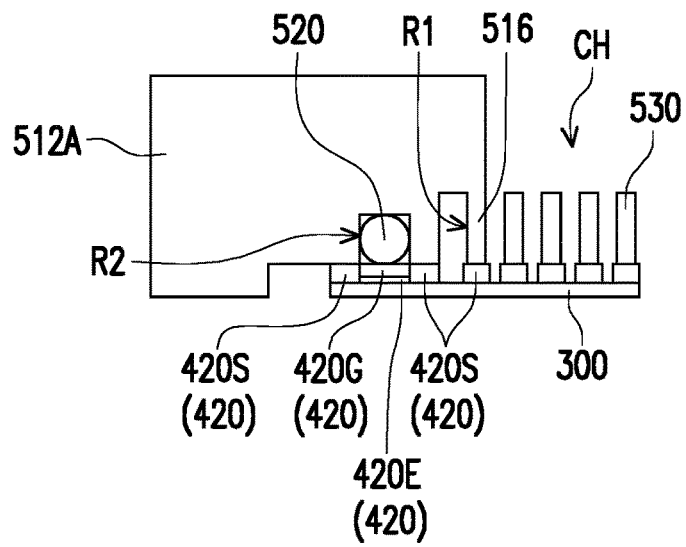
Figure 3F:
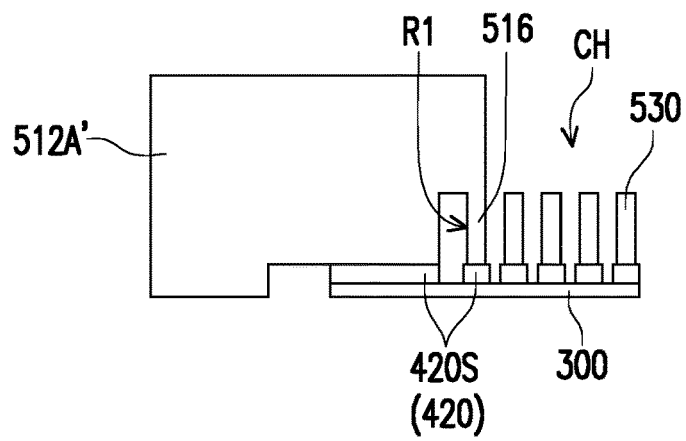

FIG. 3D through FIG. 3F are schematic cross-sectional views illustrating portions of some semiconductor devices according to some embodiments of the present disclosure. The views of FIG. 3D through FIG. 3F correspond to the area A2 shown in FIG. 1I. In some embodiments, the second bonding material 420 may include multiple portions 420G, 420S, 420E. In some embodiments the portions of the second bonding material 420 may include different materials. For example, as shown in FIG. 3D, the second bonding material 420 may include portions 420S disposed between the cap 512A and the metallization layer 300 (or to the underlying semiconductor package if the metallization layer 300 is not included), and portions 420G disposed within the second recess R2, between the seal ring 520 and the metallization layer 300 (or the underlying semiconductor package). In some embodiments, portions 420S may include solder paste, and portions 420G may include one or more graphene films. One or more microstructures 516 may protrude from the cap 512A in the portion of the cap 512A extending between the second recess R2 and the inflow/outflow channel CH. That is, the circulation recess R1 may extend below the cap 512A towards the second recess R2, without being in fluid communication with the second recess R2. The solder portions 420S may be disposed between the microstructures 516 and the metallization layer 300, while the graphene portions 420G may be disposed within the second recess R2. As shown in FIG. 3D, in some embodiments, solder portions 420S are disposed between the graphene portions 420G and the circulation recess R1, along a protrusion of the cap 512A separating the second recess R2 from the circulation recess R1. As shown in FIG. 3E, in some embodiments, solder portions 420S are disposed all along the protrusions of the cap 512A defining the second recess R2. The graphene portions 420G may be surrounded by solder portions 420S. In some embodiments, as shown in FIG. 3D, the graphene portions 420G are disposed directly on the metallization layer 300. In some alternative embodiments, an adhesive portion 420E may be disposed between the graphene portions 420G and the metallization layer 300. In some embodiments, the adhesive portion 420E and the overlying graphene portion 420G may be collectively referred to as a graphene tape. In some embodiments, the adhesive portion 420E includes an epoxy resin. That is, the adhesive portion 420E, the graphene portion 420G and the seal ring 520 may be stacked in this order on the metallization layer 300 within the second recess R2. In some alternative embodiments, as shown in FIG. 3F, the second recess R2 may be omitted from the cap 512A'. That is, the cap 512A' may define the circulation recess R1, but not the second recess R2. In these embodiments, the seal ring 520 (shown in FIGS. 3D and 3E) is also omitted. A solder portion 420S may be disposed between the cap 512A' and the metallization layer 300 (or the underlying semiconductor package). That is, the second bonding material 420 may include the solder portion 420S without including the graphene portion 420G or the adhesive portion 420E. In some embodiments, the solder portion 420S extends substantially uninterruptedly in the contact area between the cap 512A' and the metallization layer 300 (or the underlying semiconductor package).

In some embodiments, the solder portions 420S are provided by screen printing, and the cap (e.g., 512A) is subsequently disposed on the solder portion. In some embodiments, the graphene portion 420G or the graphene tape (420G and 420E) are disposed on the metallization layer 300 before screen printing the solder portions 420S, but the disclosure is not limited thereto. In some embodiments, the solder portions 420S are screen-printed on the metallization layer 300 before disposing the graphene portion 420G or the graphene tape 420G and 420E. In some embodiments, the seal ring 520 is disposed on the graphene portion 420G before placing the cap (e.g., 512A) on the metallization layer 300. In some alternative embodiments, the seal ring 520 is embedded in the second recess R2 of the cap (e.g., 512A), and the cap and the seal ring 520 are disposed simultaneously on the metallization layer 300.

FIG. 4A through FIG. 4D are schematic top views illustrating portions of some semiconductor devices according to some embodiments of the present disclosure. In FIG. 4A through FIG. 4D are shown portions of the circulation recess R1 including the microstructures 516, however, similar considerations may be applied to all the microstructures of the present disclosure. In the views of FIG. 4A through FIG. 4D, the incident flow of the coolant CL (shown in FIG. 1I)

is represented by the arrows F. In some embodiments, the arrows F are oriented along a first direction X. The structure of the microstructures 516 is described in FIG. 4A through FIG. 4D with respect to the first direction X and a second direction Y perpendicular to X. The plane XY defined by the directions X and Y is substantially parallel to the plane of the metallization layer 300 or the top surface 100t of the semiconductor package 100A. It should be noted that whilst most of the microstructures 516 shown in FIG. 4A through FIG. 4D are shown with a specific orientation within the plane XY, the disclosure is not limited thereto. In some embodiments, the microstructures 516 may be included in a tilted orientation with respect to what is shown in FIG. 4A through FIG. 4D.

Figure 4A:
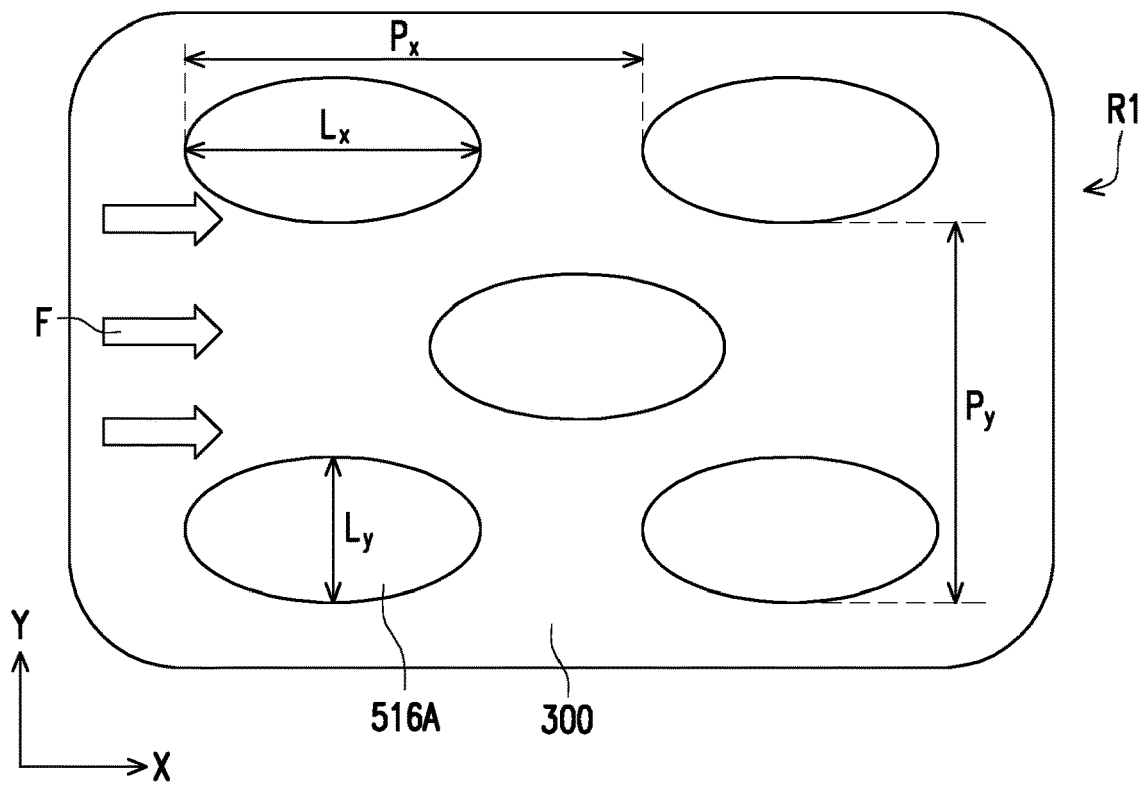
FIG. 4A through FIG. 4D are schematic top views illustrating portions of some semiconductor devices according to some embodiments of the present disclosure.

In some embodiments, as shown in FIG. 4A, the microstructures 516A have an elliptical cross section in the plane XY. In some embodiments, a first axis Lx of the microstructures 516A lies parallel to the first direction X, and the second axis Ly lies parallel to second direction Ly. In some embodiments, a pitch Px in the first direction X may be defined as the distance between corresponding points of two microstructures 516A having the first axis Lx lying along a first straight line, and the pitch Py in the second direction Y may be defined as the distance between corresponding points of two microstructures 516A having the second axis Ly lying along a second straight line. In some embodiments, the pitch Px and the pitch Py may be optimized as a function of the dimensions of the axes Lx and Ly to fine-tune the flow F of the coolant CL (shown in FIG. 1I) over the semiconductor package 100A. In some embodiments, the pitches Px, Py and the dimensions of the axes Lx, Ly may be chosen to ensure optimal heat exchange with the coolant CL.

Figure 4B:
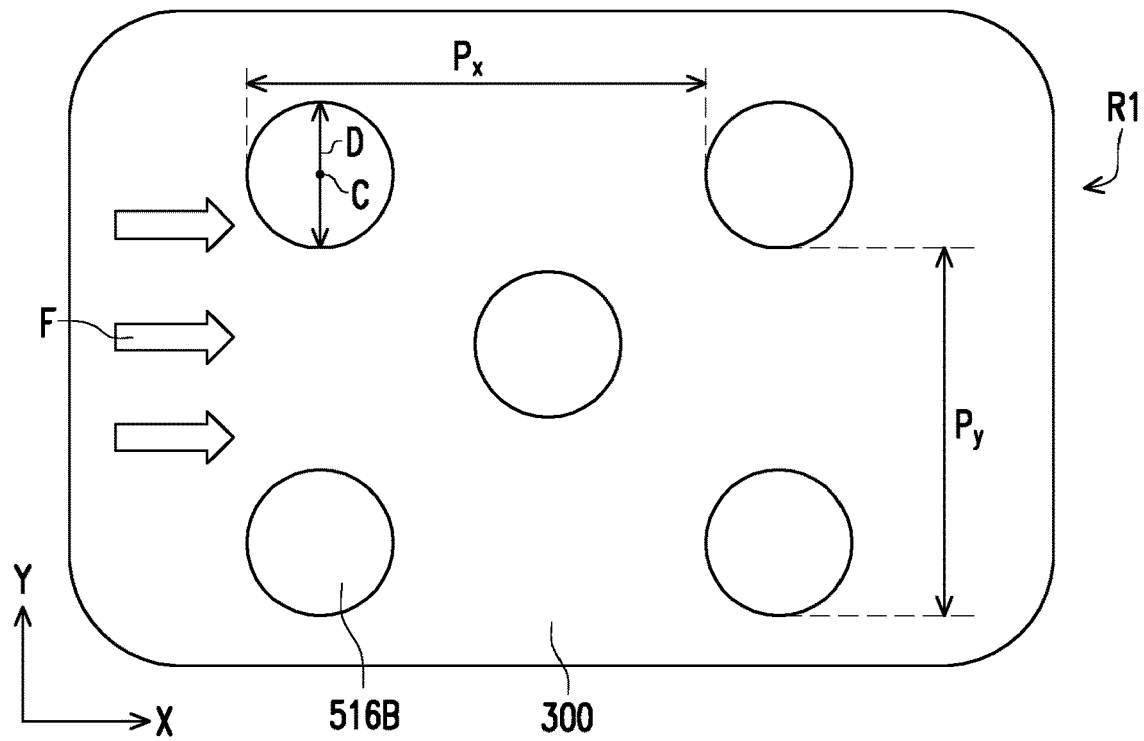

In some embodiments, as shown in FIG. 4B, the microstructures 516B have a substantially circular cross-section in the plane XY. In some embodiments, the pitch Px is defined between microstructures 516B having the centers C lying on a first straight line parallel to the first direction X, and the pitch Py is defined between microstructures 516B having the centers C lying on a second straight line parallel to the second direction Y. In some embodiments, the pitches Px, Py and the diameter D of the cross-section of the microstructures 516B may be chosen to ensure optimal heat exchange between the semiconductor package and the coolant CL (shown in FIG. 1I).

Figure 4C:
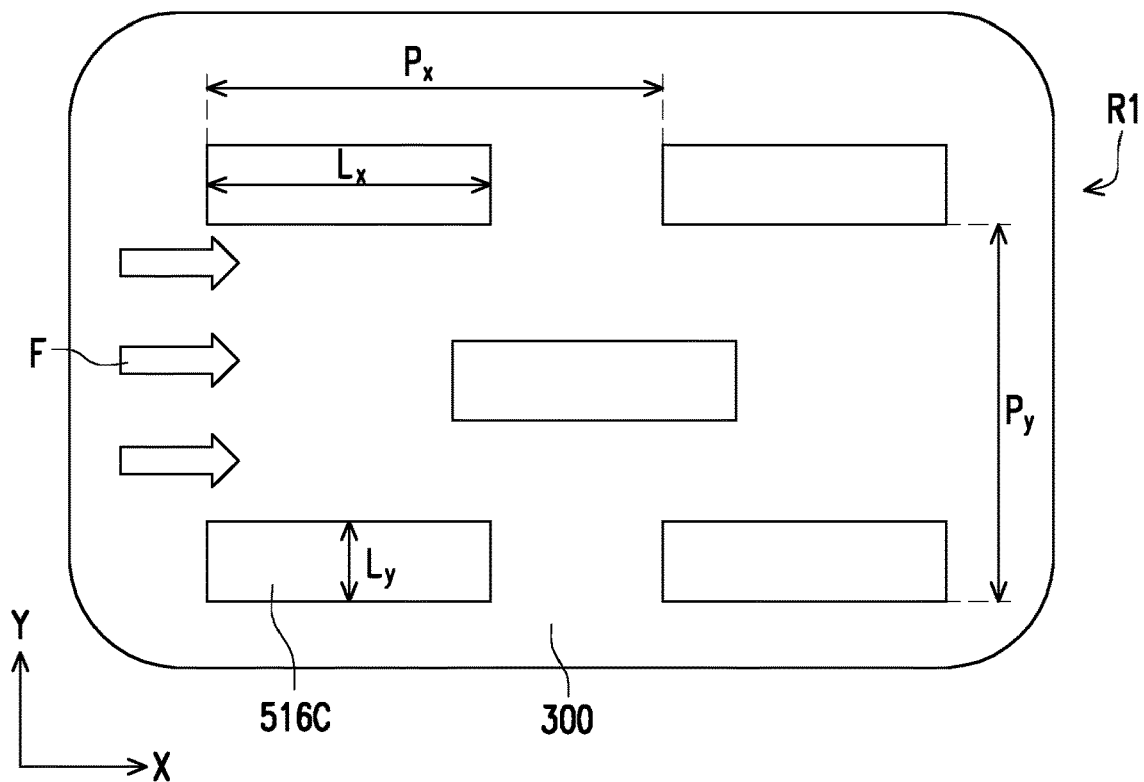

In some embodiments, as shown in FIG. 4C, the microstructures 516C have a rectangular cross section in the plane XY. In some embodiments, a first side Lx of the microstructures 516C lies parallel to the first direction X, and a second side Ly lies parallel to second direction Y. In some embodiments, the first side Lx and the second side Ly may have equal length, and the microstructures 516C may have a square cross-section. In some embodiments, the pitch Px in the first direction X is defined as between two microstructures 516C having the first side Lx lying along a first straight line, and the pitch Py in the second direction Y is defined as between two microstructures 516C having the second side Ly lying along a second straight line. In some embodiments, the pitches Px, Py and the dimensions of the sides Lx, Ly may be chosen to ensure optimal heat exchange between the semiconductor package and the coolant CL (shown in FIG. 1I).

Figure 4D:
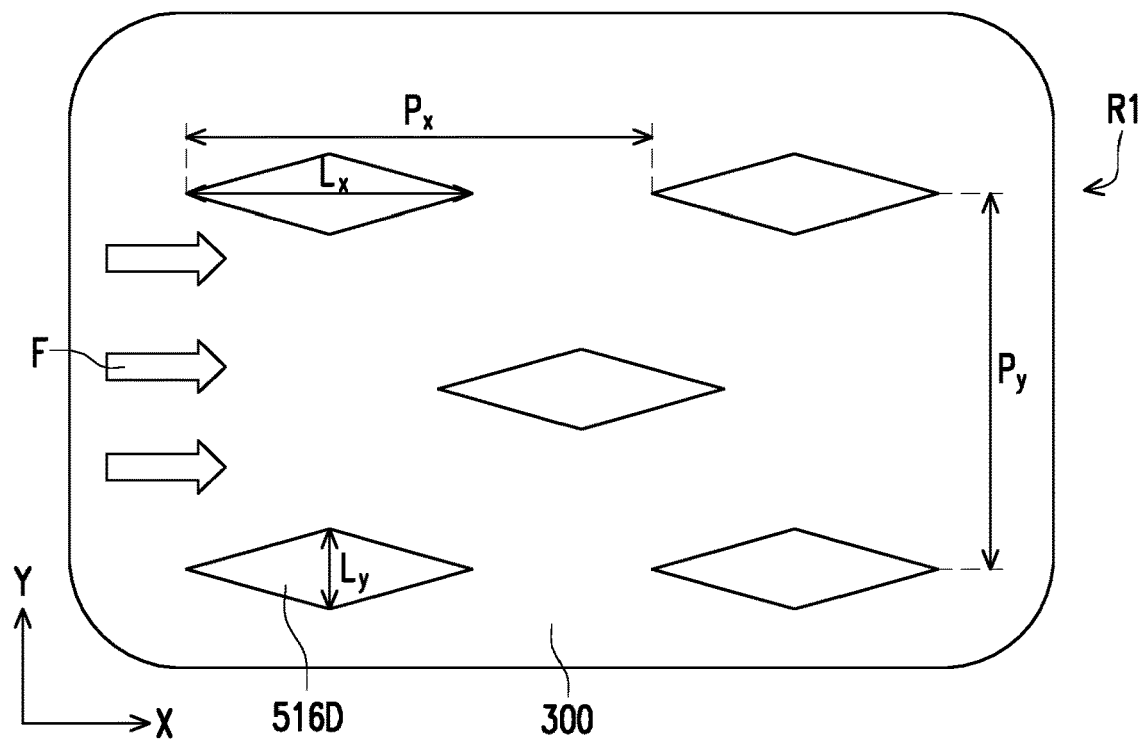

In some embodiments, as shown in FIG. 4D, the microstructures 516D have a rhombic or rhomboid cross section in the plane XY. In some embodiments, a first axis Lx of the microstructures 516D lies parallel to the first direction X, and a second axis Ly lies parallel to second direction Y. In some embodiments, the first axis Lx and the second axis Ly may have equal length, and the microstructures 516D may have a rhombic cross-section. In some embodiments, the pitch Px in the first direction X is defined between two microstructures 516D having the first axis Lx lying along a first straight line, and the pitch Py in the second direction Y is defined between two microstructures 516D having the second axis Ly lying along a second straight line. In some embodiments, the pitches Px, Py and the dimensions of the axes Lx, Ly may be chosen to ensure optimal heat exchange between the semiconductor package and the coolant CL (shown in FIG. 1I).

Figure 5A:
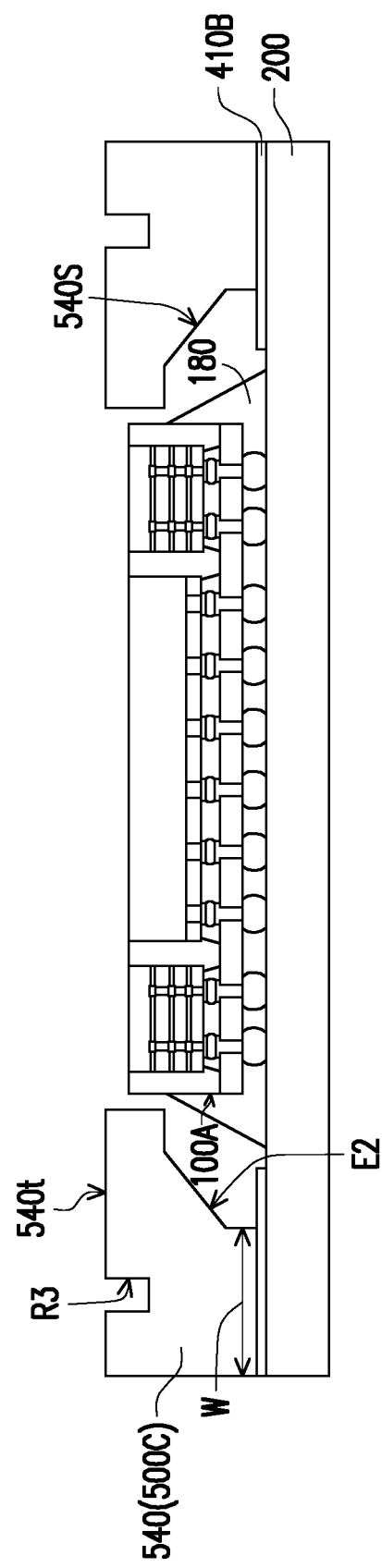
FIG. 5A through FIG. 5C are schematic cross-sectional views illustrating intermediate structures formed at various stages of a manufacturing method of a semiconductor device according to some embodiments of the present disclosure.
Figure 5B:
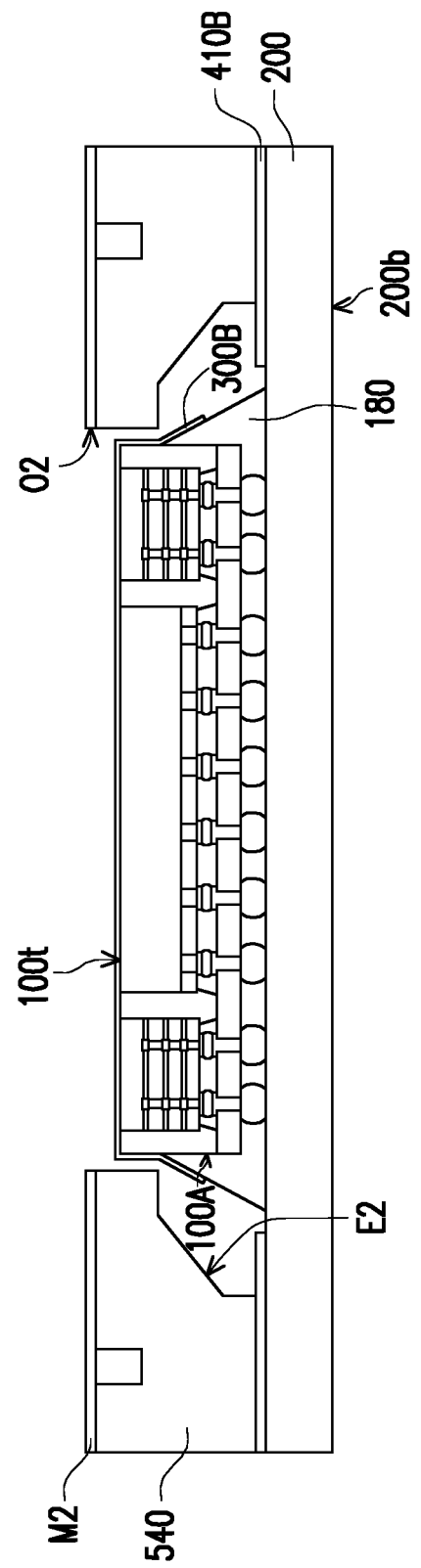
Figure 5C:
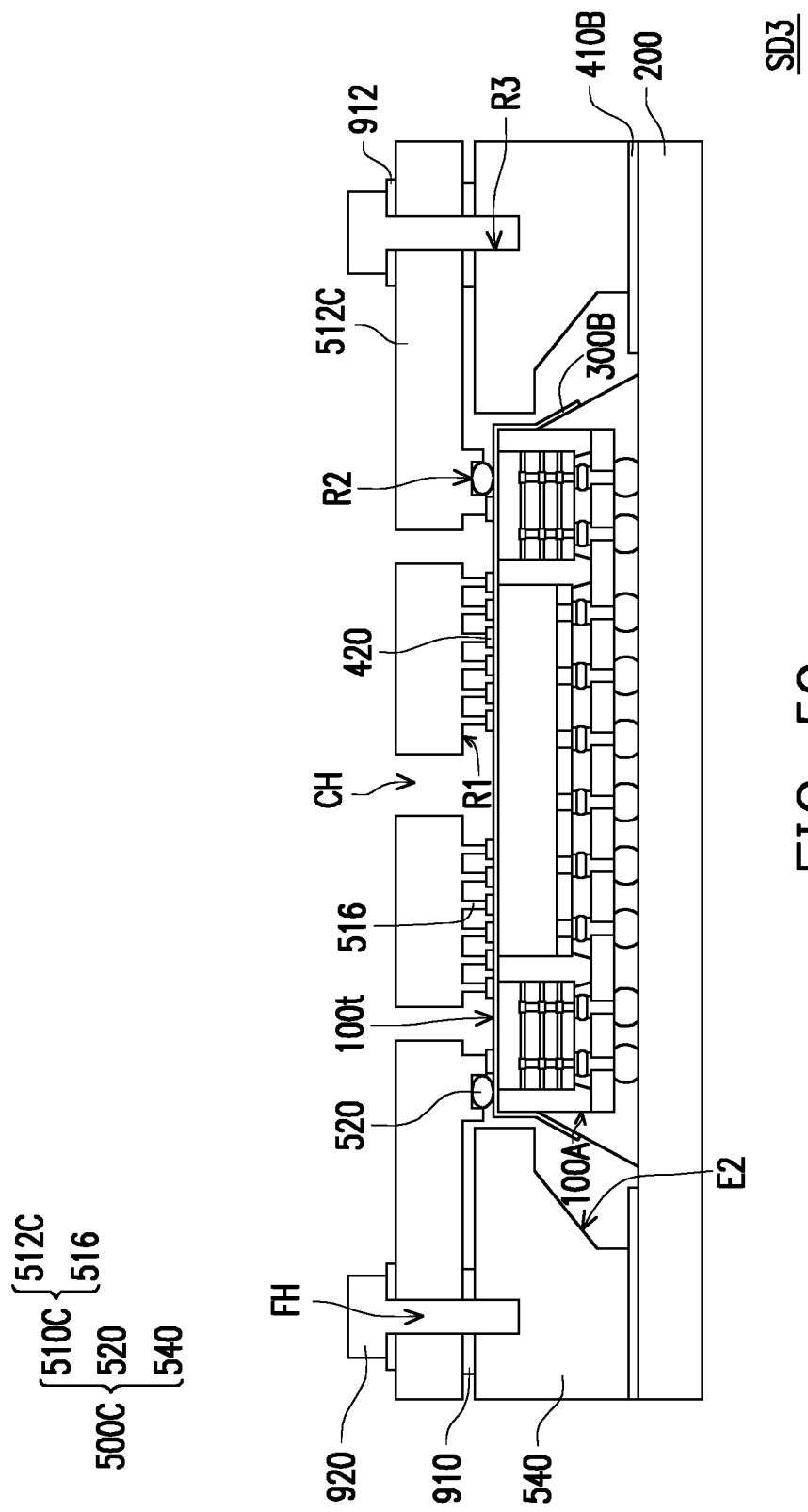

FIG. 5A through FIG. 5C are schematic cross-sectional views illustrating intermediate structures formed at various stages of a manufacturing method of a semiconductor device SD3 (shown in FIG. 5C) according to some embodiments of the present disclosure. In some embodiments, the intermediate structure shown in FIG. 5A may be obtained from the intermediate structure shown in FIG. 1D by disposing the first bonding material 410B on the substrate 200 and disposing a support 540 of the heat dissipation system 500C over the first bonding material 410B. In some embodiments, the support 540 surrounds the semiconductor package 100A. In some embodiments, the support 540 presents a concave recess E2 oriented towards the semiconductor package 100A. That is, a width W of the support 540 measured parallel to an extending direction of the substrate 200 may increase for portions of the support 540 further away from the substrate 200. In some embodiments, as shown in FIG. 5A, the width W of the support may be substantially constant closer to the substrate 200, then gradually increase with increasing distance from the substrate 200, and then remain substantially constant, thus resulting in a concave shape and an inclined surface 540S facing the semiconductor package 100A. In some alternative embodiments, the width W may increase in a discontinuous manner, and the support 540 may present one or more steps (not shown) facing the semiconductor package 100A. In some embodiments, the support 540 has an annular shape, and surrounds the semiconductor package 100A on all sides. In some alternative embodiments, the support 540 faces less than all of the sides of the semiconductor package 100A. For example, if the semiconductor package 100A has a rectangular shape, the support 540 may face three sides of the semiconductor package 100A rather than four. In some embodiments, the support 540 may include multiple separated pieces (not shown) disposed around the semiconductor package 100A. For example, the support 540 may include a first piece (not shown) facing a first side of the semiconductor package 100A and a second piece (not shown) facing a second side of the semiconductor package 100A. In some embodiments, the first side and the second side are opposite sides of the semiconductor package 100A, but the disclosure is not limited thereto. In some alternative embodiments, the first side and the second side are contiguous sides of the semiconductor package 100A. In some embodiments, recesses R3 open on the top surface 540t of the support 540. In some embodiments, the recesses R3 are configured to accommodate fasteners (e.g., screws, nails, and the like). In some embodiments, the recesses R3 are threaded. The disclosure is not limited by the number of recesses R3 formed on the top surface 540t of the support. In some embodiments, a single recess R3 is formed on the top surface 540t. In some alternative embodiments, multiple recesses R3 are formed.

Referring to FIG. 5B, in some embodiments, an auxiliary mask M2 is disposed over the support 540 and, optionally, on the bottom surface 200b of the substrate 200 (not shown). In some embodiments, the auxiliary mask M2 includes an opening O2 exposing the semiconductor package 100A. In some embodiments, the opening O2 further exposes at least a portion of the underfill 180. In some embodiments, options similar to what was previously discussed for the auxiliary mask M1 with reference to FIG. 1E may be used for the auxiliary mask M2, and a detailed description thereof is omitted herein. In some embodiments, the metallization layer 300B is formed within the opening O2 of the auxiliary mask M2, covering the top surface 100t of the semiconductor package 100A. In some embodiments, the metallization layer 300B may extend over a top portion of the underfill 180, closer to the top surface 100t of the semiconductor package 100A. In some embodiments, the metallization layer 300B does not extend in direct contact with the substrate 200.

Referring to FIG. 5C, positioning of the seal 520 and the cover 510C over the support 540 and the semiconductor package 100A completes the semiconductor device SD3. In some embodiments, the cover 510C includes a cap 512C and microstructures 516. Similar to what was previously discussed with reference to the cover 510A, the cover 510C may define the circulation recess R1 over the central portion of the semiconductor package 100A and the annular recess R2 towards the edge of the top surface 100t of the semiconductor package 100A. The seal 520 may be disposed within the annular recess R2. The microstructures 516 may be located within the circulation recess R1. Channels CH for the circulation of a coolant CL (shown in FIG. 1I) may open within the cap 512C in correspondence of the semiconductor package 100A. In some embodiments, fastening holes FH open within the cap 512C in correspondence of the recesses R3 of the support 540, and a fastener 920 (e.g., a screw, optionally secured by washers 910, 912) may be used to secure the cover 510C to the support 540. In some embodiments, other types of fasteners (e.g., nails, clamp, tape or the like) may be used to secure the cover 510C to the support 540. In some embodiments, the position (or the inclusion) of the recesses R3 within the support 540 and the fastening holes FH within the cover 510C may be adapted according to the type of fastener used. In some embodiments, depending on the type of fastener 920 used, the fastening holes FH or the recesses R3 may be formed on different surfaces of the cover 510C and the support 540 than the ones illustrated in FIG. 5C.

Figure 6A:
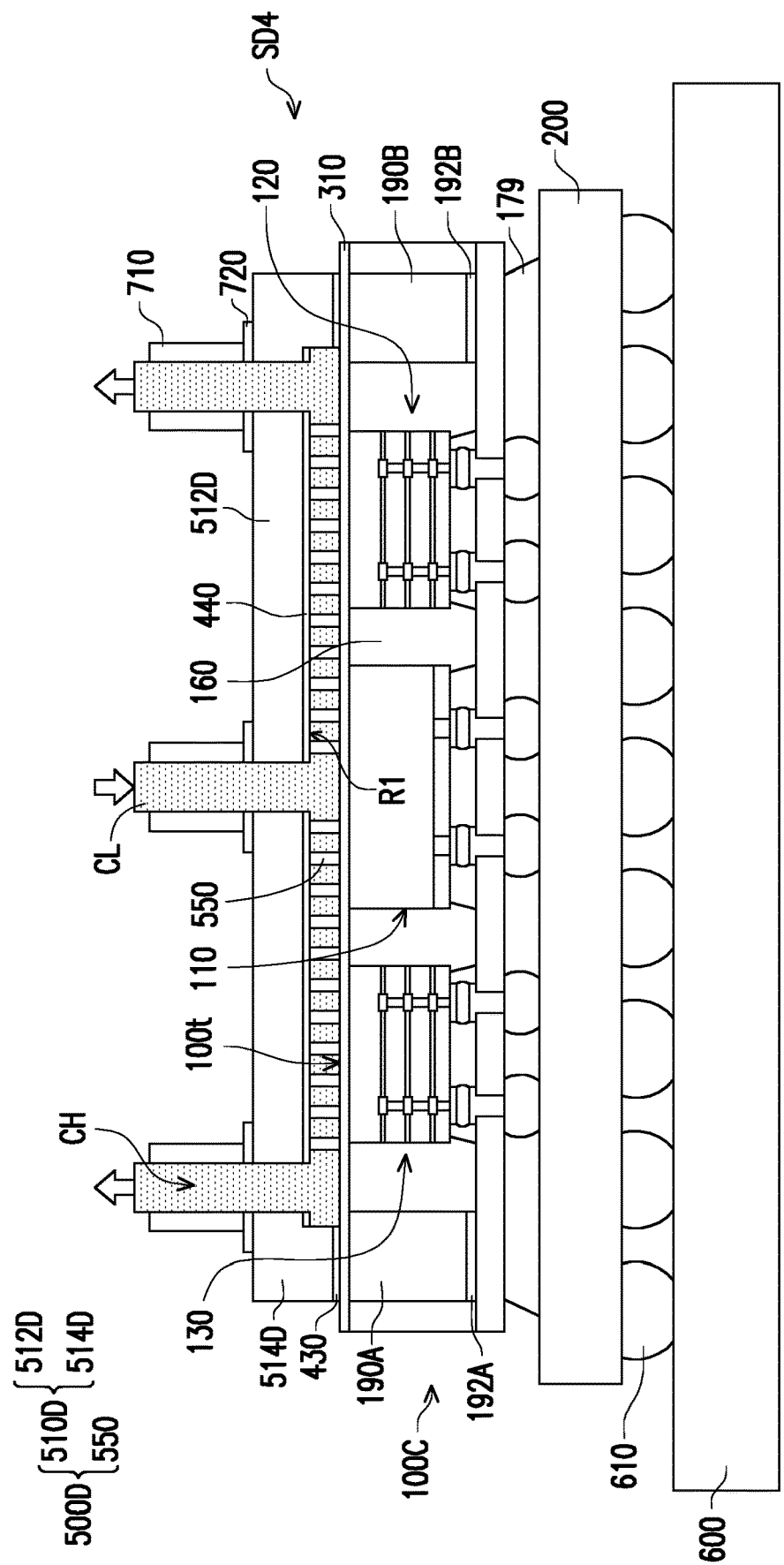
FIG. 6A and FIG. 6B are schematic cross-sectional views illustrating electronic devices according to some embodiments of the present disclosure.

FIG. 6A is a schematic cross-sectional view illustrating an electronic device according to some embodiment of the disclosure. In the electronic device of FIG. 6A, the semiconductor device SD4 is connected to a circuit substrate 600 and a fluid circulation system according to some embodiments of the disclosure. In some embodiments, as illustrated in FIG. 6A, the semiconductor package 100C may include different components than the semiconductor packages 100A, 100B discussed above. For example, the semiconductor package 100C may further include dummy dies 190A, 190B, optionally secured with bonding adhesives 192A, 192B. In some embodiments, the metallization layer 310 is optionally formed on the top surface 100t of the semiconductor package 100C, and does not extend beyond a perimeter of the top surface 100t.

According to some embodiments, in the semiconductor device SD4, the cover 510D of the heat dissipation system 500D includes the cap 512D and the flanges 514D. A structural difference between the semiconductor device SD4 and the semiconductor device SD1 of FIG. 1H is that the flanges 514D of the semiconductor device SD4 sit on the top surface 100t of the semiconductor package 100C, rather than sitting on the substrate 200. That is, the cover 510D is secured by a bonding material 430 disposed towards the periphery of the semiconductor package 100C. In some embodiments, the dummy dies 190A, 190B are disposed in at least some of the parts of the semiconductor package 100C where the flanges 514D land, to provide structural support.

In some embodiments, the cover 510D defines the circulation recess R1 together with the semiconductor package 100C. In some embodiments, no annular recess R2 is formed and no seal is disposed within the cover. In some embodiments, the bonding material 430 performs the two functions of securing the cover 510D to the semiconductor package 100C and sealing the circulation recess R1 as the seal, to prevent the coolant CL to infiltrate or spill over the substrate 200 or the circuit substrate 600. In some alternative embodiments, the annular recess R2 is formed, and the seal is disposed therein as discussed above for the previous embodiments.

In some embodiments, at least some of the inflow/outflow channels CH formed in the cover 510D reach the circulation recess R1 in correspondence of the encapsulant 160 rather than the semiconductor dies 110, 120, 130. For example, in the semiconductor device SD4 illustrated in FIG. 6A, the inflow channel CH is disposed over the semiconductor die 110, and two outflow channels CH are disposed over the portions of encapsulant 160 comprised between the semiconductor dies 120, 130 and the dummy dies 190A, 190B. However, the disclosure is not limited thereto. In some embodiments, the number of inflow/outflow channels CH may be adjusted based on design requirements.

In some embodiments, microstructures 550 are secured or grown over the cover 510D. In some embodiments, the microstructures 550 are pre-formed pillars that are secured to the cap 512D in correspondence of the circulation recess R1 via a bonding material 440. In some embodiments, the microstructures 550 includes carbon nanotubes grown on or attached to the metallization layer 310. In some embodiments, the carbon nanotubes may be grown on a growth substrate (not shown) and then transferred to the metallization layer 310. The growth substrate may include alumina and iron. In some embodiments, organic hydrocarbon gas (e.g., acetylene) may be used as a precursor for the growth of the carbon nanotubes. A height of the carbon nanotubes may be adjusted by regulating the growth time. In some embodiments, titanium and gold may be sputtered on the carbon nanotubes before transferring to the metallization layer 310. In some embodiments, the metallization layer 310 includes stacked metal layers to which the carbon nanotubes are transferred. In some embodiments, the metallization layer 310 may include stacked layers of titanium, gold and indium. The transfer may take place by pressing the growth substrate on the semiconductor package 100D with the carbon nanotubes oriented towards the metallization layer 310. In some embodiments, the transfer is conducted under heating and pressure. In some embodiments, the microstructures 550 include pillars, fins or combinations thereof. In some embodiments, the microstructures 550 may be coated with a thermally conductive material. In some embodiments, the coating material includes graphene. In some embodiments, the coating material includes metals such as copper or aluminum.

Figure 6B:
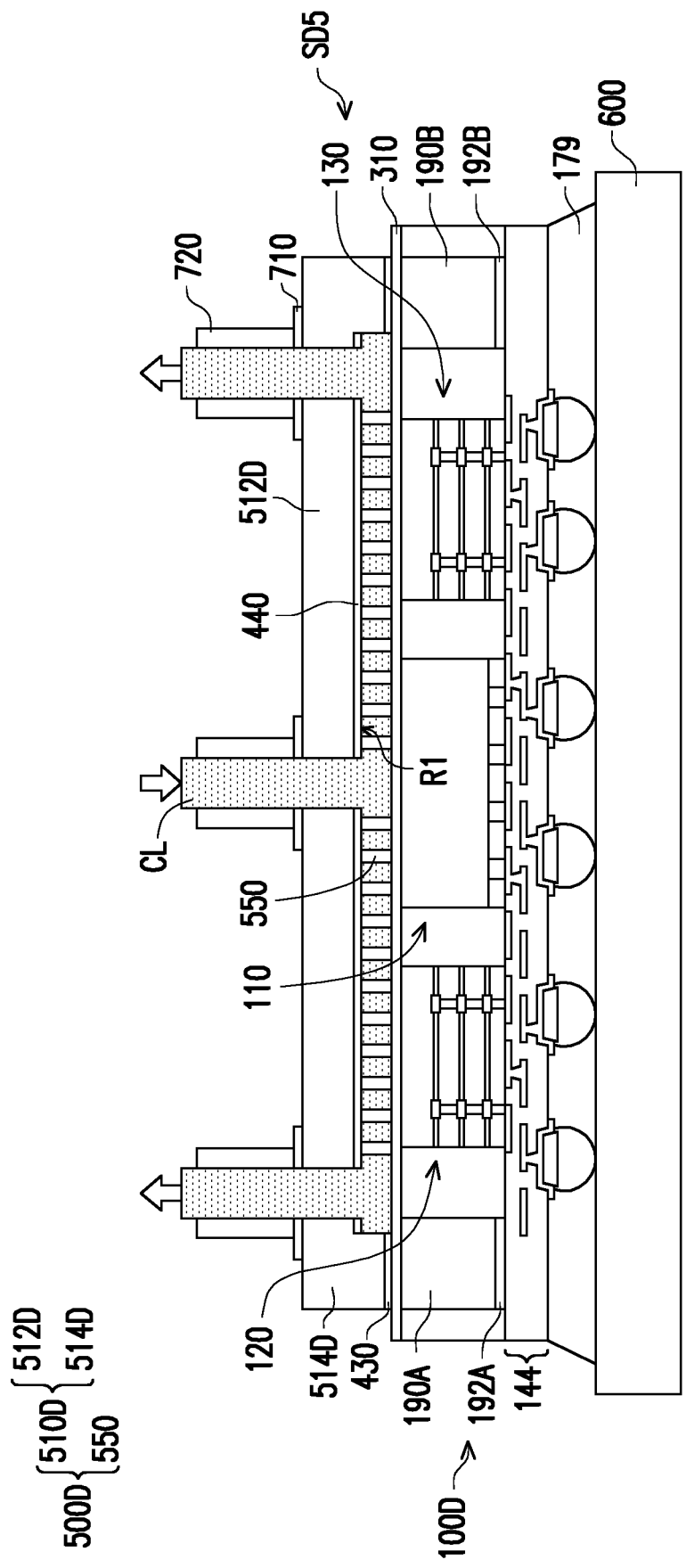

FIG. 6B is a schematic cross-sectional view illustrating an electronic device according to some embodiments of the disclosure. In the electronic device of FIG. 6B, the semiconductor device SD5 is connected to a circuit substrate 600 and a fluid circulation system according to some embodiments of the disclosure. The semiconductor device SD5 of FIG. 6B includes a different type of semiconductor package(s) when compared with the semiconductor device SD4 of FIG. 6A. In some embodiments, the semiconductor package 100D included in the semiconductor device SD5 may be an InFO package, while a CoWoS package may be included in the semiconductor package 100C of FIG. 6A. For example, the semiconductor package 100D may include a redistribution structure 144 for redistribution and/or interconnecting the dies. The redistribution structure 144 may include one or more conductive layers interspersed within one or more dielectric layers. In some embodiments, the redistribution structure 144 may be directly connected to the circuit substrate 600 (e.g., without the intermediate substrate 200). However, the disclosure is not limited thereto. In some alternative embodiments, the semiconductor package 100D may be connected to the circuit substrate 600 via an intermediate substrate (similar to the substrate 200 shown in FIG. 1I). Referring to FIG. 6B, in some embodiments, the flange portion 514D of the cover 510D rests on the semiconductor package 100D.

It is understood that the disclosure of the present application is not limited by the embodiments described herein. In some alternative embodiments, a footprint of the cover 510D may be larger than the footprint of the semiconductor package 100D, and the flange portion 514D may fall on the underlying circuit substrate 600 (or the intermediate substrate 200, if included). It will be apparent to people skilled in the art that the disclosure is not limited by the type of package used in the semiconductor devices. For all the semiconductor devices of the present disclosure, different packages (CoWoS, InFO, PoP, etc.) may be used, according to the production and design requirements.

FIG. 7A through FIG. 7G are schematic cross-sectional views illustrating intermediate structures formed at various stages of a manufacturing method of a semiconductor device SD6 (shown integrated in an electronic device in FIG. 7H) according to some embodiments of the present disclosure. A precursor (not shown) of the manufacturing intermediate shown in FIG. 7A may be obtained following a process similar to what previously described for the intermediate structure shown in FIG. 1C, optionally modified to include other components in the semiconductor package (for example, the dummy dies 190A, 190B and the die attaching film 192A, 192B). The manufacturing intermediate shown in FIG. 7A may be obtained from said precursor by protecting the connectors 170 in a protective layer PL, binding a second temporary carrier TC2 over the protective layer PL, overturning the reconstructed wafer RW, de-bonding the first temporary carrier TC (shown in FIG. 1C), and providing an auxiliary mask M3 on the surface of the reconstructed wafer RW exposed upon removal of the temporary carrier TC. The auxiliary mask M3 may be similar to the auxiliary masks M1 and M2 discussed above, and a detailed description thereof is omitted herein. In some embodiments, the auxiliary mask M3 includes openings O3 formed within the span of one of the semiconductor dies 1110, 1120, 1130 included in the reconstructed wafer RW. To more clearly illustrate certain aspects of the disclosure, in the present embodiment the semiconductor die 1110 includes a System on Chip (SoC) type of die, and the semiconductor dies 1120, 1130 are memory cubes. However, the disclosure is not limited by the type of dies used for the semiconductor dies 1110, 1120, 1130. The openings O3 may expose portions of the top surface 1110t of the semiconductor die 1110. The openings O3 may be patterned according to the type of microstructures 560 (shown in FIG. 7H) that are to be formed within the semiconductor die 1110. When the semiconductor dies 1120, 1130 are memory cubes, the auxiliary mask M3 may completely cover the corresponding top surfaces 1120t, 1130t.

Figure 7A:
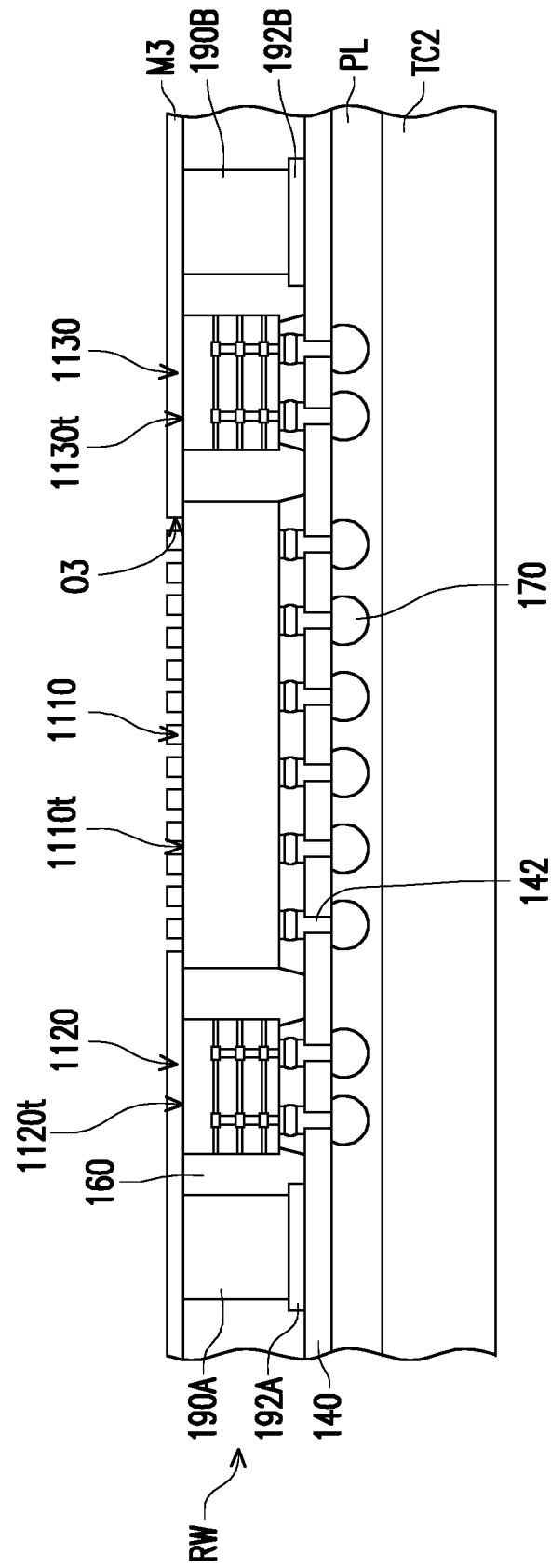
FIG. 7A through FIG. 7G are schematic cross-sectional views illustrating intermediate structures formed at various stages of a manufacturing method of a semiconductor device according to some embodiments of the present disclosure.
Figure 7B:
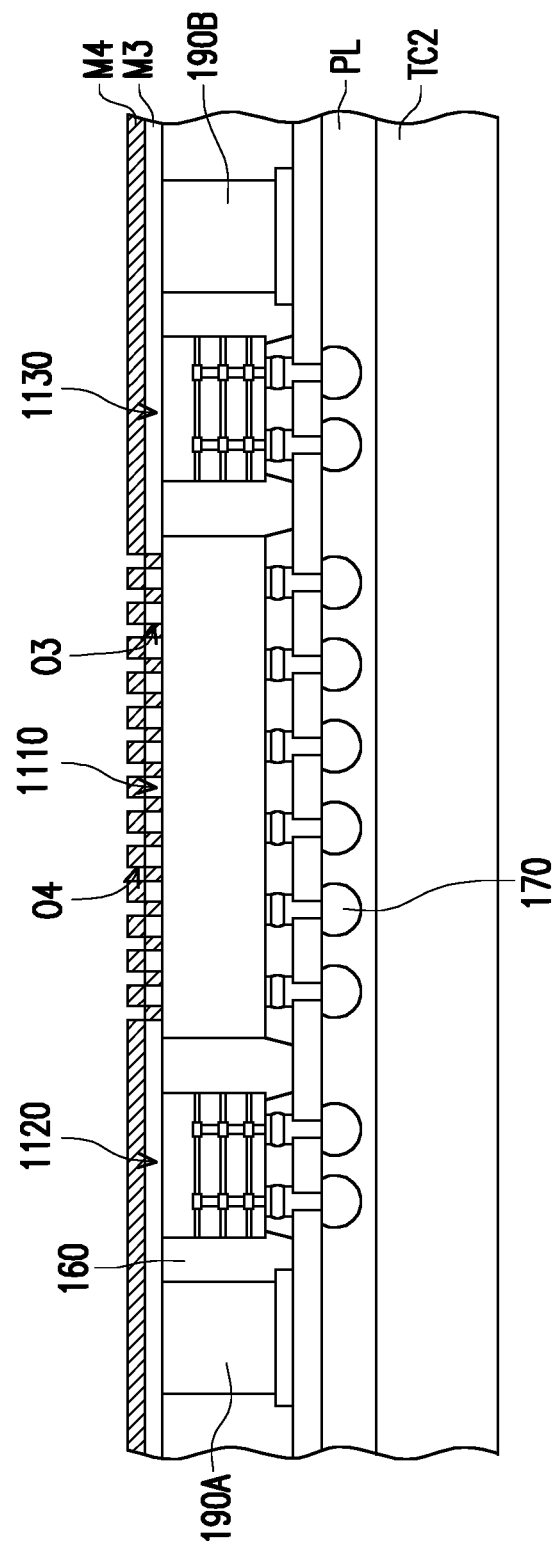

Referring to FIG. 7B, an auxiliary mask M4 may be provided on top of the third auxiliary mask M3. The range of possible materials for the auxiliary mask M4 is not particularly limited, provided that the auxiliary mask M4 can be selectively etched over the auxiliary mask M3 (unless a pre-fabricated rigid mask is used as auxiliary mask M4). In some embodiments, the auxiliary mask M4 may be conformally disposed over the auxiliary mask M3, filling the openings O3. Depending on the type of auxiliary mask M4 used, in some embodiments, the auxiliary mask M4 includes openings O4 aligned with the underlying openings O3. In some alternative embodiments, a profile of the auxiliary mask M4 is substantially flat throughout the reconstructed wafer RW.

Figure 7C:
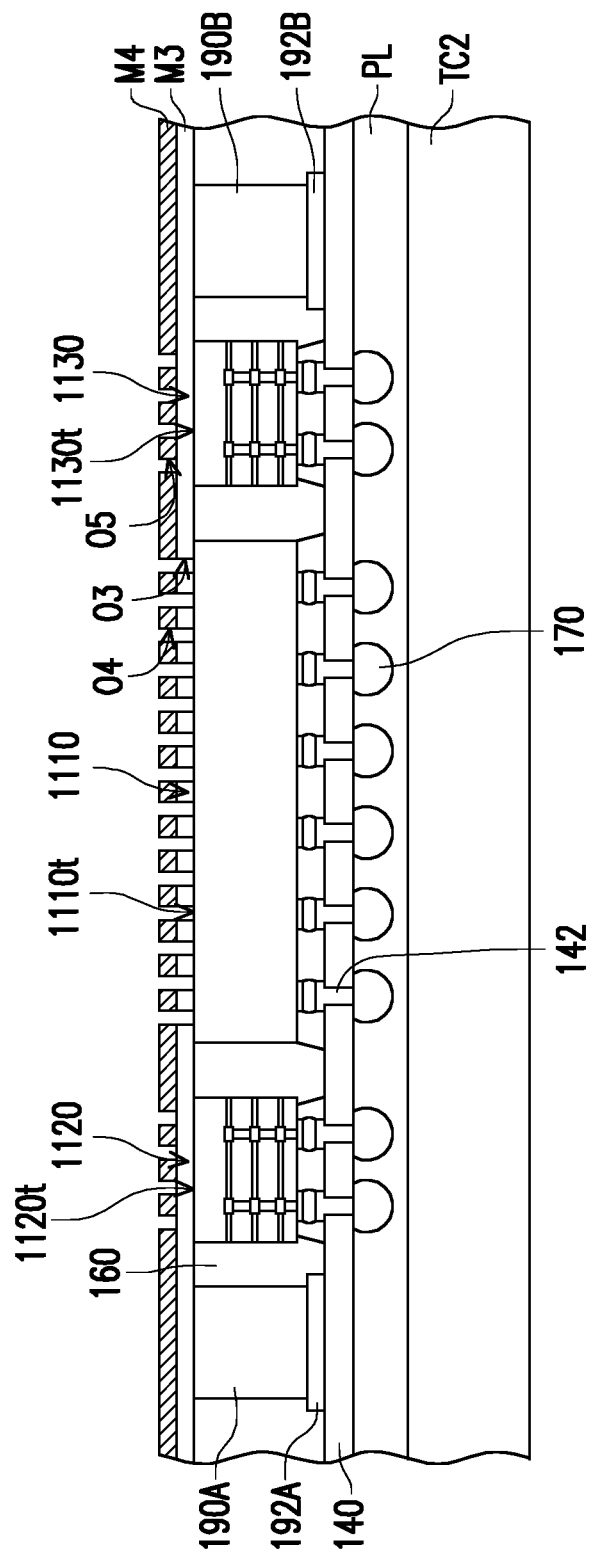
Figure 7D:
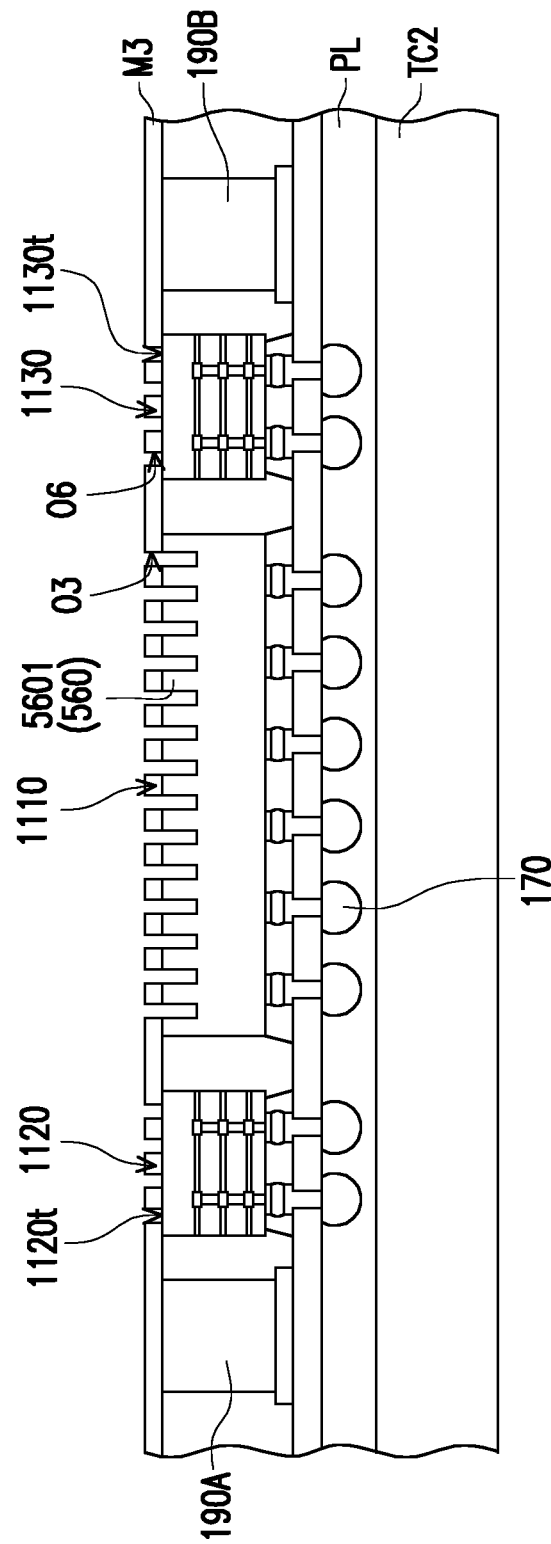
Figure 7E:
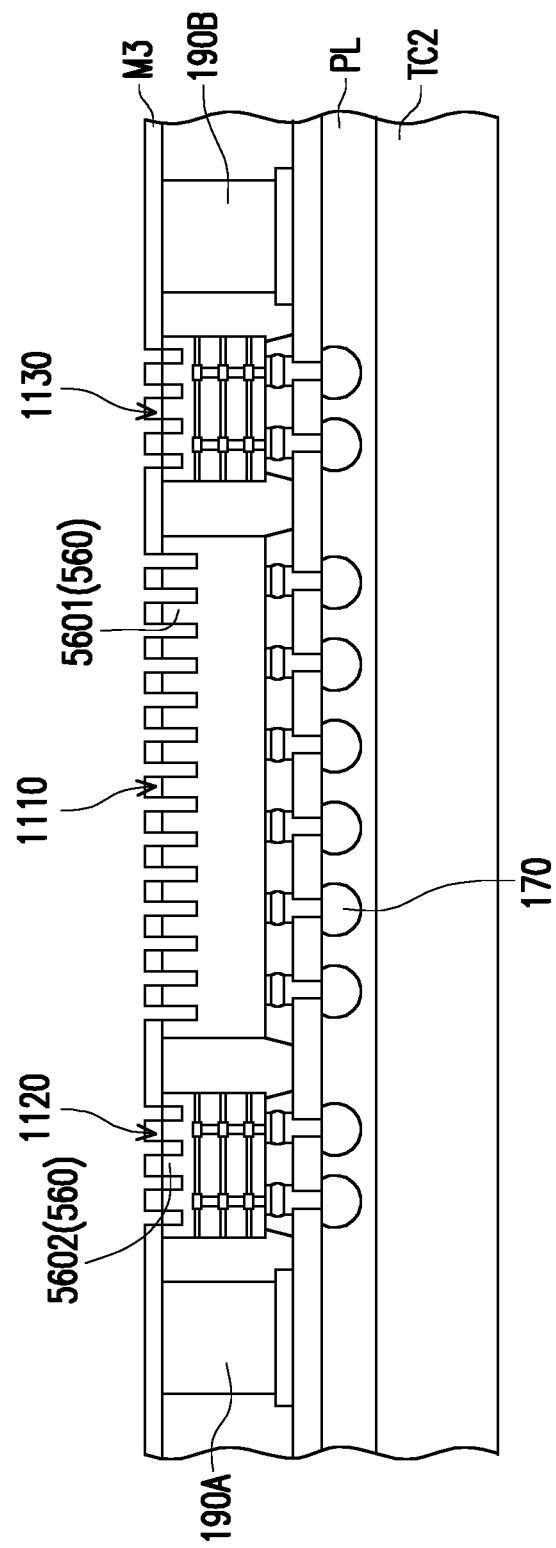

In some embodiments, as shown in FIG. 7C, the auxiliary mask M4 is patterned, so as to reveal the top surface 1110t of the semiconductor die 1110 through the aligned openings O3 and the openings O4. During the patterning step, openings O5 may be produced over the semiconductor dies 1120, 1130, exposing the underlying auxiliary mask M3. Referring to FIG. 7C and FIG. 7D simultaneously, a first etching step may be performed, during which portions of the semiconductor die 1110 are removed to form a first portion 5601 of the microstructures 560. A pattern of the first portion 5601 of the microstructures 560 may follow the pattern of the openings O3. In some embodiments, during the etching step the portions of the auxiliary mask M3 exposed by the openings O5 of the auxiliary mask M4 are removed to form openings O6 within the auxiliary mask M3. In some embodiments, the openings O6 expose the top surfaces 1120t, 1130t of the semiconductor dies 1120, 1130. As shown in FIG. 7D, the auxiliary mask M4 may be removed, thus exposing the auxiliary mask M3. Referring to FIG. 7E, in some embodiments, a second etching step may be performed. During the second etching step, material may be removed from the portions of the semiconductor dies 1110, 1120, 1130 exposed by the auxiliary mask M3. During the second etching step, the recesses previously formed in the semiconductor die 1110 defining the first portions 5601 of the microstructures 560 are further deepened. In some embodiments, a second portion 5602 of the microstructures 560 may be formed in the semiconductor dies 1120, 1130 during the second etching step. In some embodiments, the first portion 5601 of the microstructures 560 are produced during one more etching step than the second portion 5602 of the microstructures 560, resulting in a height difference between the microstructures 560 of the first portion 5601 and the second portion 5602. In some embodiments, the microstructures 560 formed in the semiconductor die 1110 are somewhat taller than the microstructures 560 formed in the semiconductor dies 1120, 1130. In some embodiments, the number of etching steps performed for each semiconductor die 1110, 1120 or 1130 is adjusted according to the thickness of the semiconductor die 1110, 1120 or 1130 and the desired height of the microstructures 560. For example, if the semiconductor die 1110, 1120 or 1130 includes stacked chips, as is the case in some memory cubes, the etching depth may be shallower than the etching depth attainable for other semiconductor systems (e.g., systems on chip).

Figure 7F:
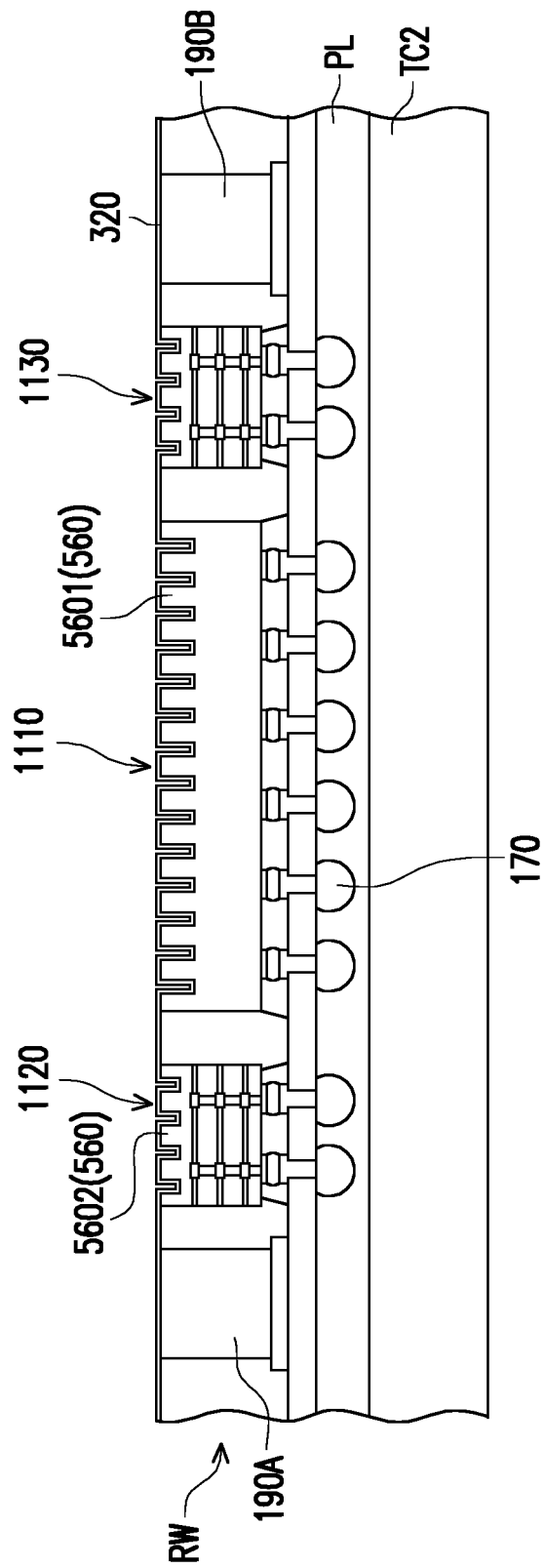
Figure 7G:
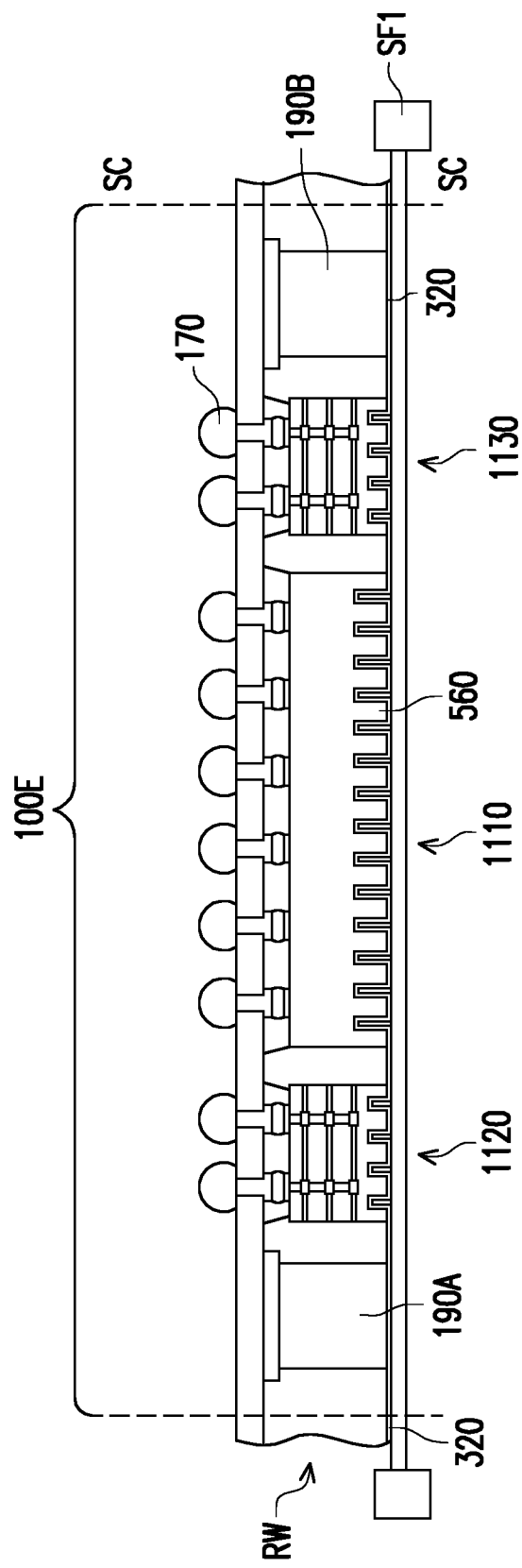

In some embodiments, as shown in FIG. 7F, the auxiliary mask M3 is removed, and the metallization layer 320 is conformally formed over the exposed surface of the reconstructed wafer RW. As shown in FIG. 7F, a profile of the metallization layer 320 over the semiconductor dies 1110, 1120, 1130 may be defined by the microstructures 560 formed in the semiconductor dies 1110, 1120, 1130. In some embodiments, the distance between adjacent microstructures 560 is such that the metallization layer 320 does not completely fill the interstices in between the microstructures 560. In some alternative embodiments, the metallization layer 320 may be omitted, and the microstructures 560 may be coated with a highly thermally conductive material (e.g., graphene). Referring to FIG. 7G, the reconstructed wafer RW may be overturned over a supporting frame SF1, the temporary carrier TC2 (shown in FIG. 7F) and the protective layer PL (shown in FIG. 7F) may be removed, and a singulation step may be performed along the scribe lines SC to form individual semiconductor packages 100E. Steps similar to the ones discussed previously for the semiconductor devices SD1 to SD5 may result in the semiconductor device SD6 shown in FIG. 7H. Namely, the semiconductor package 100E may be connected to a substrate 200 (shown in FIG. 7H) and a heat dissipation system 500E (shown in FIG. 7H) may be attached over the semiconductor package 100E.

Figure 7H:
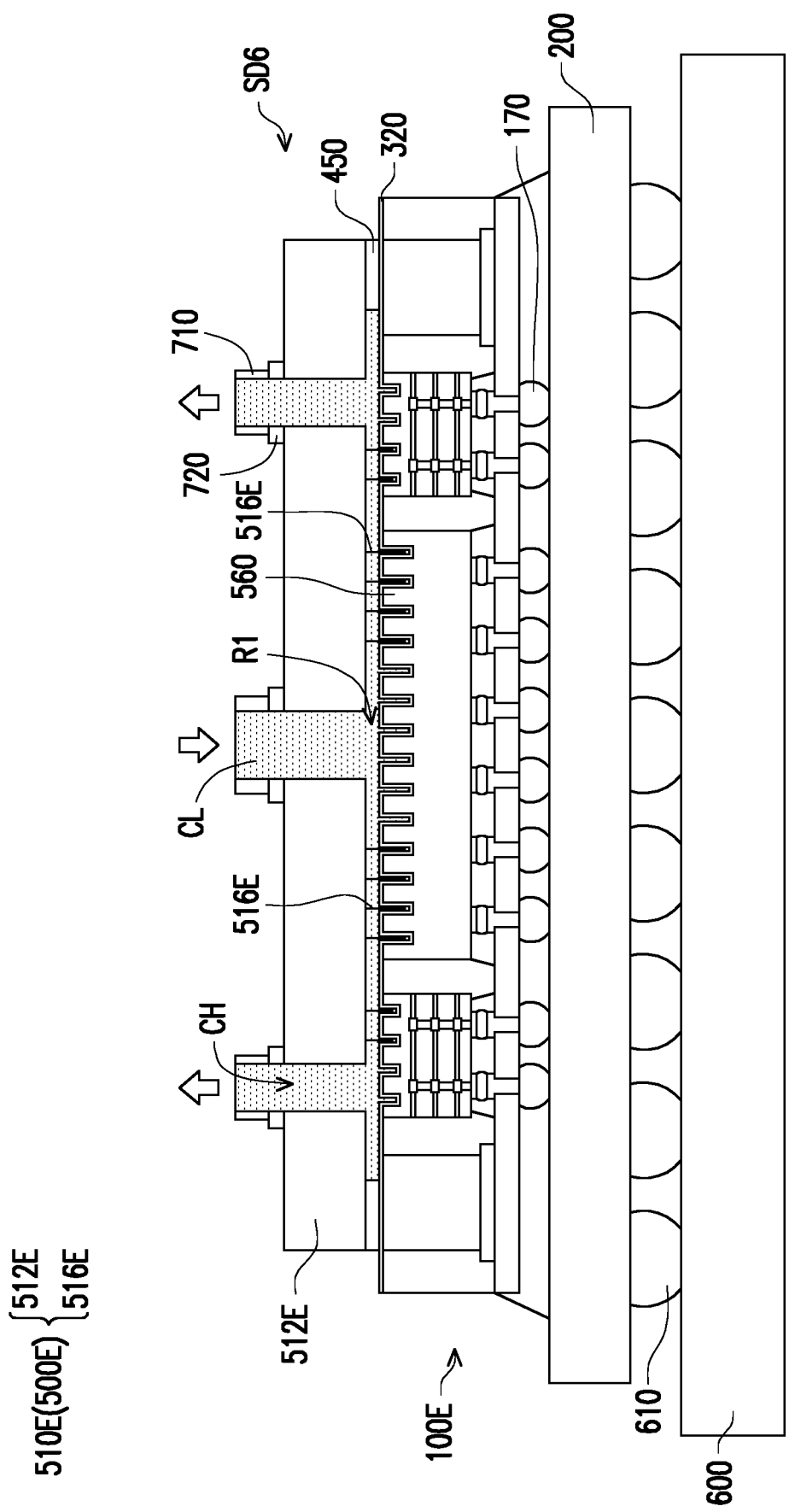
FIG. 7H is a schematic cross-sectional view illustrating an electronic device according to some embodiments of the present disclosure.

FIG. 7H is a schematic cross-sectional view illustrating a semiconductor device SD6 connected to a circuit substrate 600 and a fluid circulation system according to some embodiments of the disclosure. In the semiconductor device SD6, the cover 510E of the heat dissipation system 500E includes a cap 512E and microstructures 516E protruding from the cap 512E towards the semiconductor package 100E. In some embodiments, the cap 512E is directly secured on the semiconductor package 100E via a bonding material 450, and forms, together with the semiconductor package 100E, a circulation recess R1 into which the inflow and outflow channels CH of the cap 512E open. In some embodiments, the bonding material 430 performs the two functions of securing the cap 512E to the semiconductor package 100E and sealing the circulation recess R1 as the seal. In some embodiments, when the cover 510E is assembled over the semiconductor package 100E, the microstructures 516E of the cover 510E may be disposed within the interstices defined by the microstructures 560 of the semiconductor package 100E. In some embodiments, portions of the cover 510E and the underlying portions of the semiconductor package 100E may have almost complementary profiles, so that the respective microstructures 516E and 560 may produce interleaved patterns that articulate the flow of the coolant CL through the circulation recess R1.

FIG. 8A through FIG. 8D are schematic top views of portions of the circulation recess R1 of the semiconductor devices SD6 according to some embodiments of the disclosure, illustrating non-limiting examples of the flow of the coolant CL (shown in FIG. 7H) through the circulation recess R1. The views of the FIG. 8A through FIG. 8D may correspond to portions of the circulation recess R1 formed over any one of the semiconductor dies 1110, 1120, and 1130. Only for convenience of illustration, in FIG. 8A through FIG. 8D it is assumed that the coolant proceeds from the right side of the drawing towards the left end of the drawing (along the direction x1).

Figure 8A:
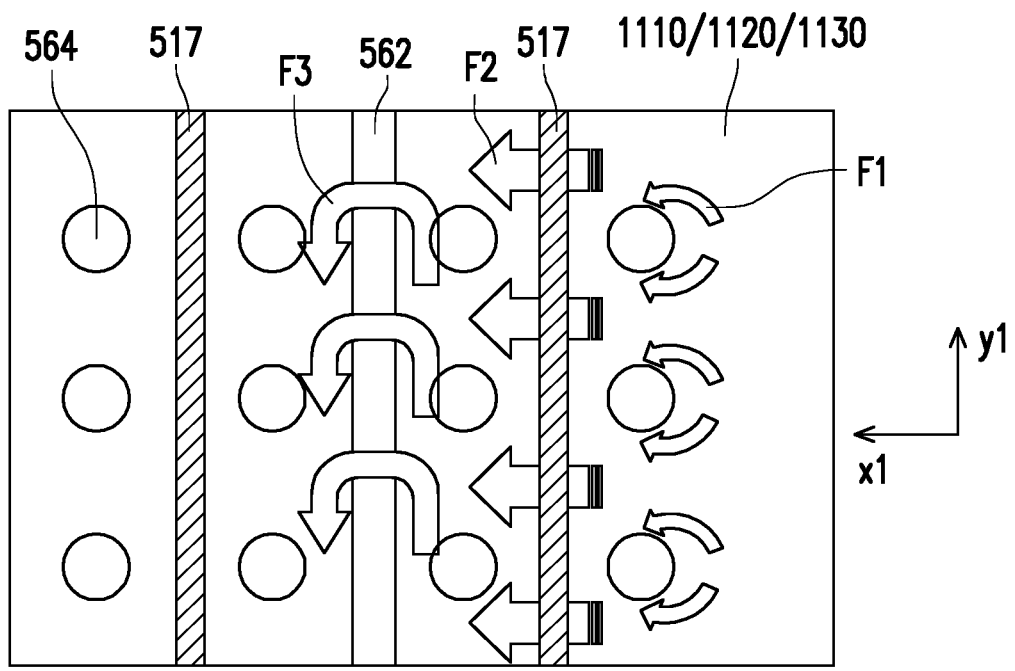
FIG. 8A through FIG. 8D are schematic top views of portions of semiconductor devices according to some embodiments of the present disclosure.

Referring to FIG. 7H and FIG. 8A, in some embodiments fins 562 and pillars 564 are formed on the semiconductor dies 1110, 1120, or 1130 as microstructures 560, and fins 517 are present as microstructures 516E on the cover 510E. In some embodiments, the pillars 564 are aligned in columns. In some embodiments, the pillars are further aligned along rows (in a direction perpendicular to the columns). In some embodiments, the fins 562 reach only up to a certain height of the circulation recess R1 but do not make contact with the cap 512E. In some embodiments, the fins 562 extend continuously within the circulation recess R1 along a given direction, forming micro-chambers (not shown) within the circulation recess R1 that are in fluid communication through the space on top of the fins 562. In some embodiments, the fins 562 extend parallel to each other along a second direction y1 tilted with respect to the direction of the incident flow of the coolant CL. In some embodiments, the direction y1 is perpendicular to the direction x1. Similarly, in some embodiments, the fins 517 protrude towards the semiconductor package 100E without making contact with the semiconductor package 100E. In some embodiments, the fins 517 may extend parallel to the fins 562 along the direction y1. In some embodiments, an extending direction of the fins 517 is tilted with respect to an extending direction of the fins 562.

In some embodiments, as shown in FIG. 8A, a fin 517 of the cover 510E extending along the direction y1 may be disposed in between a first column of pillars 564 and an adjacent second column of pillars 564, and a fin 562 of the semiconductor package 100E may be further interposed between the second column of pillars 564 and a subsequent third column of pillars 564. That is, the fins 562 of the semiconductor package 100E and the fins 517 of the cover 510E may be alternately disposed in between consecutive columns of pillars 564 of the semiconductor package 100E. When the circulation recess is structured in such a manner, the flow of the coolant CL may be deviated by the columns of pillars 564 (arrows F1 in FIG. 8A) and forced to pass below the fins 517 (arrows F2 in FIG. 8A) and above the fins 562 (arrows F3 in FIG. 8A).

Figure 8B:
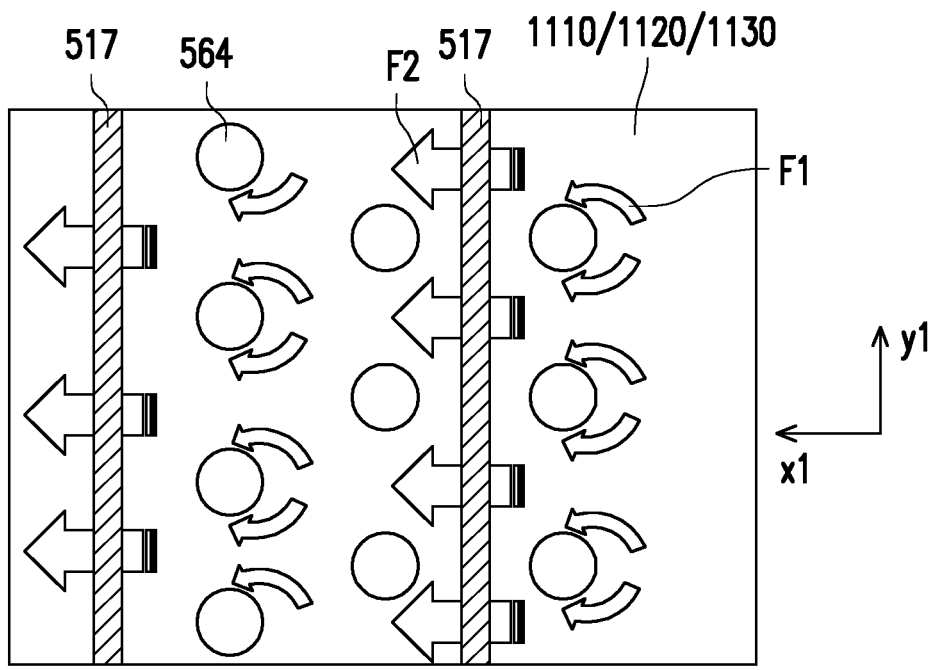
Figure 8C:
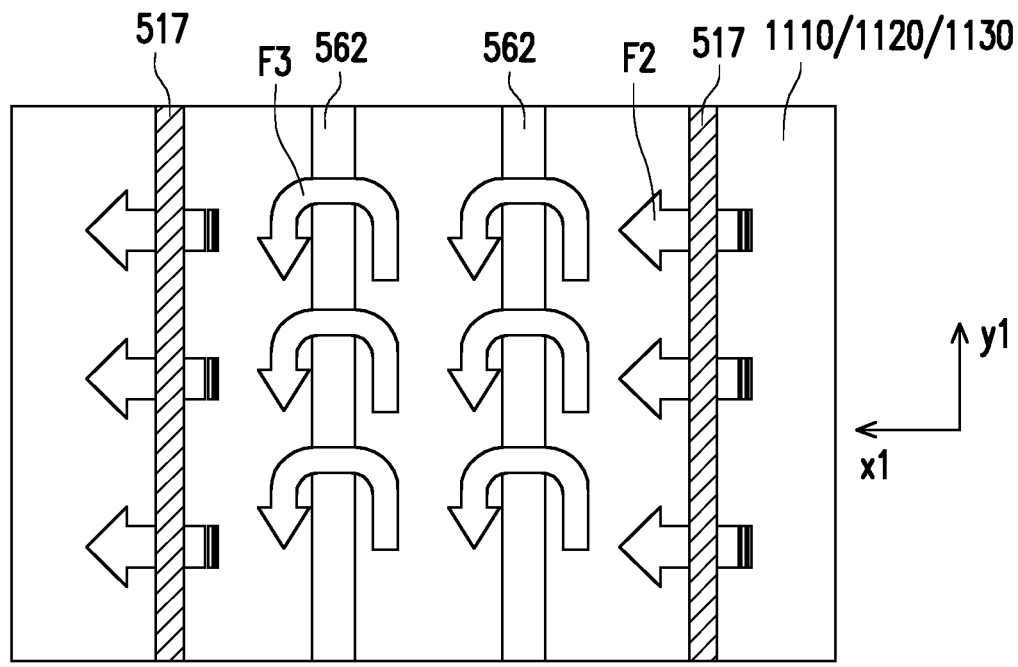
Figure 8D:
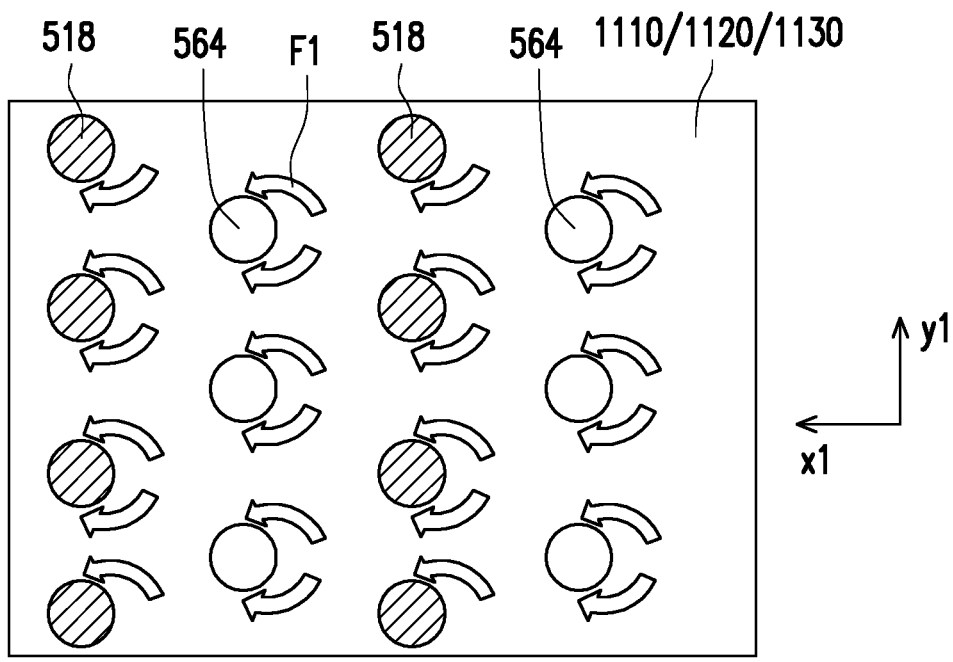

In some embodiments, as shown in FIG. 8B, pillars 564 but no fins 562 (shown in FIG. 8A) are formed on the semiconductor package 100E. In some embodiments, as shown in FIG. 8C, fins 562 but no pillars 564 (shown in FIG. 8A) are formed on the semiconductor package 100E. In some embodiments, multiple columns of pillars 564 of the semiconductor package 100E are disposed in between adjacent fins 517 of the cover 510E. In some embodiments, the number of columns of pillars 564 disposed in between adjacent fins 517 varies throughout the circulation recess R1. In some embodiments, fins 517 of the cover 510E are disposed in between adjacent fins 562 of the semiconductor package 100E. In some alternative embodiments, as shown in FIG. 8C, multiple fins 562 of the semiconductor package 100E are disposed in between adjacent fins 517 of the cover 510E. In some embodiments (not shown), multiple fins 517 of the cover 510E are disposed in between adjacent fins 562 of the semiconductor package 100E. In some embodiments, the fins 517 and 562 are parallel fins extending transversely with respect to the flowing direction x1. In some embodiments, as shown in FIG. 8D, only pillars 518 and 564 are formed on the cover 510E and the semiconductor package 100E, respectively, but no fins. In some embodiments, the pillars 564 and the pillars 518 are aligned along columns extending in the direction y1, with columns of pillars 564 alternating with columns of pillars 518.

Figure 9A:
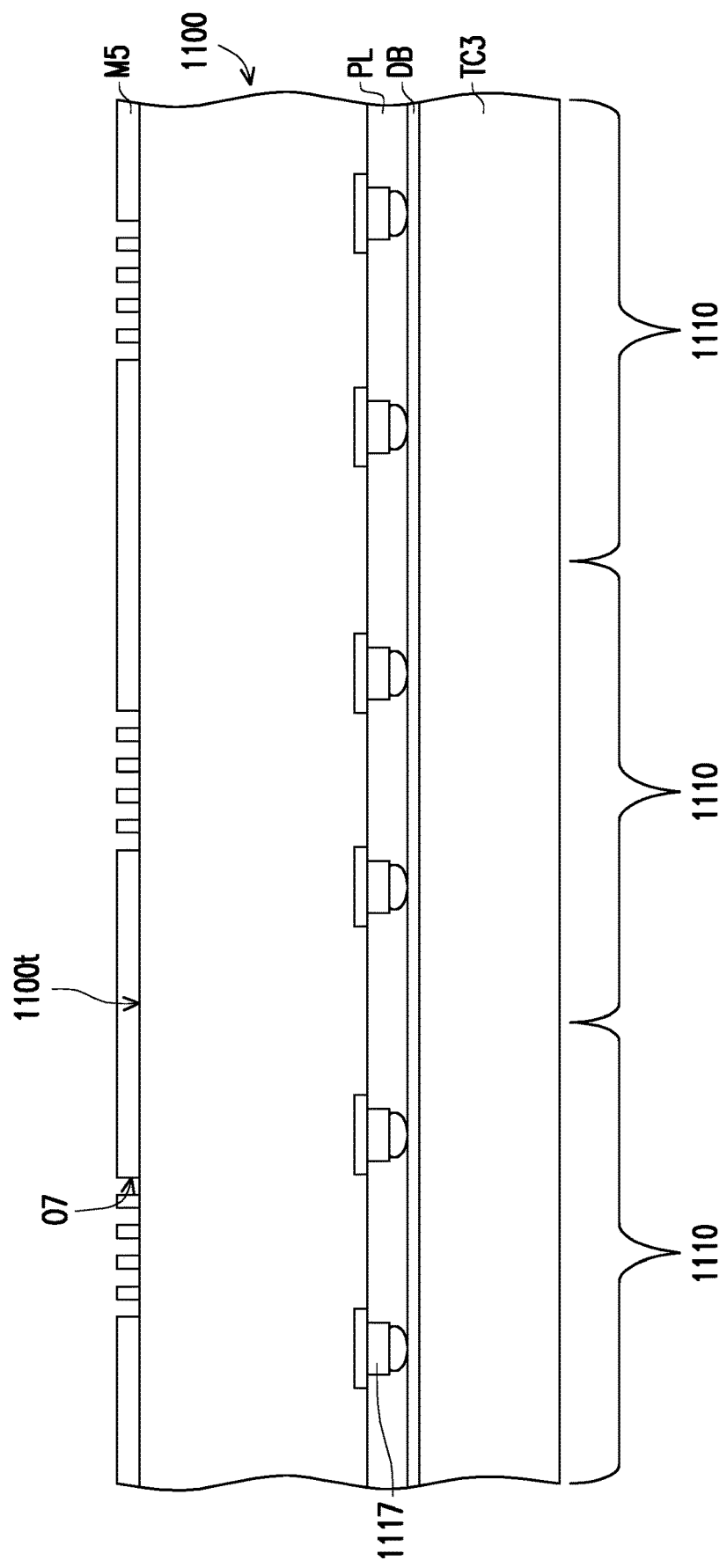
FIG. 9A through FIG. 9D are schematic cross-sectional views illustrating intermediate structures formed at various stages of a manufacturing method of a semiconductor device according to some embodiments of the present disclosure.
Figure 9B:
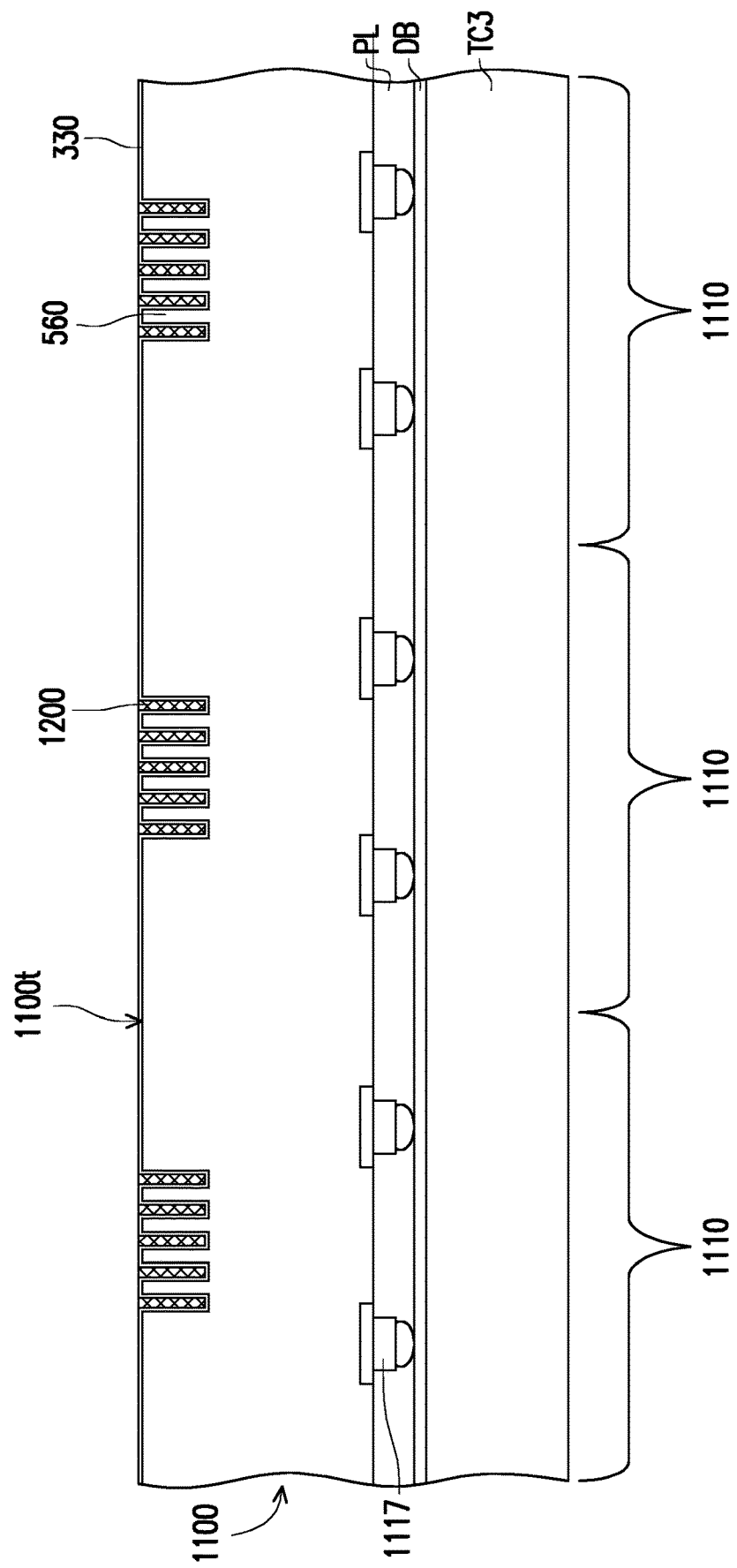
Figure 9C:
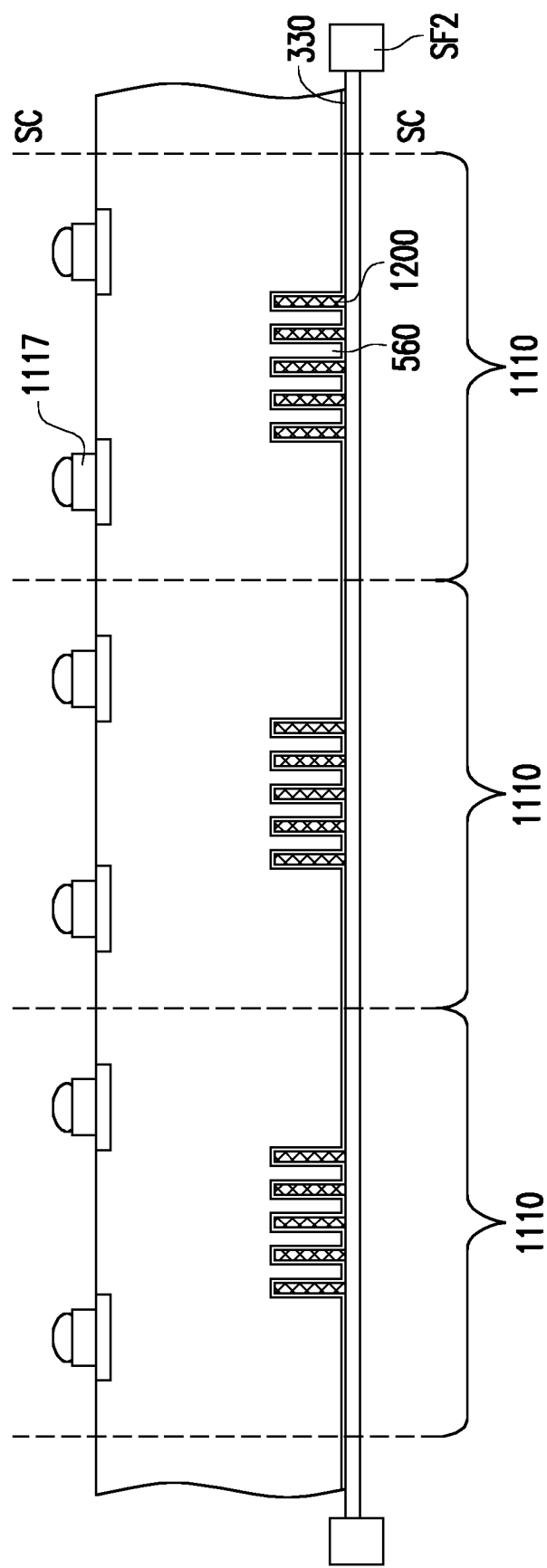
Figure 9D:
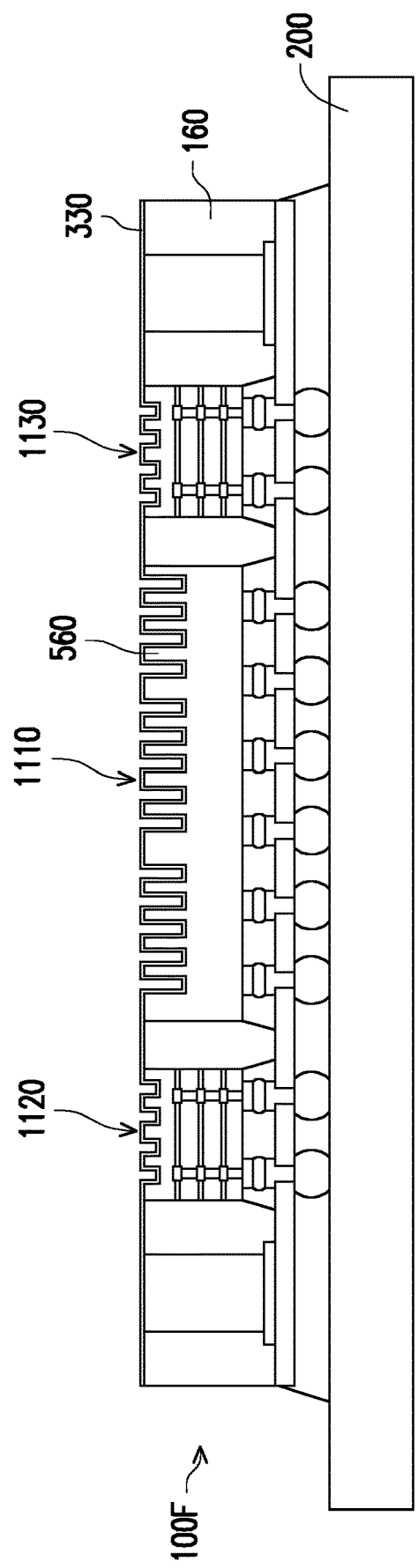

FIG. 9A through FIG. 9D are schematic cross-sectional views illustrating intermediate structures formed at various stages of a manufacturing method of a semiconductor device SD7 (shown integrated in an electronic device in FIG. 9E) according to some embodiments of the present disclosure. In some embodiments, referring to FIG. 9A, a semiconductor wafer 1100 is provided having multiple semiconductor dies 1110 formed therein. The semiconductor dies 1110 may include active or passive components, and may be produced within the semiconductor wafer 1100 according to known die manufacturing techniques. In some embodiments, the connectors 1117 of the semiconductor dies 1110 may be embedded in a protective layer PL, and the semiconductor wafer 1100 may be disposed on a temporary carrier TC3. Optionally, a de-bonding layer DB may be disposed between the temporary carrier TC3 and the protective layer. An auxiliary mask M5 may be formed on a top surface 1100t of the semiconductor wafer 1100 exposed by the temporary carrier TC3. The auxiliary mask M5 may include a plurality of openings O7 that expose portions of the top surface 1100t for each semiconductor die 1110. Referring to FIG. 9A and FIG. 9B, in some embodiments, an etching step is performed to form the microstructures 560 according to the pattern of the openings O7 of the auxiliary mask M5. In some embodiments, if the microstructures 560 includes fins, microtrenches are formed in between adjacent fins. In some embodiments, the auxiliary mask M5 is removed, and a metallization layer 330 is formed over the top surface 1100t of the semiconductor wafer 1100. In some embodiments, a filling material 1200 is disposed to fill the interstices of the microstructures 560. In some embodiments, the filling material 1200 protects or stabilizes the microstructures 560 during subsequent steps of the process. Referring to FIG. 9C, the semiconductor wafer 1100 may be overturned on a support frame SF2, and a singulation step may be performed to produce individual semiconductor dies 1100. In some embodiments, the semiconductor dies 1120 and 1130 including the microstructures 560 are produced following a similar process to the one just described for the semiconductor die 1110, and a detailed description thereof is omitted for the sake of brevity. In some embodiments, semiconductor dies 1110, 1120, 1130 having microstructures 560 formed on the corresponding upper surfaces are used to produce a semiconductor package 100F (shown in FIG. 9D). In some embodiments, the semiconductor package 100F is formed following similar steps to the ones previously discussed with reference to FIG. 1A to FIG. 1D. In some embodiments, if a planarization step is performed to form the encapsulant 160 (shown in FIG. 1B), portions of the semiconductor dies 1110, 1120, 1130 are removed. However, in such cases the planarization step is performed so as to still preserve a morphology of the microstructures 560 formed on the semiconductor dies 1110, 1120, 1130 (e.g., to maintain a certain height difference between the pillars 564 and the fins 562 shown in FIG. 11B). In some embodiments, the semiconductor package 100F is bonded to the semiconductor substrate 200 (shown in FIG. 9D), and, following process steps similar to what was previously discussed for the semiconductor devices SD1 to SD6, a semiconductor device SD7 (shown in FIG. 9E) is formed.

Figure 9E:
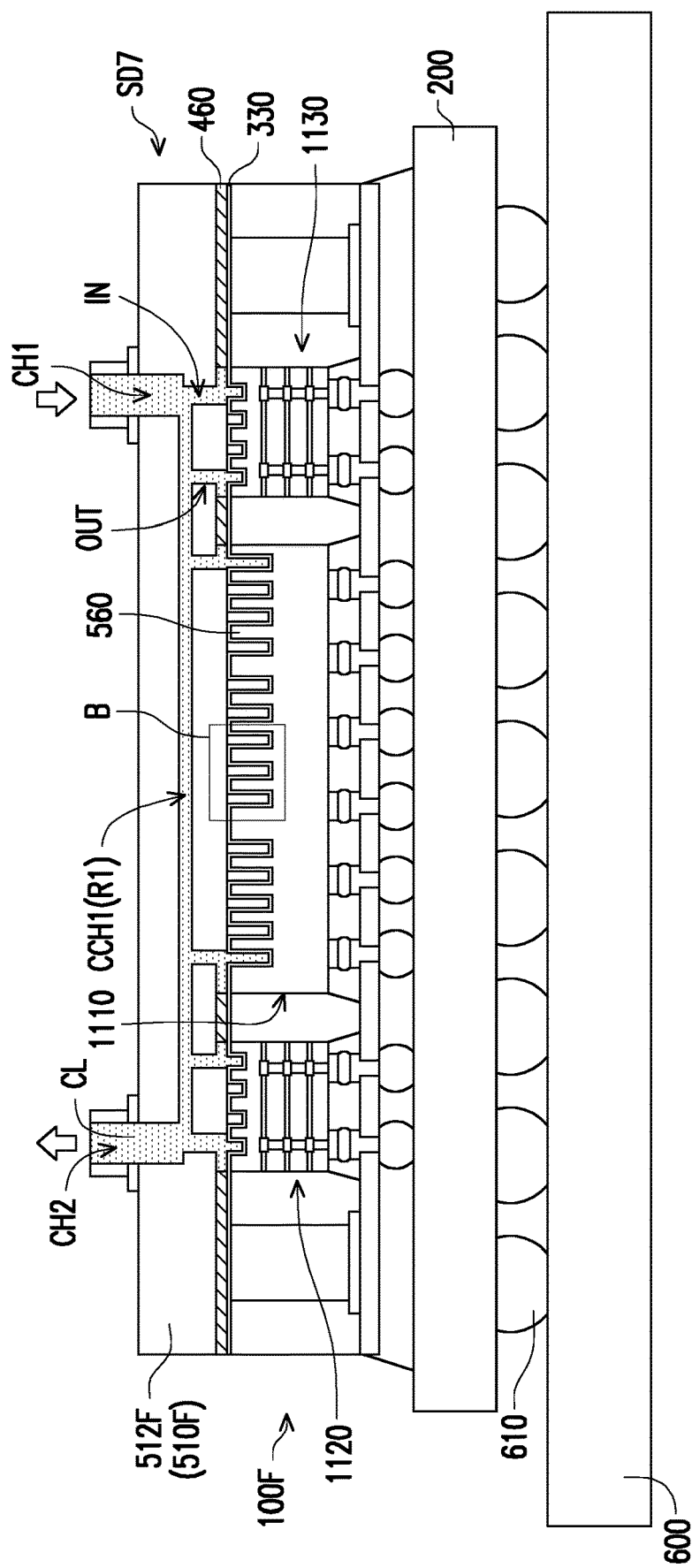
FIG. 9E is a schematic cross-sectional view of an electronic device according to some embodiments of the present disclosure.
Figure 10:
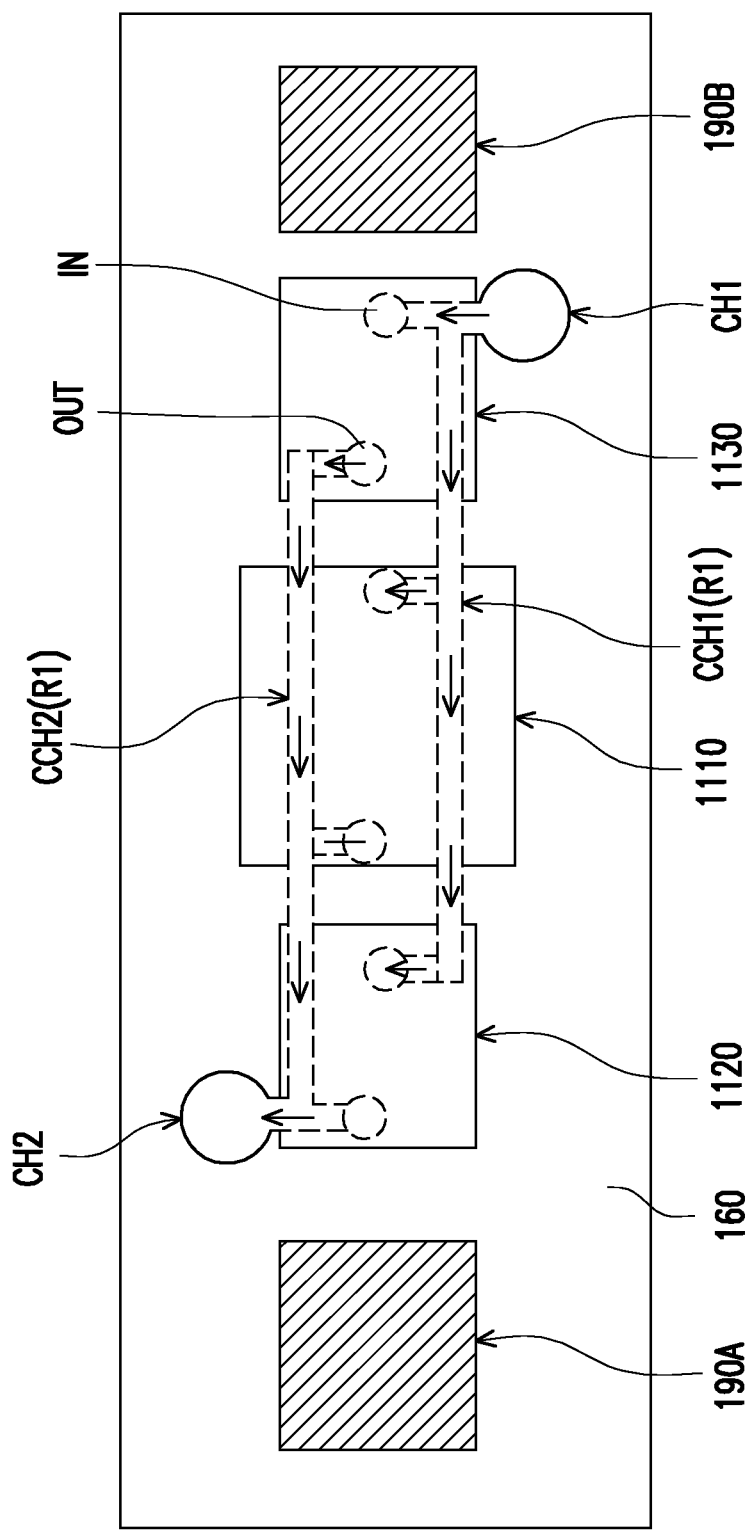
FIG. 10 is a schematic top view of a semiconductor device according to some embodiments of the present disclosure.
Figure 11A:
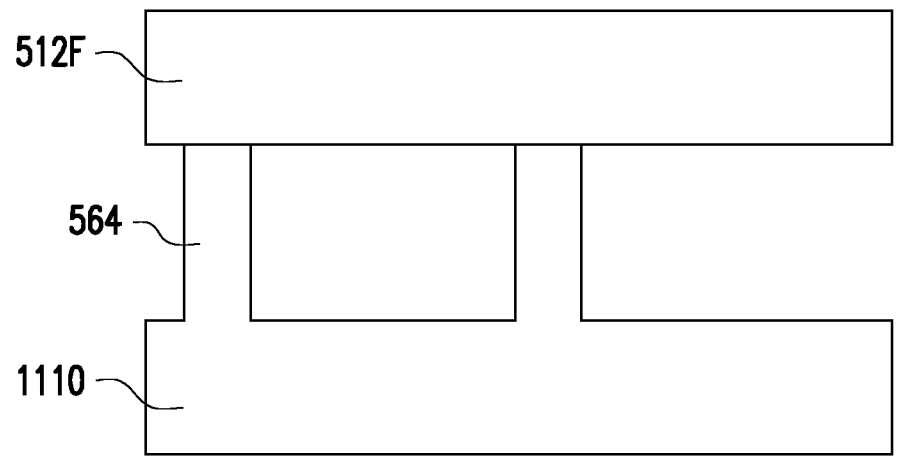
FIG. 11A and FIG. 11B are schematic cross-sectional views of portions of semiconductor devices according to some embodiments of the present disclosure.
Figure 11B:
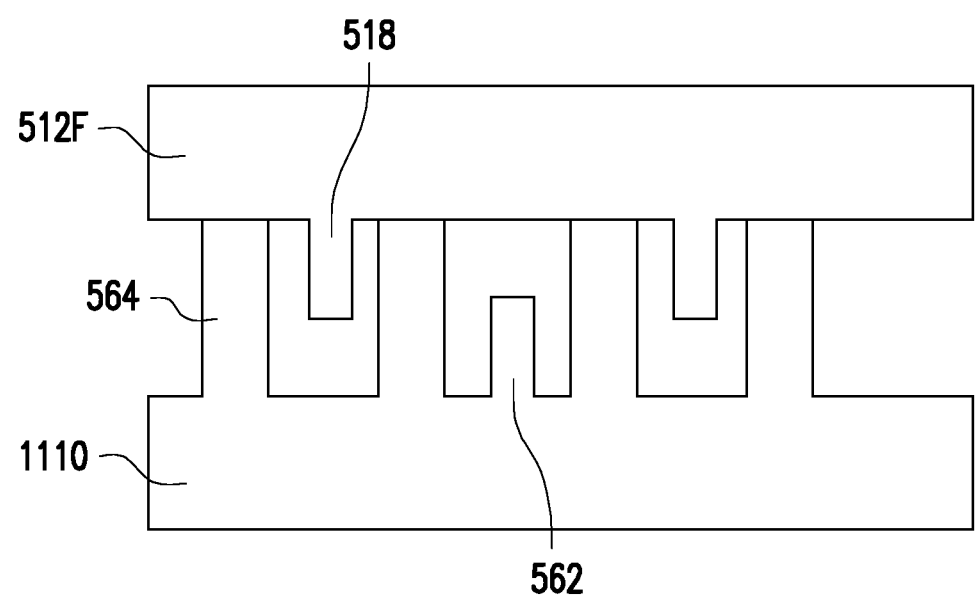

FIG. 9E is a schematic cross-sectional view illustrating an electronic device according to some embodiments of the disclosure. In the electronic device of FIG. 9E, the semiconductor device SD7 is connected to a circuit substrate 600 and a fluid circulation system according to some embodiments of the disclosure. FIG. 10 is a schematic top view of the semiconductor device SD7 according to some embodiments of the disclosure. FIG. 11A and FIG. 11B are schematic cross-sectional views of portions of a semiconductor device SD7 corresponding to the area B of FIG. 9E according to some embodiments of the disclosure. Referring simultaneously to FIG. 9E, FIG. 10 and FIG. 11A, in some embodiments, the cover 510F includes the cap 512F disposed over the semiconductor package 100F. In some embodiments, the cap 512F is directly secured on the semiconductor package 100F via a bonding material 460 and forms, together with the semiconductor package 100E, a circulation recess R1 including a system of circulation channels CCH1, CCH2. In some embodiments, the bonding material 460 is disposed between the outer edge of the cover 510F and the outer edge of the semiconductor package 100F. In some embodiments, the bonding material 460 is also disposed at a few points within the circulation recess R1 in which the cover 510F contacts the semiconductor package 100F in between the semiconductor dies 1110, 1120, 1130. In some embodiments, portions of the cap 512F within the circulation recess R1 directly contact the semiconductor packages 1110, 1120, 1130 or the metallization layer 330 formed thereon. Those portions of the cap 512F may contact the microstructures 560 formed in the semiconductor dies 1110, 1120, 1130, resulting in circulation chambers (portions of which are shown in FIG. 11A and FIG. 11B) on the upper surface of each semiconductor die 1110, 1120, 1130. In some embodiments, each circulation chamber extends over a single semiconductor die 1110, 1120, 1130, and has one inlet IN and one outlet OUT formed by the circulation channels CCH1 and CCH2. Each circulation chamber may be delimited by the upper surface of the underlying semiconductor die 1110, 1120, 1130 (acting as floor and walls of the chamber) and a portion of the cover 510F (acting as a roof) lying over the microstructures 560. The microstructures 560 are disposed within the circulation chamber to articulate the flow of the coolant CL on top of the semiconductor dies 1110, 1120, 1130.

In some embodiments, the cover 510F includes circulation channels CCH1, CCH2, each one of which is connected with the inflow channel CH1 or the outflow channel CH2 from which the coolant CL enters and leave the semiconductor device SD7. In some embodiments, a single circulation channel CCH1 or CCH2 is connected with only one inflow channel CH1 or outflow channel CH2. In some alternative embodiments, multiple inflow channels CH1 converge within the same inflow circulation channel CCH1. In some embodiments, the outflow circulation channel CCH2 may branch out towards multiple outflow channels CH2. In some embodiments, the circulation channels CCH1, CCH2 run in a parallel fashion through the cover 512F over the semiconductor dies 1110, 1120, 1130, in a direction substantially perpendicular with respect to the inflow channel CH1 and outflow channel CH2. In some embodiments, as shown in FIG. 10, the inflow circulation channel CCH1 presents branching points in correspondence of each semiconductor die 1110, 1120, 1130. Each branching point of the inflow circulation channel CCH1 may form one of the inlets IN through which the coolant CL enters one of the circulation chambers of the semiconductor dies 1110, 1120, 1130. Similarly, the outflow circulation channel CCH2 may present branching points in correspondence of each semiconductor die 1110, 1120, 1130, and these branching points may act as one of the outlets OUT through which the coolant CL leaves one of the circulation chambers of the semiconductor dies 1110, 1120, 1130. In some embodiments, the inlets IN, the outlets OUT and the circulation chambers are structured in such a way that the coolant CL contacts most of the upper surface of a semiconductor die 1110, 1120, or 1130. In some embodiments, as shown in FIG. 10, a given amount of coolant CL flows only within one of the circulation chambers. For example, referring to FIG. 10, the circulation recess R1 within the cover 510F may be designed in such a way that the coolant CL that leaves the circulation chamber on the semiconductor die 1130 may flow out of the outflow channel CH2 without entering other circulation chambers (e.g., the ones on top of semiconductor dies 1110, or 1120). In the embodiments shown in FIG. 10, only one circulation chamber is formed over each semiconductor die 1110, 1120, 1130, but the disclosure is not limited thereto. In some embodiments, the cover 510F and the microstructures 560 may be designed so that multiple circulation chambers are formed over the same semiconductor die 1110, 1120, 1130. In some embodiments, the inflow channel CH1, the inflow circulation channel CCH1 and the inlets IN are vertically aligned, rather than distributed as shown in FIG. 10.

It should be noted the cross-sectional view of FIG. 9E shows features of the cover 510F that would not be observable along a single cross-section of the structure shown in FIG. 10. For example, the inflow channel CH1, the outflow channel CH2, the inflow circulation channel CH1, the inlets IN and the outlets OUT would not appear in a single cross-section of the structure shown in FIG. 10. These elements are simultaneously shown in FIG. 9E to provide a general idea of different structural aspects of the cover 510F, rather than faithfully present the fluid circulation in the semiconductor device SD7.

FIG. 11A and FIG. 11B show cross-sectional views of a portion of a circulation chamber formed over the semiconductor device 1110 according to some embodiments of the disclosure. In the embodiments illustrated in FIG. 11A, only pillars 564 are formed as microstructures 560 on the semiconductor die 1110, extending until physically contacting the cover 512F. In the embodiments illustrated in FIG. 11B, pillars 564 and fins 562 are formed on the semiconductor die 1100, and pillars 518 are formed on the cover 512F. In one embodiment, the pillars 564 and fins 562 are patterned from the semiconductor die 1100 and are made of the same semiconductor material of the semiconductor die 1100. In some embodiments, the pillars 564 may be taller and contact the cover 512F, whilst the fins 562 may be shorter (in the thickness direction) than the pillars 564, thus allowing the coolant CL (shown in FIG. 9E) to flow above. Similarly, the pillars 518 formed on the cover may not reach the semiconductor die 1110, thus allowing the coolant CL to flow below.

Figure 12A:
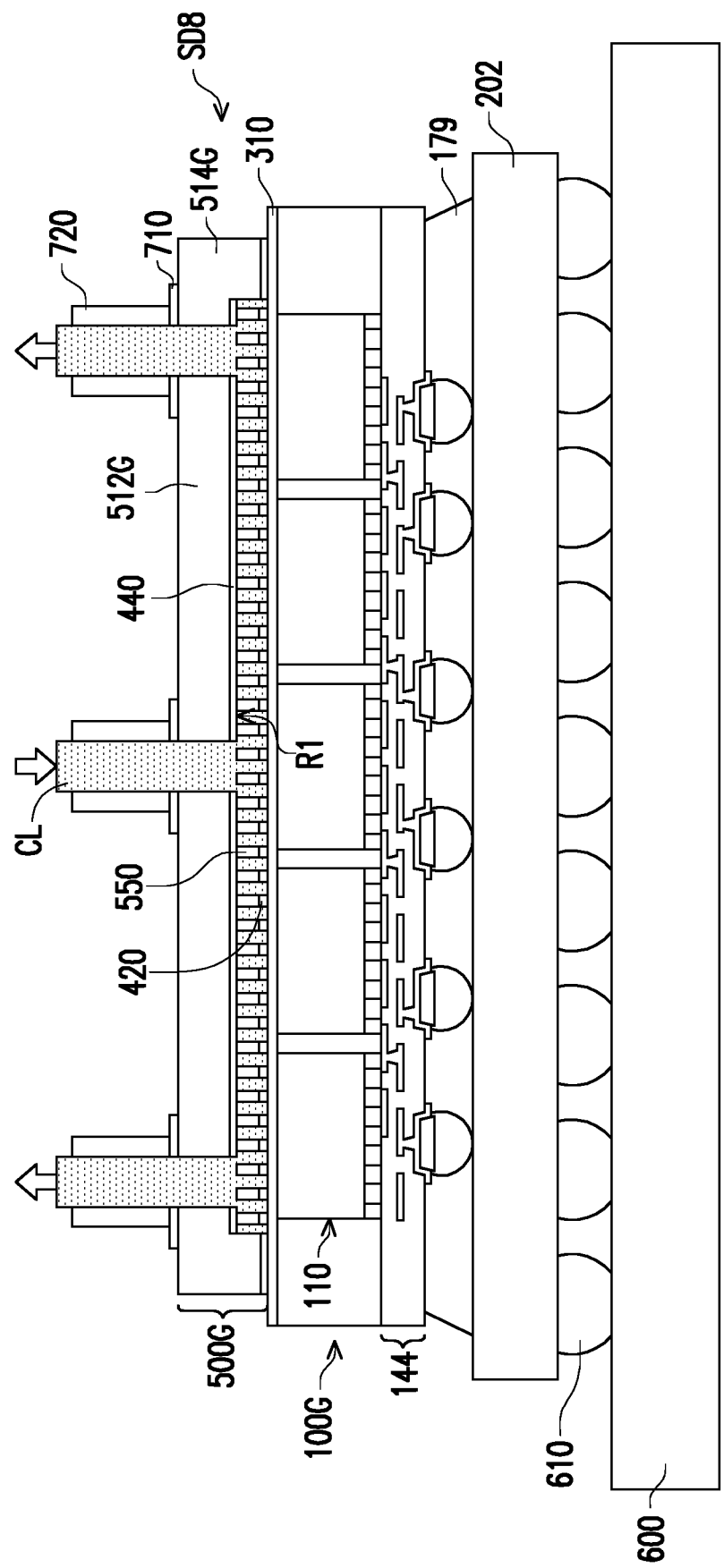
FIG. 12A is a schematic cross-sectional view of an electronic device according to some embodiments of the present disclosure.
Figure 12B:
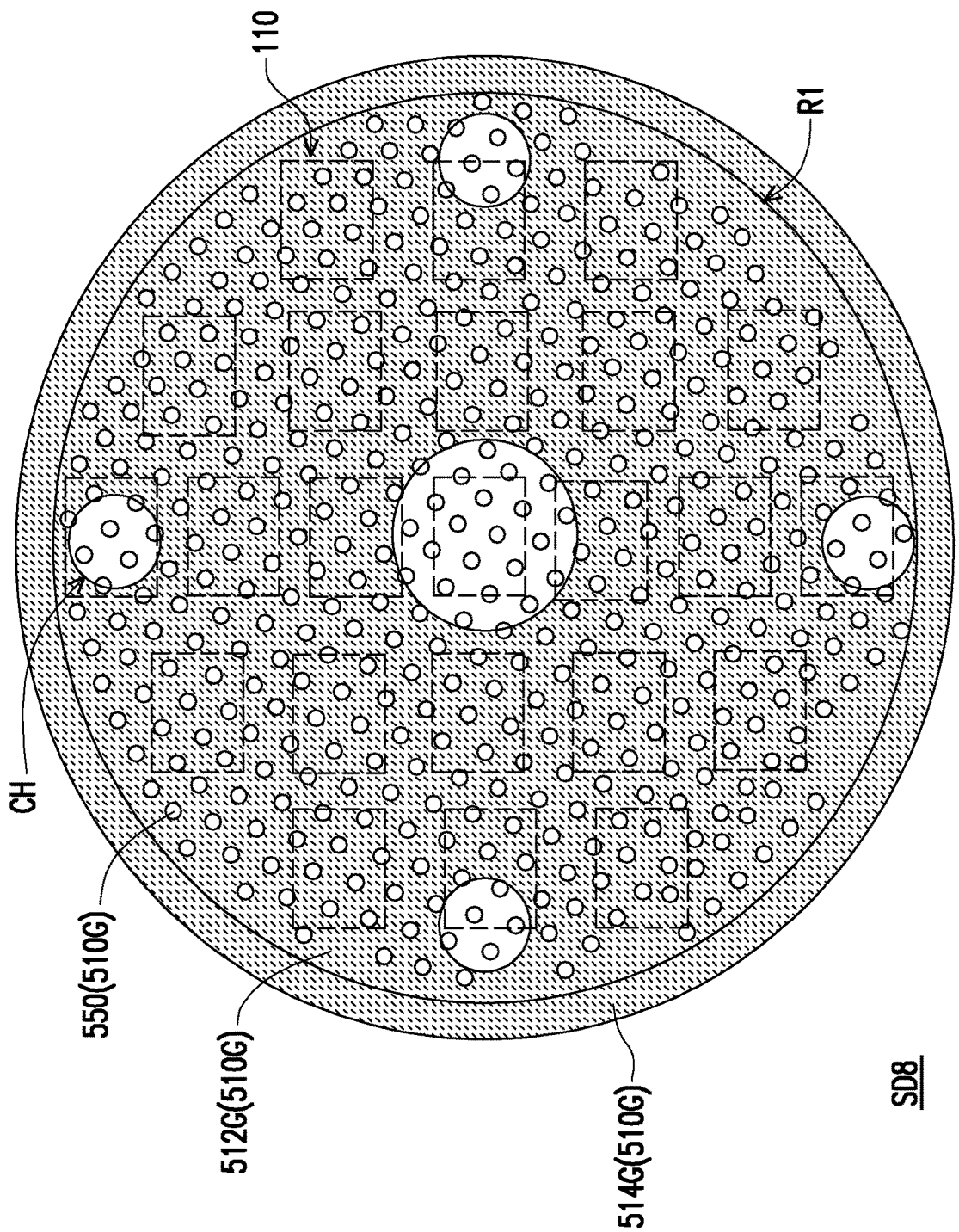
FIG. 12B and FIG. 12C are schematic top views of semiconductor devices according to some embodiments of the present disclosure.

FIG. 12A shows a schematic cross-sectional view of an electronic device according to some embodiments of the disclosure. In the electronic device of FIG. 12A, the semiconductor device SD8 is connected to a fluid circulation system and to a circuit substrate 600. FIG. 12B shows a schematic top view of the semiconductor device SD8 according to some embodiments of the present disclosure. Referring simultaneously to FIG. 12A and FIG. 12B, in some embodiments, the semiconductor device SD8 includes a wafer-size semiconductor package 100G and a wafer-size heat dissipation system 500G. In some embodiments, the wafer-size semiconductor package 100G has a diameter of about 4 inches or more. For example, the wafer-size semiconductor package 100G may have a diameter of about 6 inches. In some cases, the wafer-size semiconductor package 100G may have a diameter of about 8 inches. In some cases, the wafer-size semiconductor package 100G may have a diameter of about 12 inches. The semiconductor package 100G may include a reconstructed wafer structure, in which a plurality of semiconductor dies 110 is encapsulated in a wafer form and is interconnected through the redistribution structure 144. In FIG. 12B are shown the footprints of the semiconductor die 110 of the semiconductor package 100G with respect to the cover 510G. The wafer-size semiconductor package 100G may be formed by encapsulating the semiconductor dies 110 with a molding compound, and forming the redistribution structure 144 on the active surfaces of the semiconductor dies 110. In some embodiments, additional components (e.g., TIVs, dummy dies or passive devices, etc.) may be included in the wafer-size semiconductor package 100G according to design requirements. In some embodiments, the wafer-size semiconductor package 100G may have a substantially circular footprint. In some embodiments, each semiconductor die 110 included in the wafer-size package 100G may independently be or include a logic die, such as a central processing unit (CPU) die, a graphic processing unit (GPU) die, a micro control unit (MCU) die, an input-output (I/O) die, a baseband (BB) die, or an application processor (AP) die. In some embodiments, one or more of the semiconductor dies 110 include a memory die such as a high bandwidth memory die, a memory chip stack, or the like. In some embodiments, the semiconductor dies 110 may be the same type of dies or perform the same functions. In some embodiments, the semiconductor dies 110 may be different types of dies or perform different functions. In some embodiments, the backside surfaces of the semiconductor dies 110 may be covered by the metallization layer 310. In some embodiments, the metallization layer 310 may extend on the wafer-size semiconductor package 110, and be disposed between the wafer-size package 100G and the wafer-size heat dissipation system 500G.

In some embodiments, the heat dissipation system 500G includes the cover 510G and microstructures 550 secured to the cover 510G and to the semiconductor package 100G. In some embodiments, the cover 510G includes the cap portion 512G and the flange portion 514G. The flange portion 514G may be located at the periphery of the cap portion 512G and fall on the wafer-size semiconductor package 100G (or the metallization layer 310 if included). In some embodiments, the footprint of the cover 510G may be smaller than the footprint of the wafer-size package 100G, and a peripheral portion of the package 100G or the metallization layer 310 may be left exposed by the cover. In some alternative embodiments (not shown), edges of the wafer-size semiconductor package 100G and edges of the cover 510G may be aligned, and the cover 510G may substantially hide the semiconductor package 100G when viewed from the top. In some embodiments, the flange portion 514G falls along an outer rim of the semiconductor package 100G. In some embodiments, the flange portion 514G contacts the semiconductor package 100G or the metallization layer 310 over the molding compound rather than the semiconductor dies 110.

In some embodiments, the wafer-size cover 510G and the wafer-size package 100G define the wafer-sized circulation recess R1. The cover 510G includes inflow/outflow channels CH opening in the circulation recess R1, to allow flow of the coolant CL through the circulation recess R1. In some embodiments, the inflow/outflow channels CH opens over some of the semiconductor dies 110. In some embodiments, there are more semiconductor dies 110 in the semiconductor package 100G than inflow/outflow channels CH in the cover 510G. In some embodiments, the number of inflow/outflow channels CH with respect to the number of semiconductor dies 110 may be adjusted according to design requirements.

In some embodiments, the microstructures 550 are disposed in the size circulation recess R1 in such a manner to articulate the flow of the coolant CL through the circulation recess R1. In some embodiments, the wafer-sized circulation recess R1 extends over the semiconductor dies 110 included in the wafer-size semiconductor package 100G. In some embodiments, the circulation recess R1 extends over all the semiconductor dies 110 included in the wafer-size semiconductor package 100G. In some embodiments, the microstructures 550 are secured to the wafer-size semiconductor package 100G (or the metallization layer 310) via the bonding material 420 and to the cover 510G via the bonding material 440. In some embodiments, the microstructures 550 are located also in correspondence of the inflow/outflow channels CH, being secured by portions of the bonding material 420. However, the disclosure is not limited thereto. In some embodiments, the other types of microstructures discussed before in the present disclosure may be used with the wafer-size semiconductor package 100G.

In some embodiments, the wafer-size semiconductor package 100G is bonded to a wafer-size substrate 202, with backside surfaces of the semiconductor dies 110 facing away from the wafer-size substrate 202. An underfill 179 may protect the connection between the wafer-size package 100G and the wafer-size substrate 202. In some embodiments, the wafer-size substrate 202 is bonded to a circuit substrate 600 through connectors 610. In some embodiments, the wafer-size substrate 202 is optional, and the wafer-size package 100G may be directly bonded to the circuit substrate 600.

Figure 12C:
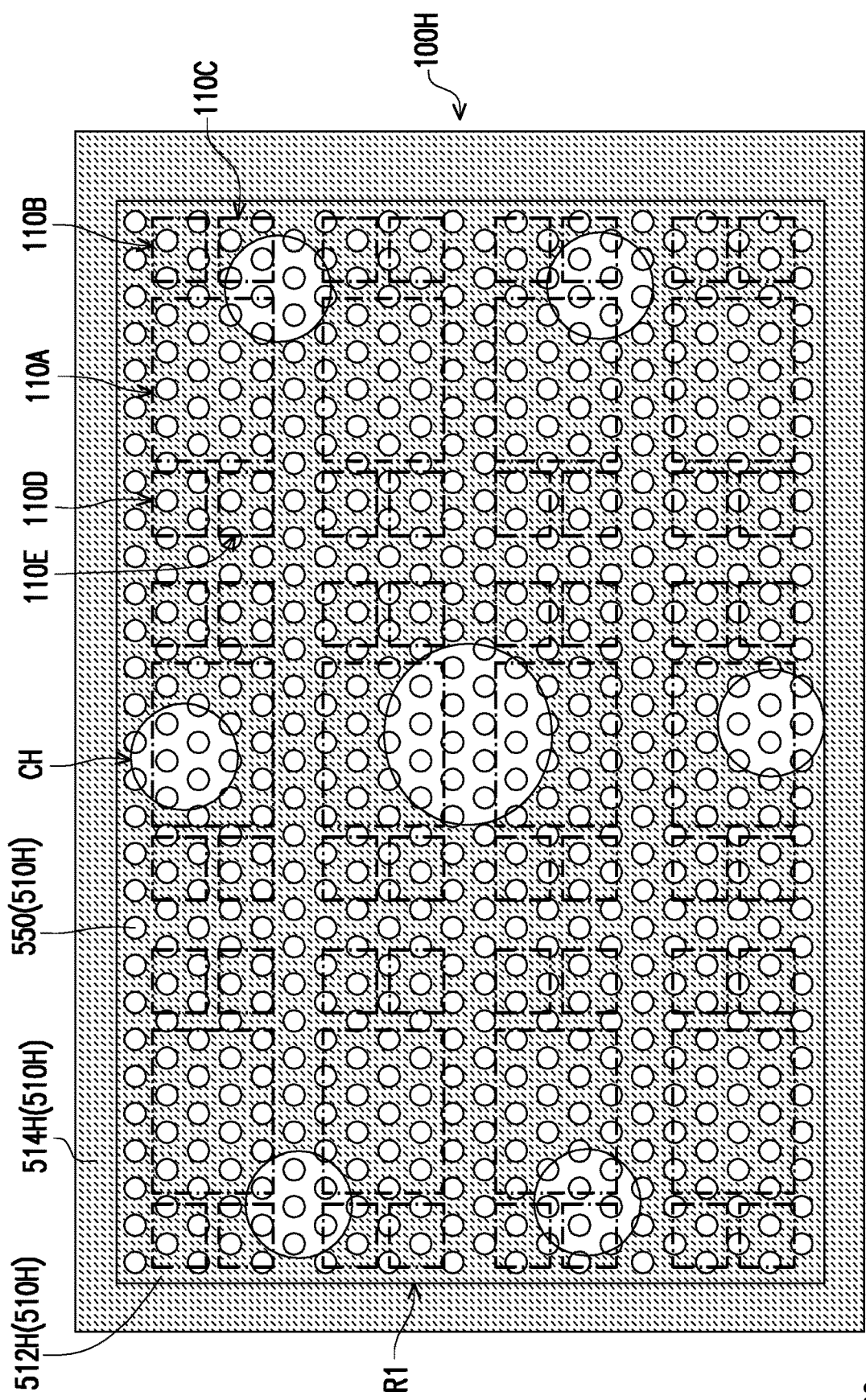

FIG. 12C shows a schematic top-view of a semiconductor device SD9 according to some embodiments of the disclosure. The semiconductor device SD9 may include a panel-size semiconductor package 100H and a cover 510H forming a heat dissipation system. In some embodiments, the panel-size semiconductor package 100H may have a polygonal shape (e.g., rectangular, square, pentagonal, hexagonal, etc.). The panel size semiconductor package 100H may include multiple groups of semiconductor dies 110A-110E, the footprints of which with respect to the cover 510H are shown in FIG. 12C. In some embodiments, each group of semiconductor dies 110A-110E may constitute a functional unit within the panel-size semiconductor package 100H. Each functional unit of the panel-size semiconductor package 100H may perform different functions, and include different types of semiconductor dies 100A-100E independently from the other functional units. Inflow/outflow channels CH open in the cover 510H to allow flow of a coolant in the circulation recess (not shown) formed between the cover 510H and the panel-size semiconductor package 100H. In some embodiments, an inflow/outflow channel CH may extend over multiple semiconductor dies 100A-100E of a functional unit, or even span over semiconductor dies 100A-100E belonging to different functional units. In some embodiments, the panel-size semiconductor package 100H may be 300 mm×300 mm or larger.

In some embodiments, semiconductor packages like the wafer-size semiconductor package 100G or the panel-size semiconductor package 100H are referred to as large-scale semiconductor packages.

The heat dissipation system disclosed herein is rather versatile, and may be applied to different types of semiconductor packages with only minor adjustments. Furthermore, features of the specific embodiments illustrated above may be combined in multiple ways, and all these ways are meant to fall within the scope of the present disclosure and the attached claims. As a non-limiting example, in some embodiments of the disclosure the microstructures connected to the cover may be integrally formed with the cover. According to some other embodiments of the disclosure, the microstructures may be prefabricated and secured to the cover or the semiconductor package. All of the microstructures disclosed herein may be coated with a thermally conductive material (e.g., graphene) according to different embodiments of the disclosure. Also, according to some embodiments the covers that were illustrated without flanges may also include flanges. In some embodiments, the flanges may fall on the semiconductor package. In some alternative embodiments, the flanges may fall on the substrate. According to some embodiments, all the covers may be secured to the substrate via a support.

Based on the above, a semiconductor device according to the present disclosure may include a semiconductor package and a cap disposed on the semiconductor package. In some embodiments, the heat dissipation system allows flow of a coolant directly in contact with the semiconductor package, without any thermal interface material disposed in between. In some embodiments, the direct contact of the coolant with the semiconductor package ensures efficient thermal exchange, providing a cooling effect for the semiconductor package. In some embodiments, the cover and the semiconductor package define a circulation recess through which the coolant flows. Microstructures disposed within the circulation recess may articulate the flow of the coolant. In some embodiments, the microstructures may be coated with a thermally conductive material to further promote thermal exchange between the semiconductor package and the coolant.

In some embodiments of the present disclosure, a semiconductor device is provided. The semiconductor package includes a semiconductor package, a cap, a seal, and microstructures. The semiconductor package includes at least one semiconductor die. The cap is disposed over an upper surface of the semiconductor package. The seal is located on the semiconductor package and between the cap and the semiconductor package. The cap includes an inflow channel and an outflow channel. The active surface of the at least one semiconductor die faces away from the cap. The cap and an upper surface of the semiconductor package define a circulation recess providing fluidic communication between the inflow channel and the outflow channel. The seal is disposed around the circulation recess. The microstructures are located within the circulation recess, and the microstructures are connected to at least one of the cap and the at least one semiconductor die.

In some embodiments of the present disclosure, a semiconductor device is provided. The semiconductor device includes a semiconductor package, a cap and microstructures. The semiconductor package includes a first die and a second die electrically connected with each other. The cap is disposed on the semiconductor package and includes an inflow hole and an outflow hole. A circulation recess defined between the cap and the semiconductor package and communicating with the inflow hole and the outflow hole provides a fluidic path. The microstructures are disposed within the circulation recess and on the fluidic path. The microstructures include semiconductor microstructures protruded from back surfaces of the first and second semiconductor dies.

In some embodiments of the present disclosure, a manufacturing method of a semiconductor device is provided. The manufacturing method includes the following steps. A semiconductor package including laterally-encapsulated semiconductor dies is provided. Microstructures are formed by etching backside surfaces of the semiconductor dies. The semiconductor dies are connected to a substrate, so that active surfaces of the dies face the substrate. A bonding material is disposed on an upper surface of the semiconductor package. The upper surface of the semiconductor package is further away from the substrate. A cover is secured to the upper surface of the semiconductor package via the bonding material to define a circulation recess between the cover and the backside surfaces of the semiconductor dies. Microstructures are disposed within the circulation recess. The cover comprises an inflow channel and an outflow channel. The circulation recess establishes fluidic communication between the inflow channel and the outflow channel.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor device, comprising:
   a semiconductor package comprising at least one semiconductor die;
   a cap disposed over an upper surface of the semiconductor package;
   a seal of polymeric material located on the semiconductor package and between the cap and the semiconductor package; and
   microstructures, located on the upper surface of the semiconductor package,
   wherein the cap includes an inflow channel and an outflow channel,
   an active surface of the at least one semiconductor die faces away from the cap,
   the cap and an upper surface of the semiconductor package define a circulation recess in fluidic communication with the inflow channel and the outflow channel,
   the seal encircles the circulation recess to prevent leakage of liquid coolant pumped to and from the circulation recess, and
   the microstructures are located within the circulation recess, and the microstructures are connected to at least one of the cap and the at least one semiconductor die.

2. The semiconductor device of claim 1, wherein a portion of the microstructures protrudes from a backside surface of the at least one semiconductor die.

3. The semiconductor device of claim 2, wherein the portion of the microstructures includes pillars, and the cap physically contacts the pillars.

4. The semiconductor device of claim 1, wherein the microstructures are parallel fins extending transversely with respect to a direction joining the inflow channel with the outflow channel.

5. The semiconductor device of claim 4, wherein the fins extend from the cap toward the semiconductor package.

6. The semiconductor device of claim 1, further comprising at least one flange physically supporting the cap over the semiconductor package.

7. The semiconductor device of claim 1, wherein the semiconductor package is a large-scale semiconductor package.

8. The semiconductor device of claim 1, wherein the semiconductor package includes multiple semiconductor dies, and the cap includes an inflow circulation channel connected to the inflow channel and branching off toward the semiconductor dies.

9. The semiconductor device of claim 1, further comprising a graphene tape disposed between the seal of polymeric material and the semiconductor package.

10. The semiconductor device of claim 9, wherein the graphene tape comprises an adhesive portion and a graphene portion, and the graphene portion is disposed between the adhesive portion and the seal of polymeric material.

11. A semiconductor device, comprising:
    a semiconductor package having a first semiconductor die and a second semiconductor die electrically connected with each other;
    a cap disposed on the semiconductor package and including an inflow hole and an outflow hole, wherein a circulation recess that is defined between the cap and the semiconductor package communicates with the inflow hole and the outflow hole to provide a fluidic path; and
    microstructures disposed within the circulation recess and on the fluidic path, wherein the microstructures include semiconductor microstructures protruded from back surfaces of the first and second semiconductor dies,
    wherein a vertical height of the semiconductor microstructures protruded from the back surface of the first semiconductor die is greater than a vertical height of the semiconductor microstructures protruded from the back surface of the second semiconductor die.

12. The semiconductor device of claim 11, further comprising a metallization layer disposed on the semiconductor package and covering the circulation recess and disposed between the semiconductor package and the cap.

13. The semiconductor device of claim 11, wherein the microstructures are surface-coated with graphene.

14. The semiconductor device of claim 11, wherein the first semiconductor die has a power consumption higher than that of the second semiconductor die and the outflow hole overlies the first semiconductor die.

15. The semiconductor device of claim 11, wherein a material of the microstructures includes carbon nanotubes.

16. The semiconductor device of claim 11, wherein a group of the microstructures connected to the cap extends into interstices defined by the protruded semiconductor microstructures.

17. A semiconductor device, comprising:
    a semiconductor package comprising a semiconductor die;
    a cap disposed on an upper surface of the semiconductor package and including an inflow hole and an outflow hole, wherein the cap and the semiconductor package form a circulation recess between the cap and the upper surface of the semiconductor package, and the circulation recess provides a fluidic path between the inflow hole and the outflow hole;
    a metallization layer disposed on the semiconductor package between the semiconductor package and the cap and extending in the circulation recess;
    microstructures, located on the upper surface of the semiconductor package within the circulation recess and connected to at least one selected from the cap and the semiconductor die;
    a first bonding material connecting the microstructures to the metallization layer; and
    a second bonding material connecting the microstructures to a bottom surface of the cap, wherein the bottom surface of the cap opposes the upper surface of the semiconductor package in the circulation recess.

18. The semiconductor device of claim 17, wherein the first bonding material includes solder.

19. The semiconductor device of claim 17, wherein the semiconductor die is one of a plurality of semiconductor dies included in the semiconductor package, and the semiconductor package further comprises:
    an encapsulant laterally wrapping the plurality of semiconductor dies; and a redistribution structure, disposed on an opposite side of the encapsulant with respect to the metallization layer and electrically interconnecting the semiconductor dies.

20. The semiconductor device of claim 17, further comprising:
   a circuit substrate to which the semiconductor package is connected, the circuit substrate being located at an opposite side of the semiconductor package with respect to the cap;
   a support, bonded on the circuit substrate and facing at least two sides of the semiconductor package; and
   at least one fastener, securing the cap to the support.

* * * * *